United States Patent
Yasuda et al.

(10) Patent No.: US 6,549,271 B2
(45) Date of Patent: Apr. 15, 2003

(54) EXPOSURE APPARATUS AND METHOD

(75) Inventors: Masahiko Yasuda, Tokyo (JP); Masahiro Nei, Kanagawa-ken (JP); Yuuki Ishii, Kanagawa-ken (JP); Tetsuo Taniguchi, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/247,619

(22) Filed: Sep. 20, 2002

(65) Prior Publication Data

US 2003/0016338 A1 Jan. 23, 2003

Related U.S. Application Data

(63) Continuation of application No. 09/722,528, filed on Nov. 29, 2000, now abandoned, which is a continuation of application No. 09/345,779, filed on Jul. 1, 1999, now abandoned, which is a continuation of application No. 09/014,993, filed on Jan. 28, 1998, now abandoned.

(30) Foreign Application Priority Data

Jan. 28, 1997 (JP) .............................. 9-28408
Mar. 26, 1997 (JP) .............................. 9-89966
Jun. 30, 1997 (JP) ............................. 9-173784
Jul. 25, 1997 (JP) ............................. 9-199890

(51) Int. Cl.[7] ...................... G03B 27/52; G03B 27/68; G03B 27/42
(52) U.S. Cl. ................ 355/55; 355/52; 355/53
(58) Field of Search ................... 355/52, 53, 55, 355/30, 67–71, 77; 356/399–401; 250/548; 430/5, 20, 30

(56) References Cited

U.S. PATENT DOCUMENTS

| | | | |
|---|---|---|---|
| 4,737,824 A | 4/1988 | Sakai | 355/53 |
| 5,008,702 A | 4/1991 | Tanaka et al. | 355/52 |
| 5,015,866 A | 5/1991 | Hayashi | 250/548 |
| 5,502,313 A | 3/1996 | Nakamura et al. | 250/559.26 |
| 5,581,324 A | 12/1996 | Miyai et al. | 355/53 |
| 5,631,113 A | 5/1997 | Satoh et al. | 430/30 |
| 5,640,227 A | 6/1997 | Kato et al. | 355/53 |
| 5,796,467 A | 8/1998 | Suzuki | 355/53 |
| 5,894,056 A | 4/1999 | Kakizaki et al. | 430/5 |
| 6,262,792 B1 | 7/2001 | Higashiki | 355/52 |
| 6,317,195 B1 * | 11/2001 | Taniguchi | 355/53 |

* cited by examiner

Primary Examiner—Hung Henry Nguyen
(74) Attorney, Agent, or Firm—Armstrong, Westerman & Hattori, LLP

(57) ABSTRACT

A projection exposure method for exposing a substrate through a projection optical system with a predetermined pattern formed on a mask. The method includes the steps of calculating an amount of lateral variation of a pattern image in a direction perpendicular to an optical axis of the projection optical system, determining a distortion produced solely by the projection optical system, obtaining a total expected distortion by a summation of the distortion produced solely by the projection optical system and the calculated variation of the positions at which the image of the pattern of the mask is formed, and exposing the substrate while partially correcting the positions at which the image of the pattern of the mask is formed through the projection optical system based on the total expected distortion.

14 Claims, 29 Drawing Sheets

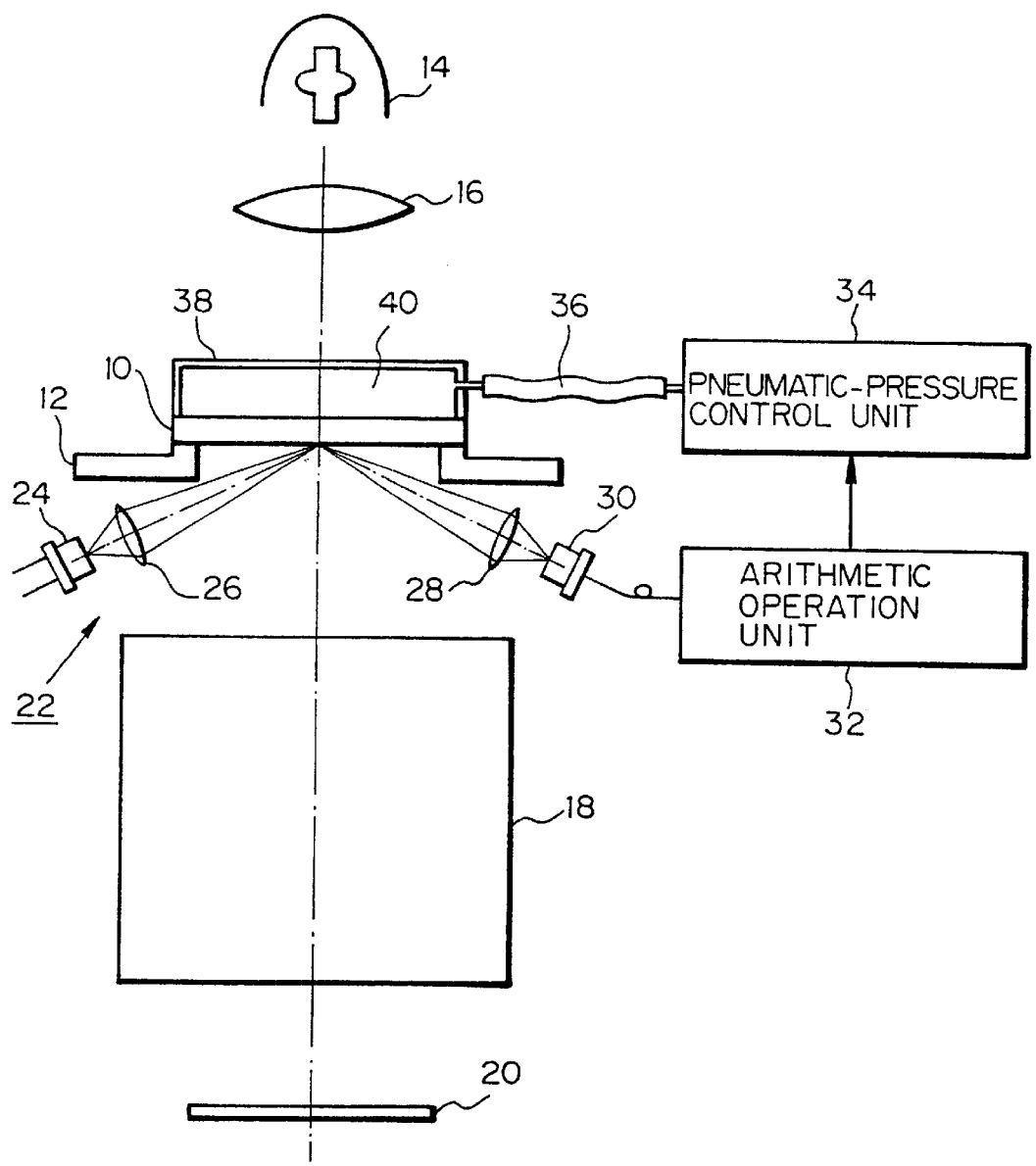

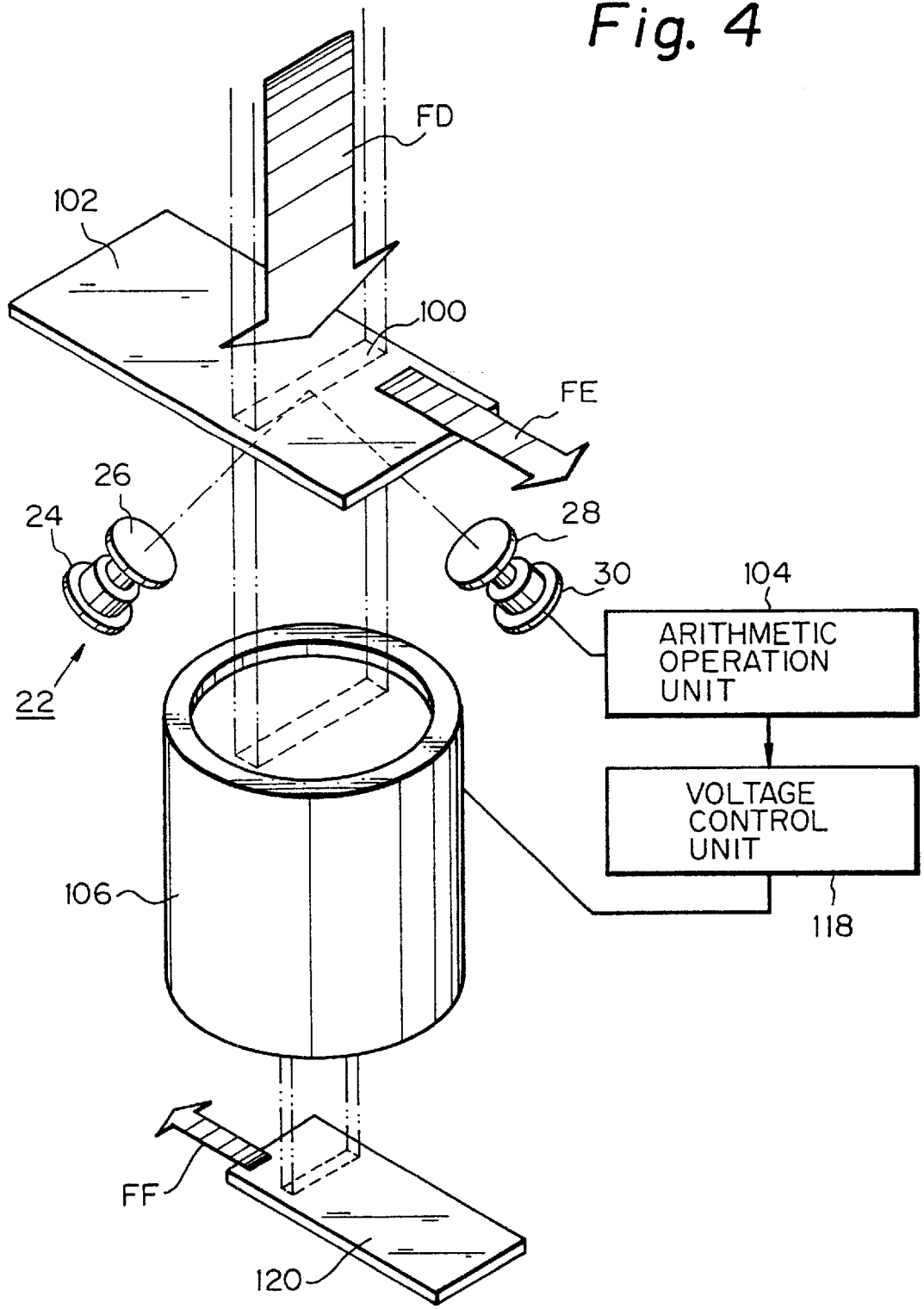

$$E_1 \approx \frac{2x}{X_0} t_1$$

Fig. 20(A)
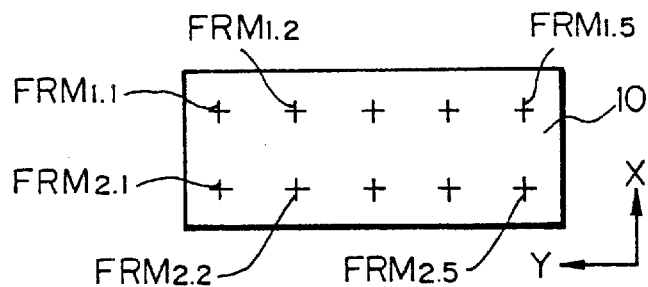
Fig. 20(B)    Fig. 20(C)
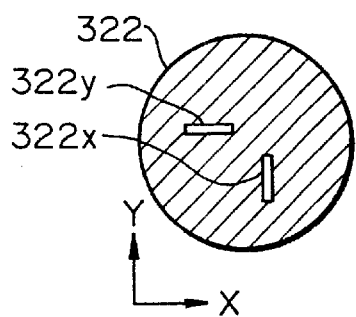 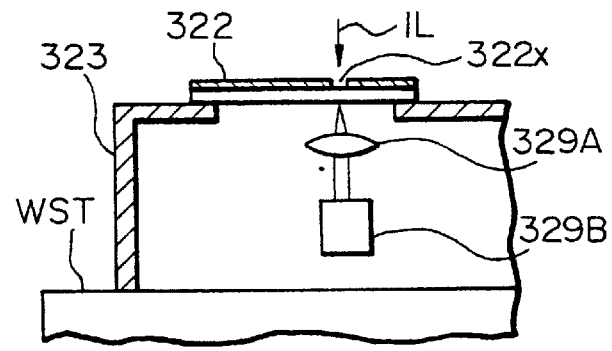
Fig. 21
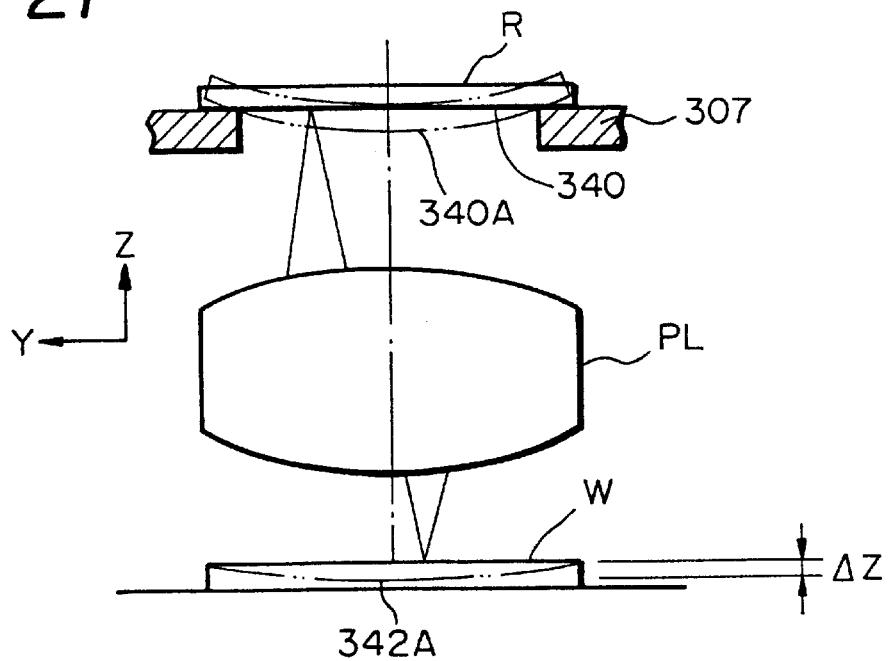

EXPOSURE APPARATUS AND METHOD

This application is a continuation of prior application Ser. No 09/722,528 filed Nov. 29, 2000 now abandoned, which is a continuation of prior application Ser. No. 09/345,779, filed Jul. 1, 1999 now abandoned, which is a continuation of prior application Ser. No. 09/014,993 filed Jan. 28, 1998 now abandoned.

BACKGROUND OF THE INVENTION

The present invention relates to a projection exposure apparatus and method. The apparatus and method may be used, for example, in a photolithographic process which forms a part of a fabrication process of semiconductor devices, liquid crystal displays or other products, in exposing a mask pattern on a substrate, such as a wafer.

In a photolithographic process for fabricating semiconductor devices or other products, there have been used various projection exposure apparatus including stepping projection exposure apparatus called stepping projection aligners or steppers, as well as scanning projection exposure apparatus called scanning projection aligners or step-and-scan projection aligners. These projection exposure apparatus use a projection optical system (or projection lens) which has to provide an extremely high resolution approaching the theoretical resolution limit. In order to support such a high resolution, many projection optical systems have certain mechanisms for measuring various factors in the resolution (such as, the atmospheric pressure and the ambient temperature) and then correcting the image formation characteristics of the projection optical system depending on the result of such measurement. For higher resolution, projection optical systems are designed to have a large numerical aperture. As a result, the depth of focus is very small. Thus, many projection optical systems have a autofocus mechanism which may comprise an oblique-incidence focus position detection system (or AF sensor). The AF sensor serves to measure the focus position (or the position in the direction along the optical axis of the projection optical system) of the surface of a wafer (or substrate) which typically has some irregularities. The autofocus mechanism brings the surface of the wafer into a position at which it will be coincident with the image plane of the projection optical system, based on the result of such measurement.

In recent years, image formation errors caused by deformation of a mask or reticle have become a problem. If substantially all the pattern-bearing surface area of a reticle is deformed down toward the projection optical system, the average position of the image plane (or image surface) of the pattern-bearing surface is displaced downward, so that the focus position of a wafer could suffer from defocusing if it were not adjusted. Further, when the pattern-bearing surface of a reticle is deformed, the positions of the pattern, which are perpendicular to the optical axis of the projection optical system, on the pattern-bearing surface may also is displaced. Such lateral displacements (or displacements in the direction perpendicular to the optical axis of the projection optical system) may cause distortion errors.

Further, regarding the demagnification projection optical system used in various demagnification projection exposure apparatus including those of non-scan-type (such as, steppers) and those of scan-type (such as, step-and-scan projection aligners), there is an urgent need for improvement in characteristics relating to a reduction in lens aberrations. In the state of the art, almost all lens aberrations could be highly suppressed if lenses were manufactured accurately to design specifications. However, in fact, due to accumulation of tolerances and allowances necessary for fabricating the lenses, the image formation characteristics of the finished lenses are limited and include errors.

There have been many proposals to reduce lens aberrations contributed to by factors involved in the fabrication process. One such technique uses one or more aberration correction plates disposed between the projection optical system and the wafer (or glass substrate), for canceling out the aberrations. Specifically, any residual aberrations which remain after final adjustment of a lens are canceled out by the reverse aberrations intentionally produced by the aberration correction plates so as to minimize the resultant lens aberrations. The residual aberrations may be determined by making and analyzing a test. print using that lens together with a test reticle having evaluation patterns formed thereon, or by measuring the position of aerial images of evaluation patterns of a test reticle formed by that lens by means of a measuring photodetector.

There have been further factors affecting the final image formation characteristics of a lens, which relate to the accuracy (or drawing errors) in the evaluation patterns of a test reticle. In particular, the patterning accuracy (including the linewidth accuracy) of a test reticle is of great concern. In order to correct errors arising from insufficient patterning accuracy, a system has been used in which the pattern positions (or the distances between the patterns) of a finished test reticle are measured and stored using a precision coordinate measurement device, and the positions of the projected images are corrected by an utilization of the stored pattern positions.

As described above, when the image formation characteristics of a projection optical system are evaluated, measurement errors due to insufficient patterning accuracy of an evaluation reticle may be corrected by an utilization of the pattern positions which are measured and stored in advance. However, there are further structural factors affecting the final or total image formation characteristics of the projection exposure apparatus, including the flatness of the exposure area of an evaluation reticle, flatness of the area outside the exposure area of a reticle, and the deflection of a reticle when it is loaded on the projection exposure apparatus. In the past when requirements for the image formation characteristics were less severe, the need for various accuracies relating to these structural factors did not arise. However, in recent years, requirements for the patterning accuracy of semiconductor chips and the registration accuracy between layers of the semiconductor chips have become very severe, so that the accuracies relating to the above structural factors have become of more significance in order to meet such requirements.

One of the structural factors, the deflection of a reticle when it is loaded on the projection exposure apparatus, is caused by gravity. Typically, a reticle is supported at three or four points over its peripheral area and secured by means of vacuum suction, which invariably causes some deflection. When the reticle is curved by deflection, the features of the pattern on the reticle are laterally displaced thereby, the projected images of the features are laterally displaced from their desired positions on the wafer. Apart from the deflection, since each reticles is different in its flatness, if there is a poor flatness in the reticles, the images of the features may be projected features off their desired positions on the wafer. Further, there are sometimes big difference in its flatness between the exposure area and the peripheral area outside the exposure area, and in particular, the peripheral area may typically have a poor flatness. In such a case, since the reticle is supported and secured at the peripheral area, the flatness of the reticle may be possibly deteriorated. This results in larger lateral displacements of the projected images depending on the matching between the contact surfaces of the reticle and the projection exposure apparatus.

FIG. 30(A) shows how a reticle or mask 900 is supported at its peripheral area by a mask holder 902. The contact surfaces of the mask holder 902 in contact with the mask 900 have holes or grooves 904 for securing the mask 900 onto the mask holder 902. When the holes or grooves 904 are in communication with a vacuum source, the mask 900 is secured t the onto the mask holder 902 by vacuum suction.

However, holding a mask on a mask holder in this manner suffers from a problem that the mask 900 is deflected by the gravity as shown in FIG. 30(A). This results in the lateral displacements of the features of the pattern formed on the mask 900 as well as the curve of the image surface defined by the projection optical system. Further, irradiation of the exposure light rays onto the mask 900 during exposure operations imparts irradiation heat to the mask 900 and increases its temperature, this results in the thermal expansion of the mask 900. Since the mask 900 is secured at its peripheral area onto the mask holder 902, the mask 900 is deformed as shown in FIG. 30(B). As the result, the pattern on the mask 900 is also deformed, which may disadvantageously produce variation In the distortion of the projected pattern image and/or add to the curvature of the image surface so that the depth of focus in the pattern-bearing surface of the mask become inconveniently smaller. With today's highly miniaturized patterns, even a minute deformation of the pattern can be of great concern.

Apart from deflection caused by gravity, the deformation of a mask or reticle may be also caused In the polishing process of the glass plate forming the reticle, or may be caused depending on insufficient flatness of one or both of the contact surfaces of the reticle and the reticle holder, which are forced to come into contact with each other by vacuum suction. Since there is difference in the deflections between reticles, or between projection exposure apparatus, a deflection of a particular reticle has to be measured when it is held on the reticle holder of a particular projection exposure apparatus in order to obtain an accurate reticle deformation.

One method for measuring the deformation of the pattern-bearing surface of a reticle held on the reticle holder of a projection exposure apparatus by vacuum suction may comprise the steps of making and analyzing a test print using the projection optical system of that projection exposure apparatus. The selected features of the pattern formed on the pattern-bearing surface of the reticle are projected through the projection optical system onto a wafer for evaluation. This projection exposure is repeated while the focus position of the wafer is varied in a stepwise manner. After the development process of the resist layer on the wafer, the resist patterns thus formed are examined for their contrast, and the exposure specifications for the resist patterns of the highest contrast among those corresponding to the same features of the reticle pattern indicate the best-focus positions of the projected images of the respective features of the reticle pattern. Then, from the displacements of the best-focus positions, the deformation of the pattern-bearing surface of the reticle may be calculated quantitatively to a certain extent.

As described above, in order to achieve better image formation characteristics of a projection exposure apparatus, it is preferable to measure not only. the surface shape of the wafer loaded thereon but also the surface shape of the pattern-bearing surface of the reticle. Nevertheless, any test-print method, in which a test print is made for measuring the surface shape, is time-consuming and thus often results in a poor throughput of the exposure process. In addition, any reticle used for actual exposure process has a pattern to be transferred onto wafers (thus, no test pattern), so that any test-print method can not be applied to the reticles for use in actual exposure process. Another option to quickly perform measurement of the surface shape of the pattern-bearing surface of a reticle is to use such an oblique-incidence position sensor disposed around the reticle stage, that has the same arrangement as a commonly used, oblique-incidence AF sensor for detecting the focus position of a wafer.

Since a reticle has a pattern-bearing surface defined on its bottom surface facing down toward the projection optical system, the position of the oblique-incidence position sensor would be disposed in the space between the reticle stage and the projection optical system or around that space. However, a reticle often has a pellicle stretched on a metal frame provided on the bottom surface of the reticle, for preventing any foreign particles from adhering onto the pattern-bearing surface of the reticle. In such a case, the position sensor is prevented from projecting the detection light beam onto the pattern-bearing surface of the reticle at a nearly grazing angle (or at a large angle of incidence) by the pellicle frame.

In particular, for a scanning projection exposure apparatus, since the reticle stage used therein has to show sufficient rigidity to prevent any harmful deformation when accelerated/decelerated for movement in synchronism with the wafer stage for scanning, the reticle stage is generally given a sufficient thickness, thereby usually the bottom surface of the reticle is close to the upper end of the projection optical system. Further, the smaller the space distance between the reticle and the projection optical system, the easier the projection optical system may be designed, so that projection optical systems having a greater precision tend to provide less space between the reticle and the projection optical system. Thus, it is difficult to dispose a position sensor for measuring the surface shape of a reticle in the space between the projection optical system and the reticle.

Moreover, a position sensor for measuring the surface shape of a reticle must have a high stability against aging. This is because even such a variation in measurements provided from the position sensor, that is actually caused by aging, is interpreted as indicating a variation in the surface shape of the reticle, leading to an erroneous correction of the image formation characteristics.

Regarding the reticle itself, it may comprise a thin plate of silica glass having one surface (the bottom surface when used) covered with thin-film of chromium deposited thereon. Typical sizes of reticles include 5×5 inches (127× 127 mm) and 6×6 inches (152×152 mm), while typical thicknesses include 0.09 inches (2.3 mm) and 0.25 inches (6.4 mm).

FIG. 31 is a plan view of a typical reticle showing the planar layout of the parts and features of the reticle. As shown, the reticle R has its central portion defined as a pattern area 933 in which a semiconductor chip circuit pattern is formed. The peripheral area 931 surrounding the pattern area 933 includes a pellicle frame attachment area 932 at the innermost portion of the peripheral area 931. A pellicle frame is attached on the reticle R in the pellicle frame attachment area 932. The pellicle frame supports a pellicle stretched thereon, which is a thin film of a suitable organic material for covering the pattern area to prevent any foreign particle from adhering to the pattern-bearing surface. Out of the pellicle frame attachment area 932 and right and left sides thereof as viewed in FIG. 31, there are formed support portions 935 at which the reticle R is supported and secured on the reticle holder by vacuum suction, as well as formed alignment marks AM.

As shown in FIG. 32, the reticle R my be deflected downward by the gravity. The maximum downward displacement at the center of the reticle R may be several micrometers ($\mu$m). This deflection produces not only displacements of the features of the pattern in the focus direction (or the direction of the optical axis of the projection optical system) but also lateral displacements of the features. The lateral displacement increases as the feature lies father off the center of the reticle R, so that the displacements produce an distortion error. The maximum lateral displacement may be of the order of 0.01 $\mu$m.

In the case where the reticle support portions 943 for supporting the reticle R thereon are formed as vacuum chucks, the deflection of the reticle R by the gravity may be suppressed by the corrective forces acting from the top surfaces of the reticle support portions 943, when the top surfaces are level or extend horizontally. However, since the recent years' projection lenses have a very high numerical aperture with a extremely small depth of focus, and there is the need for the improvement of the overlay accuracy in order to support the more and more reducing linewidth, even a relatively low level of residual deformations of reticles after the correction by the corrective forces by vacuum chucks may arise a problem.

As regards the reticles used for exposure of silicon wafers, 5-in. square reticles are being replaced by 6-in. square reticles. Simultaneously, reticles of 0.09-in. in thickness are being replaced by those of 0.25-in. in thickness for the purpose of reducing any errors which may occur due to the deformation of reticles. In view of recent trends in the semiconductor device industry, greater exposure fields and greater reticle sizes are expected to be required and become common in the near future. The expected next generation of reticles are 9-in. square reticles, for which the thickness of about 0.5 in. would be required in order to meet both a focus condition of ±0.1 mm and a distortion tolerance or 0.005 mm. It is expected that 9-in. square reticles would become common in 2000 A.D., where scanning projection exposure machines in which a reticle and a wafer are moved in synchronism with each other would be the prevailing exposure machines. A reticle of a greater thickness means a heavier reticle, which may arise a problem regarding the secure holding of a reticle by the reticle holder since a reticle must be accelerated and decelerated for scanning projection exposure. Further, for enhancing the throughput, high speed operations of exposure machines are required, which would lead to a limitation on the weight of a reticle. Thus, the thickness of a reticle should be a compromise between the anti-deflection and throughput requirements, which may not be ideal in view of the anti-deflection capability. Accordingly, it is difficult to meet both the desired focus condition and distortion tolerance with any of conventional techniques.

SUMMARY OF THE INVENTION

The first object of the present invention is to provide a projection exposure apparatus capable of making a projection exposure of a mask pattern in a convenient manner.

The second object of the present invention is to provide a projection exposure method with which improved image formation characteristics may be obtained even if a reticle (mask) has a poor flatness, as well as to provide a projection exposure apparatus with which such method may be conveniently performed.

The third object of the present invention is to provide a scanning projection exposure method with which a pattern-bearing surface of a reticle may be well measured and thereby improved image formation characteristics may be obtained even if there is little space between a reticle stage and a projection optical system and thus it is difficult to dispose in that space a sensor for measuring the surface shape of the pattern-bearing surface of the reticle, as well as to provide a scanning projection exposure apparatus with which such method may be conveniently performed.

The fourth object of the present invention is to provide projection exposure apparatus and method with which the thickness and weight of a reticle may be suppressed and any pattern transfer errors due to the deformation of the reticle may be eliminated.

In order to achieve the above-mentioned first object, in accordance with the present invention, there is provided a projection exposure apparatus for projecting an image of a pattern formed on a mask onto an object of exposure, comprising: a deflection detection device for detecting deflection of the mask; a deflection correction device for correcting deflection of the mask; an arithmetic device for calculating a deflection correction value for the deflection correction device based on the detection result obtained by the deflection detection device; and a control device for controlling the deflection correction device in accordance with the deflection correction value calculated by the arithmetic device.

In several embodiments of significance, the deflection detection device comprises: a light-beam-projecting device for obliquely projecting a light beam onto the mask; and a light-beam-detecting device for detecting a reflected light beam projected by the light-beam-projecting device and reflected by the mask so as to produce a detection signal corresponding to the variation in the position at which the reflected light beam is received. Further, the deflection correction device may correct deflection of the mask by changing pneumatic pressure, or alternatively, the deflection correction device may correct deflection of the mask by operating a piezoelectric actuator element.

In accordance with this aspect of the present invention, any deflection of the mask produced by the gravity and/or the thermal expansion is detected by, for example, an oblique-incidence detection system. Based on the detection result, a deflection correction value is calculated and the deflection is corrected. As the result, any curvature of the pattern image is suppressed and an accurate and stable image of the mask pattern may be obtained. In several embodiments of significance, the deflection of the mask is corrected and any variation in the projected image is corrected by changing pneumatic pressure or operating a piezoelectric actuator element.

In order to achieve the above-mentioned second object, in accordance with the present invention, there is provided a projection exposure method for making a projection exposure of an image of a pattern formed on a mask through a projection optical system onto a substrate, comprising the steps of: measuring and. storing a surface shape of a pattern-bearing surface of the mask; and making an exposure while partially correcting, based on the surface shape as stored, the position at which an image of the pattern of the mask is formed through the projection optical system.

With this projection exposure method, for example, a correction mechanism may be used for correcting image formation characteristics including the distortion by driving one or some of the lens elements of the projection optical system. Further, for example, by using a distortion evaluation mask having evaluation patterns formed thereon, the positions of projected images of the evaluation patterns are measured so as to determine the distortion actually produced by the projection optical system. However, the determined distortion contains error components due to lateral displacements of features of the pattern on the pattern-bearing surface produced by the deformation of the surface shape thereof. Therefore, from the measured surface shape of the pattern-bearing surface of the distortion evaluation mask, a distribution of expected displacements of projected images of the evaluation patterns from their desired projection positions is calculated. Then, the measurements of the distortion is adjusted with the expected displacements so as to derive a distortion to be produced solely by the projection optical system. In the actual exposure process, the surface shape of the mask for the actual exposure process is measured, and the measurement result is used to calculate the expected lateral displacements of the points in the projected image which are expected to be produced by the surface shape. Then, the expected displacement of the projected image is added to the distortion which is produced solely by the projection optical system so as to derive a total expected distortion. The correction mechanism corrects the total expected distortion, so that excellent image formation characteristics may be obtained even when the mask has irregularities in its surface or suffers from tilt.

This projection exposure method may be also applied to projection exposure apparatus of the type called step-and-scan projection aligners, in which the surface shape of a mask may possibly vary depending on the position on the mask in the scanning direction, so that the distortion correction value has to be varied while the mask is moved for scanning. In such a case, the correction mechanism may control the distortion correction value depending on the position of the mask during an scanning projection exposure operation, so that excellent image formation characteristics may be obtained over the entire region in the scanning direction. Further, in such a case, if the distortion of the projection optical system has been well corrected, the distortion correction may be performed such that only the lateral displacements of the points in the projected image which are produced by the surface shape of the pattern-bearing surface of the mask may be canceled out.

In order to achieve the above-mentioned second object, in accordance with the present invention, there is also provided another projection exposure method for making a projection exposure of an image of a pattern formed on a mask through a projection optical system onto a substrate, the mask being supported by a predetermined support member, comprising the steps of: measuring and storing any irregularities (including tilt) in a contact surface of the mask in contact with the support member; and making an exposure while partially correcting, based on the irregularities in the contact surface as stored, the position at which an image of the pattern of the mask is formed through the projection optical system.

With this projection exposure method, the mask may be secured onto the support member by vacuum suction. In such a case, if the contact surfaces (245A to 245D) of the mask which are in contact with the support member are tilted as shown in FIG. 17(B), the mask is caused to curve as shown in FIG. 17(C) when it is secured by the vacuum suction, so that the flatness of the mask is deteriorated. This problem may be solved by: determining, based on any irregularities in the contact surfaces between the mask and the support member, an expected variation in the irregularities in the contact surface of the mask which is expected to be produced when the mask is secured onto the support member by vacuum suction; adjusting the measurement result of the distortion of the projection optical system by the expected lateral displacement of the projected image; and correcting the image formation characteristics based on the adjusted distortion, so that excellent image formation characteristics may be obtained.

In order to achieve the above-mentioned second object, in accordance with the present invention, there is also provided further another projection exposure method for making a projection exposure of an image of a pattern formed on a mask through a projection optical system onto a substrate, the mask being supported by a predetermined support member, comprising the steps of: measuring and storing any irregularities (including tilt) in a contact surface of the support member in contact with the mask; and making an exposure while partially correcting, based on the irregularities in the contact surface as stored, the position at which an image of the pattern of the mask is formed through the projection optical system. With this projection exposure method, if the contact surfaces of the support member in contact with the mask are tilted, the mask is caused to curve as shown in FIG. 17(A) when it is secured by the vacuum suction onto the contact surfaces. This problem may be solved by: determining an expected variation in the irregularities in the surface of the mask which is expected to be produced when the mask is secured onto the support member by vacuum suction; and correcting the measurements of the distortion of the projection optical system based on the expected variation thus determined, so that excellent image formation characteristics may be obtained.

In order to achieve the above-mentioned second object, in accordance with the present invention, there is also provided a projection exposure apparatus for making a projection exposure of an image of a pattern formed on a mask through a projection optical system onto a substrate, comprising: a measurement system for measuring a surface shape of a pattern-bearing surface of the mask: a storage for storing data representing the surface shape measured by the measurement system; an image formation characteristics correction system for partially correcting the position at which an image of the pattern of the mask is formed through the projection optical system: and a control system for making an exposure while correcting, through the image formation characteristics correction system and based on the data in the storage representing the surface shape, the position at which an image of the pattern of the mask is formed through the projection optical system. With this projection exposure apparatus, the projection exposure methods described above for achieving the above-mentioned second object may be conveniently performed.

In order to achieve the above-mentioned third object, in accordance with the present invention, there is provided a scanning projection exposure method in which a mask and a substrate are moved in synchronism with each other for transferring a pattern formed on the mask through a projection optical system onto the substrate, comprising the steps of: measuring a surface shape of a pattern-bearing surface of the mask, prior to making a scanning projection exposure of the substrate with the pattern of the mask; and correcting at least one of 1) image formation characteristics of the projection optical system and 2) the position of the substrate, based on the measurement result of the pattern-bearing surface, while making a scanning projection exposure.

With this scanning projection exposure method, the surface shape of the pattern-bearing surface of the mask can be measured while at least a part of the pattern-bearing surface is in an area outside a transfer area to be transferred by the projection optical system, so that the sensor for measuring the surface shape of the mask may be disposed at a position away from the projection optical system to the scanning direction. Accordingly, the sensor may be disposed with ease even when there is little space between the projection optical system and the mask stage and be used to measure the deformation (or the deflection) of the mask. Either the image formation characteristics of the projection optical system or the position of the substrate may be corrected based on the measured deformation, so that excellent image formation characteristics may be obtained.

With this method, it is preferable to perform the measurement of a surface shape of the pattern-bearing surface of the mask while the mask stands still at a starting point for scanning or while the mask is being accelerated for scanning. That is, when a mask replacement is done, by measuring a surface shape of the pattern-bearing surface of the new mask once while the pattern-bearing surface of the new mask is at a starting point for scanning or in an acceleration region, the necessary correction may be made during the subsequent exposure operation. Further, in the case where the surface shape measurement is performed in the acceleration region, it is unnecessary to extend the stroke of the movement of the mask for the surface shape measurement. Moreover, the measurement of a surface shape of the mask may be alternatively performed while the mask is being scanned for exposure, while the mask is being decelerated after scanning, or while the mask stands still after deceleration.

In order to achieve the above-mentioned third object, in accordance with the present invention, there is also provided a scanning projection exposure apparatus in which a mask and a substrate are moved in synchronism with each other for transferring a pattern formed on the mask through a projection optical system onto the substrate, comprising: a shape measurement system defining a plurality of detection points in an area outside a transfer area to be transferred by the projection optical system, for measuring a surface shape of a pattern-bearing surface of the mask; and a correction system for correcting at least one of 1) image formation characteristics of the projection optical system and 2) the position of the substrate, based on the measurement result by the shape measurement system.

With this scanning projection exposure apparatus, the shape measurement system may be disposed at a position away from the projection optical system to the scanning direction, and may be used to measure the surface shape of the pattern-bearing surface of the mask with ease. Further, the mask may be scanned along the shape measurement system, so that the surface shape of the entire pattern-bearing surface of the mask may be measured. With this exposure apparatus, the scanning projection exposure method described above for achieving the above-mentioned third object may be conveniently performed.

It is preferable to form a reference surface on a mask stage for moving the mask, such that the reference surface may be substantially level with the pattern-bearing surface of the mask. In such a case, at first the measurement by the shape measurement system is performed by measuring the position of the reference surface, and then measuring the surface position of the reticle with reference to the measured position of the reference surface. That is, the differential between the reference surface and the surface position of the mask is measured. By virtue of this, it is sufficient for the shape measurement system to have such stability for a very short time from when the reference surface has been measured to when the surface of the mask has been measured. Thus, even if the measurements produced from the shape measurement system tend to fluctuate within a certain period, the expected variation in the image formation characteristics may be determined with precision so as to make an appropriate correction for the variation.

In these cases, it is also preferable to perform the measurement of a surface shape of the pattern-bearing surface of the mask while the mask stands still at a starting point for scanning or while the mask is being accelerated for scanning.

In order to achieve the above-mentioned fourth object, in accordance with the present invention, there is provided a projection exposure apparatus, comprising: a first holder for holding a master matrix; an illumination optical system for illuminating the master matrix; a projection optical system for focusing light rays which pass through the master matrix on a photosensitized substrate so as to form an image thereon; and a second holder for holding the photosensitized substrate; wherein error factors due to the deformation of the master matrix produced by the gravity when the master matrix is held on the first holder have been corrected through a design process of a projection lens.

In stead of, or in addition to, the correction of the errors through the design process of the lens, an adjustment mechanism for the projection lens may be used to correct the errors in an adjustment process for the apparatus.

In order to achieve the above-mentioned fourth object, in accordance with the present invention, there is also provided a projection exposure method for making a projection exposure of a pattern on a master matrix onto a photosensitized substrate to transfer the pattern onto the substrate, comprising the step of: correcting, through a design process of a projection lens, error factors due to the deformation of the master matrix produced by the gravity when the master matrix is held.

That is, any focus errors and distortion errors which are expected to be produced by the deflection of a reticle are corrected through a reticle design process or an adjustment process. Therefore, any pattern transfer errors due to the deformation of a reticle may be eliminated even when the reticle has a relatively small thickness.

With this projection exposure method, it is preferable to determine errors due to the deformation of the master matrix produced by the gravity, through an exposure process or a measurement process performed using a reference master matrix, and adjust a projection lens of the projection optical system such that the errors may be eliminated, and then make an actual exposure. In this case, any errors are determined and corrected through the adjustment process, so that even the error produced by the reticle chucks may be determined and corrected.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 1 is a schematic representation of a critical portion of a projection exposure apparatus according to a first embodiment of the present invention for achieving the above-mentioned first object;

FIGS. 2(A), 2(B) and 2(C) are schematics illustrating mask deflections and the operation of a mask deflection detection system, in which FIG. 2(A) shows a mask with no deflection and FIGS. 2(B) and 2(C) each shows a mask with a deflection;

FIGS. 3(A), 3(B) and 3(C) are schematic representations of a critical portion of a projection exposure apparatus according to a second embodiment of the present invention for achieving the above-mentioned first object, in which FIG. 3(A) is a side elevation, FIG. 3(B) is a plan view and FIG. 3(C) is a cross-sectional view along the line C3—C3 of FIG. 3(B);

FIG. 4 is a perspective view of a critical portion of a projection exposure apparatus according to a third embodiment of the present invention for achieving the above-mentioned first object;

FIG. 20(A) is a plan view of a reference member of FIG. 18 showing an arrangement of evaluation marks thereon, FIG. 20(B) is a plan view of a reference mark plate of FIG. 18 and FIG. 20(C) is a sectional view showing a detection system disposed under the reference mark plate of FIG. 20(B);

FIG. 21 is a schematic side elevation illustrating the deformation of the image surface due to the deformation of the pattern-bearing surface of a reticle;

DETAILED DESCRIPTION OF PREFERRED EMBODIMENTS

Figure 2A:
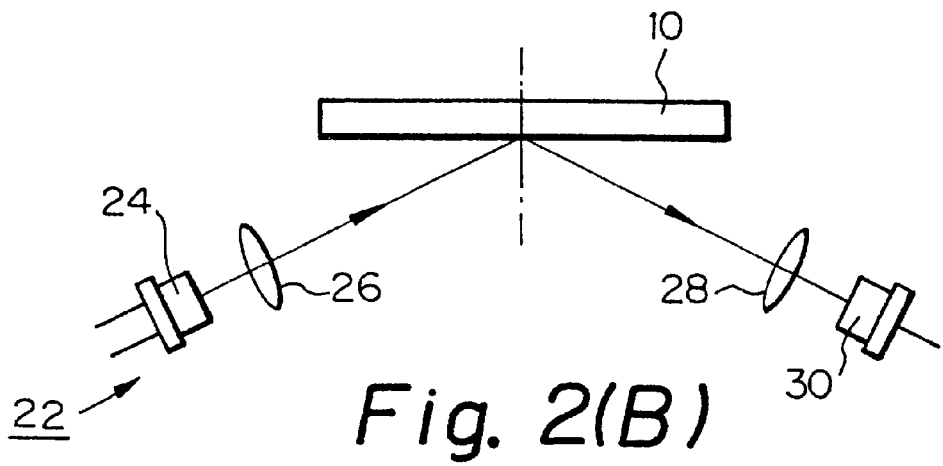

Referring now to the accompanying drawings, preferred embodiments of the present invention will be described in detail. To begin with we will describe three embodiments that are specifically directed to the first aspect of the present invention described above, including a first embodiment utilizing pneumatic pressure adjustment for controlling the deflection of a mask, a second embodiment utilizing piezoelectric actuator elements for controlling the deflection of a mask, and a third embodiment showing an exemplified application of the present invention to a scanning projection exposure apparatus.

Referring to FIGS. 1 and 2, the first embodiment will be described in detail. FIG. 1 shows a critical portion of a projection exposure apparatus arranged and constructed according to the first embodiment. As shown in FIG. 1, a mask 10 is held on a mask holder 12 by means of vacuum suction, with a pattern-bearing surface of the mask 10 facing downward direction. A light source 14 is provided above the mask 10 for illuminating light rays forming an exposure beam, and an illumination optical system 16 is disposed between the light source 14 and the mask 10. A wafer 20 is located at a position on that side of the mask 10 to which the exposure beam emits through the mask 10, and on that side of a projection optical system 18 opposite to the mask 10.

The exposure apparatus of this embodiment operates in a way which is common to many of conventional projection exposure apparatus. More specifically, the exposure beam from the light source 14 illuminates the mask 10 through the illumination optical system 16, so that an image of the pattern formed oi the mask 10 is projected onto the wafer 20 through the projection optical system 18.

As shown in FIG. 1, this embodiment comprises a mask-deflection detection system 22 disposed below and around the mask holder 12. The mask-deflection detection system 22 has the same arrangement and functionalities as a conventional, oblique-incidence focus detection system used for bringing the surface of a wafer into a position at which it will be coincident with the focal plane defined by a projection optical system. Such a focus detection system may be seen, for example, in Japanese published patent application No. Sho-60-168112 (No. 168112/1985). Specifically, the mask-deflection detection system 22 comprises a light-beam-projecting unit and a light-beam-detecting unit. The light-beam-projecting unit projects a detection light beam toward the pattern-bearing surface of the mask 10, and the reflected light beam is detected by the light-beam-detecting unit so as to detect any deflection of the mask 10. The light-beam-projecting unit comprises a light source 24, such as a light-emitting diode, and a projection lens 26. The light-beam-detecting unit comprises a light-receiving lens 28 and a photodetector 30, such as a photodiode. The output from the photodetector 30 is coupled to an arithmetic operation unit 32.

Figure 2B:
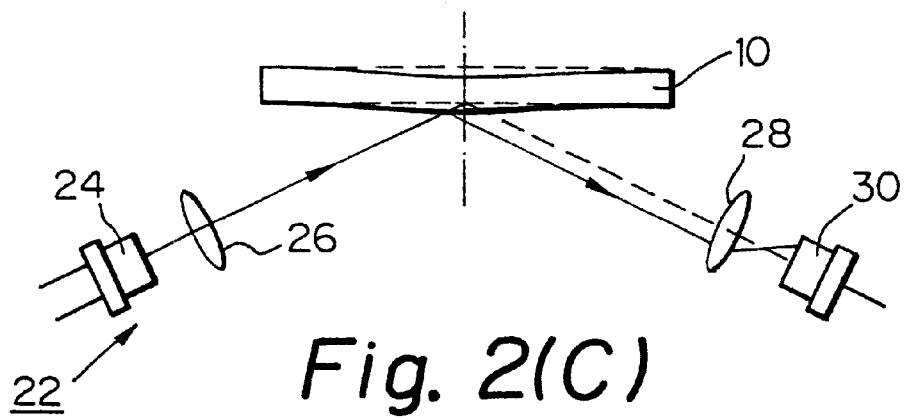
Figure 2C:
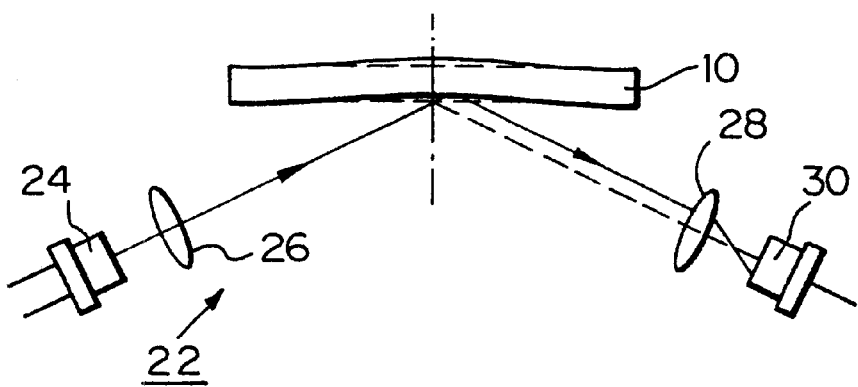

Referring next to FIG. 2, operation of the mask-deflection detection system 22 will be described. The light source 24 emits light rays which are focused by the projection lens 26 to a point on or near the pattern-bearing surface of the mask 10. The reflected light beam from the pattern-bearing surface of the mask 10 is again focused by the light-receiving lens 28 to a point on the sensitive surface of the photodetector 30. Any variation in position of the pattern-bearing surface of the mask 10 up and down as shown in FIGS. 2(B) and 2(C) will cause the corresponding variation in position of the point of incidence of the reflected, received light beam on the sensitive surface of the photodetector 30 as shown in the solid lines in these figures. Thus, any deflection of the mask 10 with respect to the reference position such as shown in FIG. 2(A) may be detected from the position of the point of incidence of the received light beam on the sensitive surface of the photodetector 30.

Referring again to FIG. 1, the output of the arithmetic operation unit 32 is coupled to a pneumatic-pressure control unit 34, which is in communication with a mask-deflection correction unit 38 through a conduit pipe 36. The mask-deflection correction unit 38 comprises a box having side walls with their lower edges capable of airtight abutment with the mask 10 and a top wall made from a highly plane, highly clear glass plate not affecting the exposure light beam. Thus, the box together with the mask 10 defines an air chamber 40. The pneumatic pressure within the air chamber 40 may be controlled by the pneumatic-pressure control unit 34 in order to control any deflection of the mask 10. The pneumatic-pressure control unit 34 is capable of controlling the pneumatic pressure within the air chamber 40 depending on the desired pneumatic-pressure control value supplied from the arithmetic operation unit 32.

Figure 7:
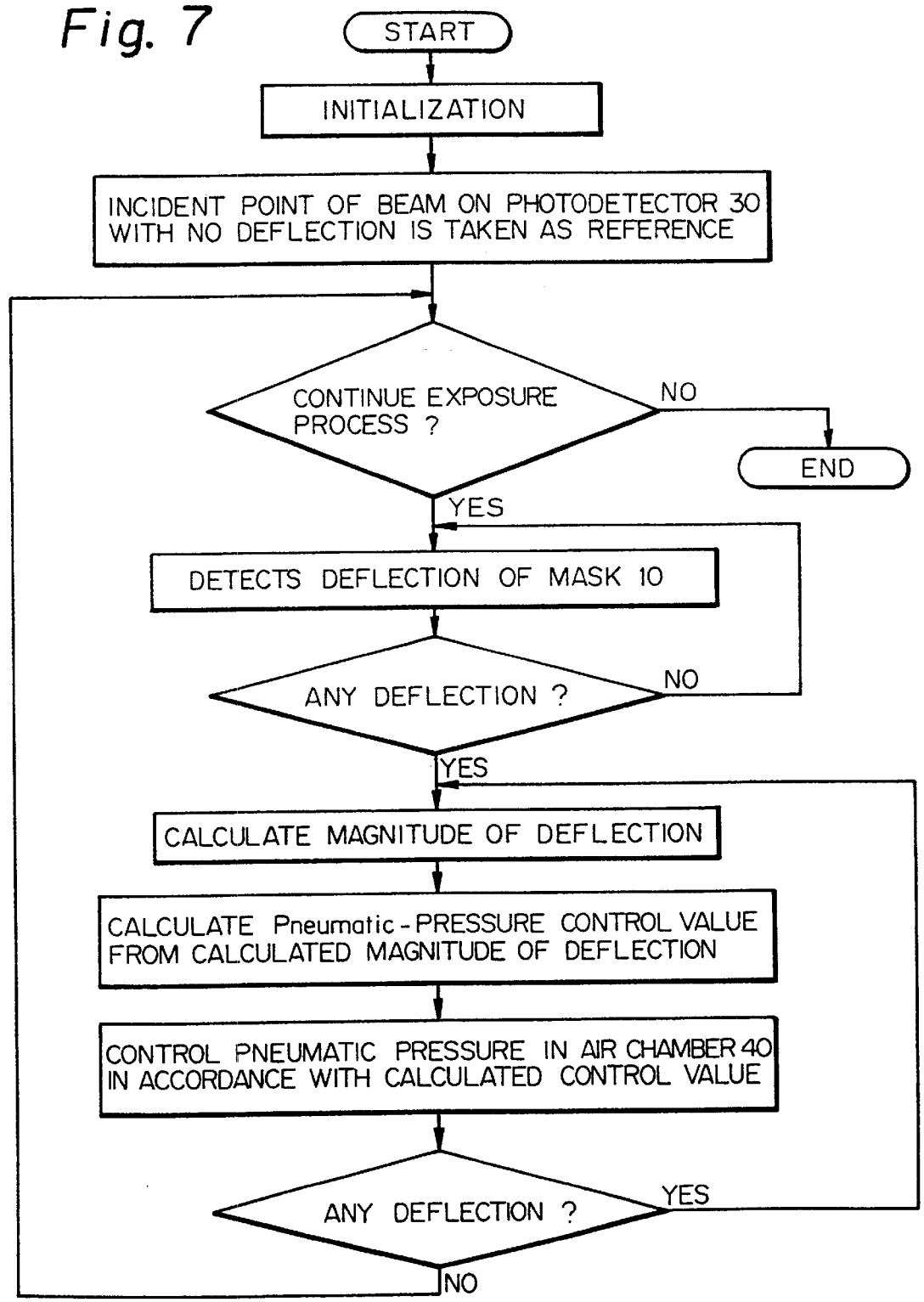
FIG. 7 is a flow chart illustrating the operation of the projection exposure apparatus according to the first embodiment shown in FIG. 1.

General operation of the first embodiment having the above arrangement is as follows (see FIG. 7). When the mask 10 is deformed by some reasons such as the gravity and/or thermal expansions, a deflection of the mask is detected by the mask-deflection detection system 22. An example of the procedure for the detection is as follows. As preparatory steps, a mask 10 is made flat without any deflection and the pattern-bearing surface of the mask 10 is set to be coincident with the image plane defined by the projection optical system 18 (see FIG. 1), as shown in FIG. 2(A), while the position of the incident point of the light beam on the sensitive surface of the photodetector 30 is measured and stored. That is, the detection signals from the photodetector 30, which are produced when the mask 10 is under the condition as illustrated in FIG. 2(A), are supplied to the arithmetic operation unit 32 which stores them as the signals representing the reference position.

When the mask 10 is deformed, and thus changes its shape from that shown by solid lines to that shown by broken lines in FIG. 2(B) or 2(C), then the path of the light beam from the light source 24 will be changed from that shown by solid lines to that shown by broken lines. The mask 10 is deformed downward and upward in FIGS. 2(B) and 2(C), respectively. The detection signals from the photodetector 30 produced when the position of the incident point of the light beam on the sensitive surface of the photodetector 30 varies are supplied to the arithmetic operation unit 32. The arithmetic operation unit 32 performs comparison of the supplied detection signals with the detection signals representing the reference position as shown in FIG. 2(A), and uses the comparison to derive the magnitude of the deflection of the mask 10 or the displacement of a particular position on the mask 10 from the reference position mentioned above. The arithmetic operation unit 32 further calculates the desired pneumatic-pressure control value which is required for correcting the detected deflection of the mask 10.

The desired pneumatic-pressure control value is supplied to the pneumatic-pressure control unit 34, which controls the pneumatic pressure within the air chamber 40 of the mask-deflection correction unit 38 so as to correct the detected deflection of the mask 10. The correction of the deflection of the mask 10 may be performed in this manner either continuously or periodically at. an appropriate frequency so that any deflection of the mask 10 due to the gravity and/or possible thermal expansions may be corrected.

As clearly understood from the above, according to the first embodiment, any deflection of the mask 10 is detected by the mask-deflection detection system 22, the magnitude of the deflection as well as the desired pneumatic-pressure control value for correcting the deflection are calculated by the arithmetic operation unit 32, and the pneumatic pressure within the air chamber 40 of the mask-deflection correction unit 38 is controlled by the pneumatic-pressure control unit 34. In this manner, any lateral displacements of the images of the features of a pattern and curvature of field both of which may result from the deflection of the mask 10 due to the gravity, or any distortion and curvature of field due to the thermal deformation of the mask 10, may be reduced and thereby the projection of the mask pattern may be appropriately performed.

Figure 3A:
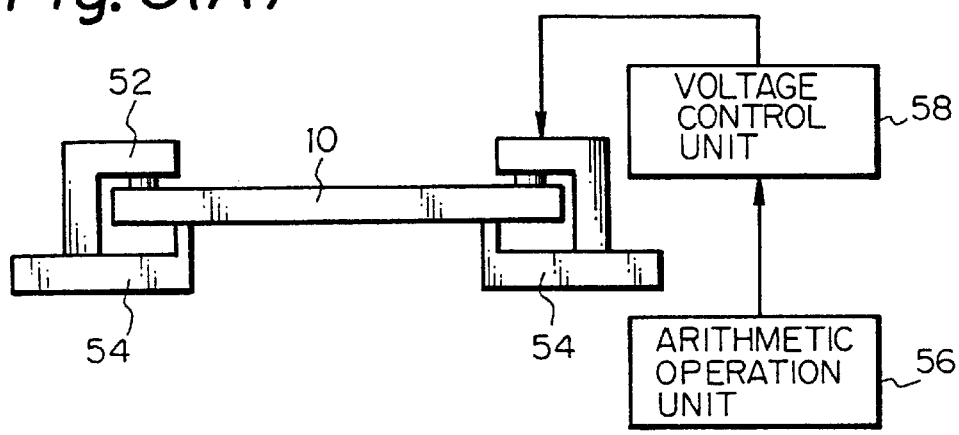
Figure 3B:
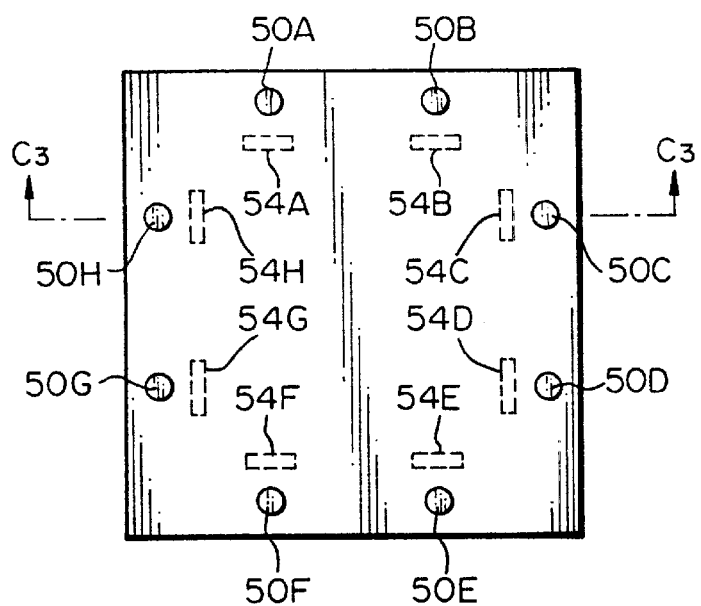

Referring next to FIG. 3, the second embodiment will be described in detail. In FIG. 3, like elements are designated by like reference numerals as used for the elements of the first embodiment. While the first embodiment utilizes an air chamber for the purpose of correcting the deflection of the mask, the second embodiment utilizes a set of piezoelectric actuator elements for the same purpose. FIG. 3(A) shows a critical portion of the second embodiment, and FIG. 3(B) shows the plan view of a mask. As shown in these figures, a set of piezoelectric actuator elements 50A to 50H are disposed on the top surface of the mask 10 along its peripheral edges. The piezoelectric actuator elements 50A to 50H are mounted onto a fixed frame 52 surrounding the mask 10 and comprising four side members having an L-shaped cross-section. The mask is held at a plurality of points on its under side along its peripheral edges onto corresponding platens 54A to 54H by vacuum suction. The fixed frame 52 is fixedly mounted onto the mask holder 54.

The arrangement in plan of the piezoelectric actuator elements 50A to 50H and the platens 54A to 54H is shown in FIG. 3(B), in which the piezoelectric actuator elements 50A to 50H are disposed outside to the platens 54A to 54H.

The second embodiment comprises a mask-deflection detection system 22 having the same arrangement as that used in the first embodiment described above. The output of the photodetector 30 is coupled to an arithmetic operation unit 58, the output of which is in turn coupled to a voltage control unit 58. The output of the voltage control unit 58 is coupled to the set of piezoelectric actuator elements 50A to 50H through the fixed frame 52. The arithmetic operation unit 56 is capable of calculating the magnitude of the deflection of the mask 10 based on the detection signals supplied from the photodetector 30 as well as calculating the desired voltage control value indicating the voltage which has to be applied to the piezoelectric actuator elements 50A to 50H for correcting the detected deflection of the mask 10. The voltage control unit 58 is capable of controlling the voltage to be applied to the piezoelectric actuator elements 50A to 50H in accordance with the desired voltage control values supplied thereto.

Figure 8:
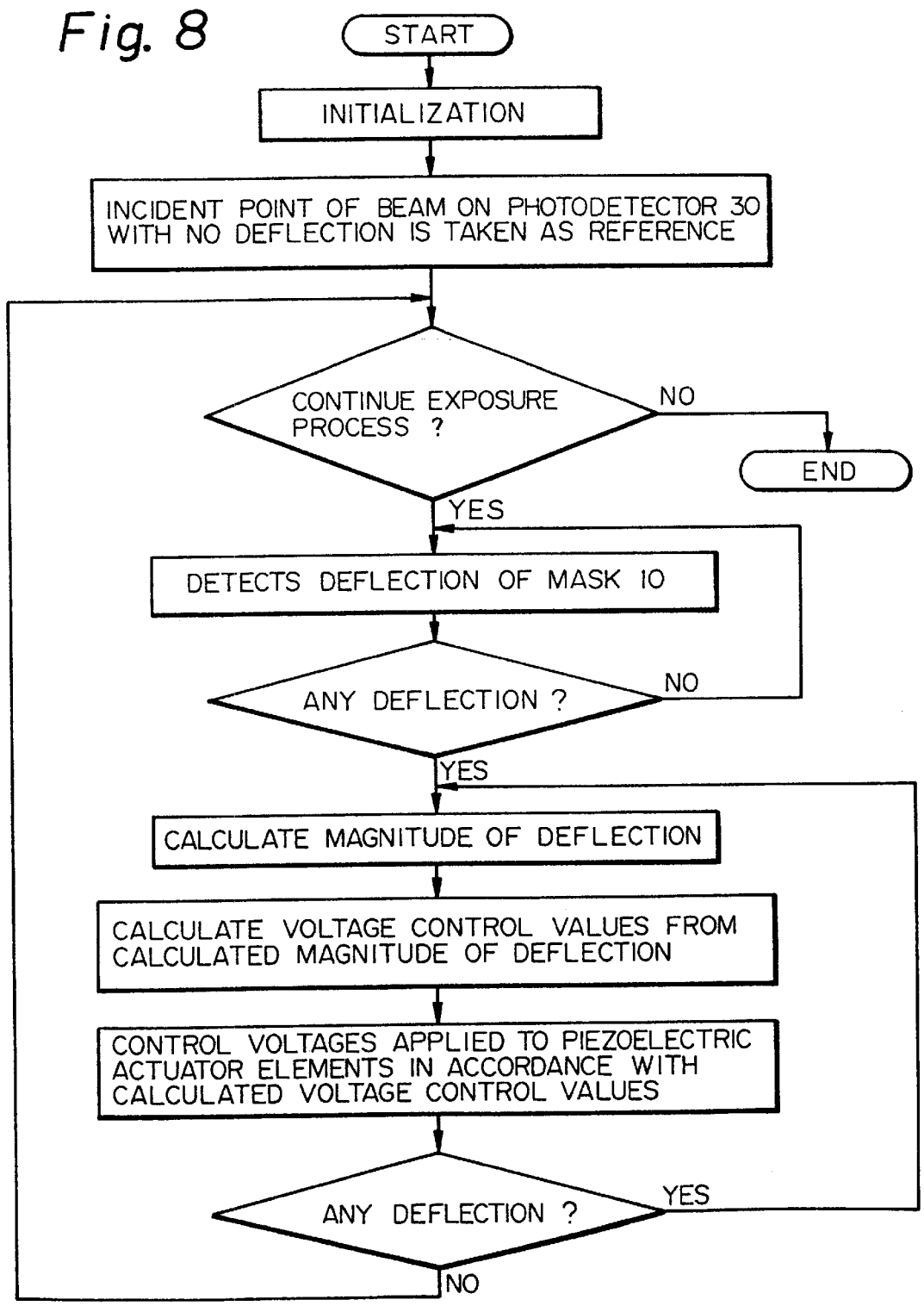
FIG. 8 is a flow chart illustrating the operation of the projection exposure apparatus according to the second embodiment shown in FIGS. 3(A) to 3(C)

Operation of the second embodiment will be now described (see FIG. 8). The detection signals, which are produced by the mask-deflection detection system 22 in the same manner as with the first embodiment described above, are supplied to the arithmetic operation unit 56. The arithmetic operation unit 56 calculates the magnitude of the deflection of the mask 10 based on the detection signals supplied thereto as well as calculates the desired voltage control values indicating the respective voltages to be applied to the piezoelectric actuator elements 50A to 50H and supplies these voltage control values to the voltage control unit 58. The voltage control unit 58 then controls the voltages to be applied to the piezoelectric actuator elements 50A to 50H in accordance with the desired voltage control values supplied thereto.

Figure 3C:
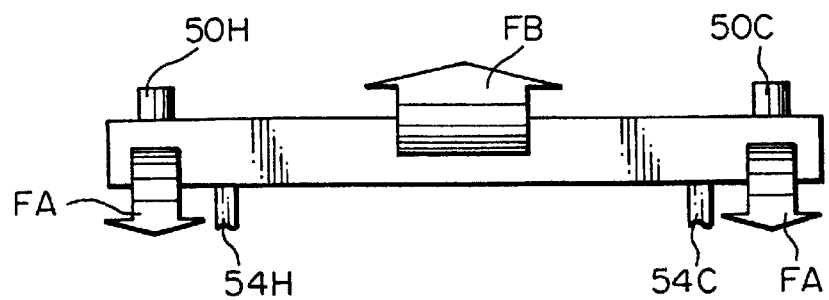

FIG. 3(C) shows a cross-sectional side view of the mask 10 along line C3—C3 of FIG. 3(B). The mask 10 generally tends to deflect downward as indicated by solid lines in FIG. 2(B). In the second embodiment, the platens 54C and 54H are disposed inside to the piezoelectric actuator elements 50C and 50H as shown in FIG. 3(C). Therefore, if the piezoelectric actuator elements 50C and 50H are applied with a voltage having such polarity that cause them to elongate in the vertical direction, the right and left ends (as viewed in FIG. 3(C)) of the mask 10 is deflected downward as indicated by arrows FA. Since the platens 54C and 54H serves as the fulcra, the central portion of the mask 10 is deflected upward as indicated by arrow FB. By virtue of this, the downward deflection of the mask 10 may be corrected. This control of the piezoelectric actuator elements 50C and 50H is done by the voltage control unit 58. The other piezoelectric actuator elements are controlled in the same manner.

As clearly understood from the above, according to the second embodiment, any deflection of the mask 10 is detected by the mask-deflection detection system 22, the magnitude of the deflection as well as the desired voltage control values for correcting the deflection are calculated by the arithmetic operation unit 56, and the voltages to be applied to the piezoelectric actuator elements 50A–50H are controlled by the voltage control unit 58. In this manner, this embodiment may achieve the same advantages as the first embodiment described above.

Figure 5:
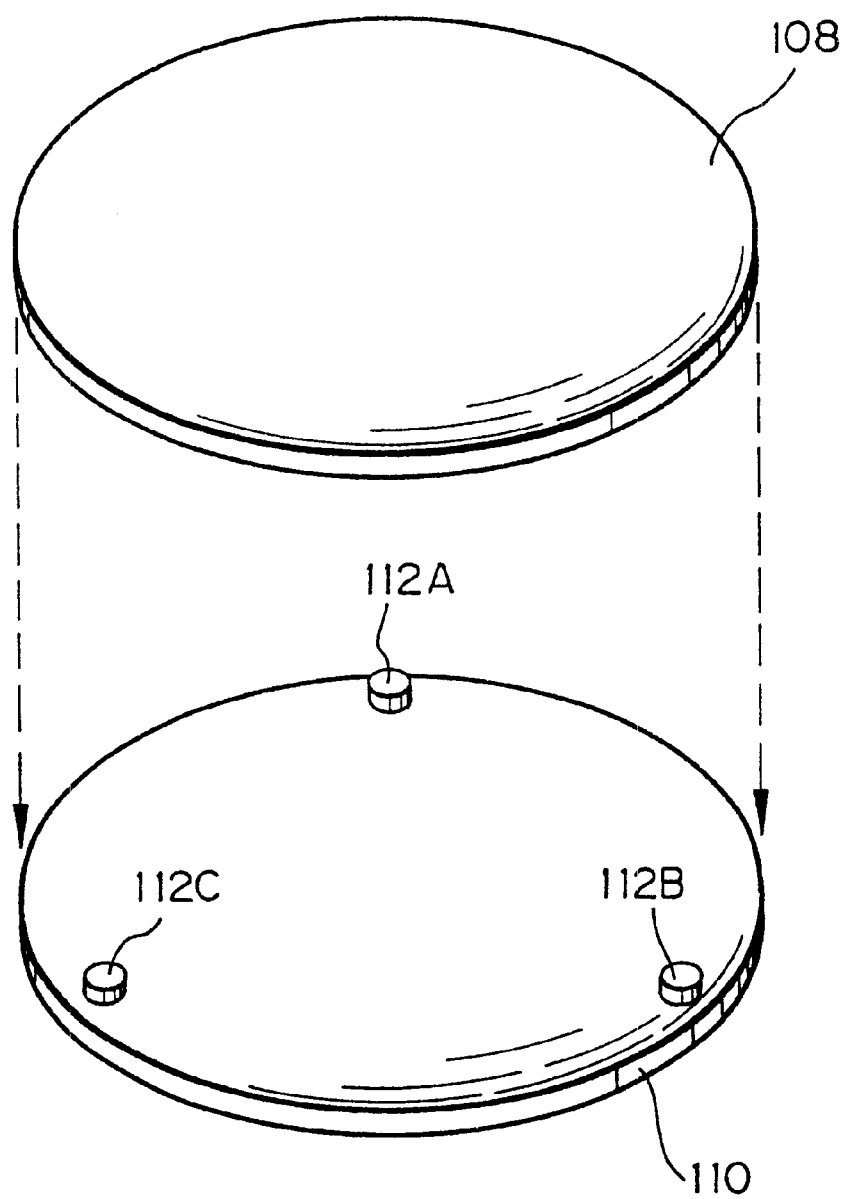
FIG. 5 is an exploded view of a part of the critical portion of the projection exposure apparatus of FIG. 4.

Referring next to FIGS. 4 and 5, the third embodiment will be described in detail. This embodiment shows an exemplified application of the present invention to a scanning projection exposure apparatus of the type such as disclosed in Japanese published patent application No. Hei-4-196513 (No. 196513/1992) used for fabrication of liquid crystal displays or others. An illumination optical system (not shown) emits a slit-shaped light beam 100, which illuminates a mask 102 as indicated by arrow FD. A mask-deflection detection system 22 having the same arrangements as those used in the above embodiments is disposed below and around the mask 102 and has a photodetector 30 whose output is coupled to an arithmetic operation unit 104.

A projection optical system 106 is disposed on the beam-exiting side of the mask 102. FIG. 5 shows an exploded perspective view of a critical portion of the projection optical system 106. As seen, the projection optical system 106 comprises first and second lens element 108 and 110 between which three piezoelectric actuator elements 112A–112C are disposed along their peripheral edges. The piezoelectric actuator elements 112A–112C may elongate/shorten to control the distance between the lens elements 108 and 110. In addition, since three piezoelectric actuator elements 112A–112C are used to support the first lens element 108, it may be tilted with respect to a plane perpendicular to the optical axis of the projection optical system 106. These distance and tilt adjustments enable the correction of any variations in the projected image which may be caused by possible deflection of the mask 102, such as any variations in magnification and any distortions due to the deflection.

The voltage to be applied to the piezoelectric actuator elements 112A–112C is controlled by a voltage control unit 118 to which the output of the arithmetic operation unit 104 is coupled. A glass plate 120 is located on the beam-emitting side of the projection optical system 106. For scanning, the mask 102 and the glass plate 120 are moved in synchronism with each other, in the opposite directions, and at appropriate velocities meeting the required relationship for the desired projection magnification ratio. For example, while the mask 102 is moved in the direction of arrow FE, the glass plate 120 is moved in the direction of arrow FF.

Figure 9:
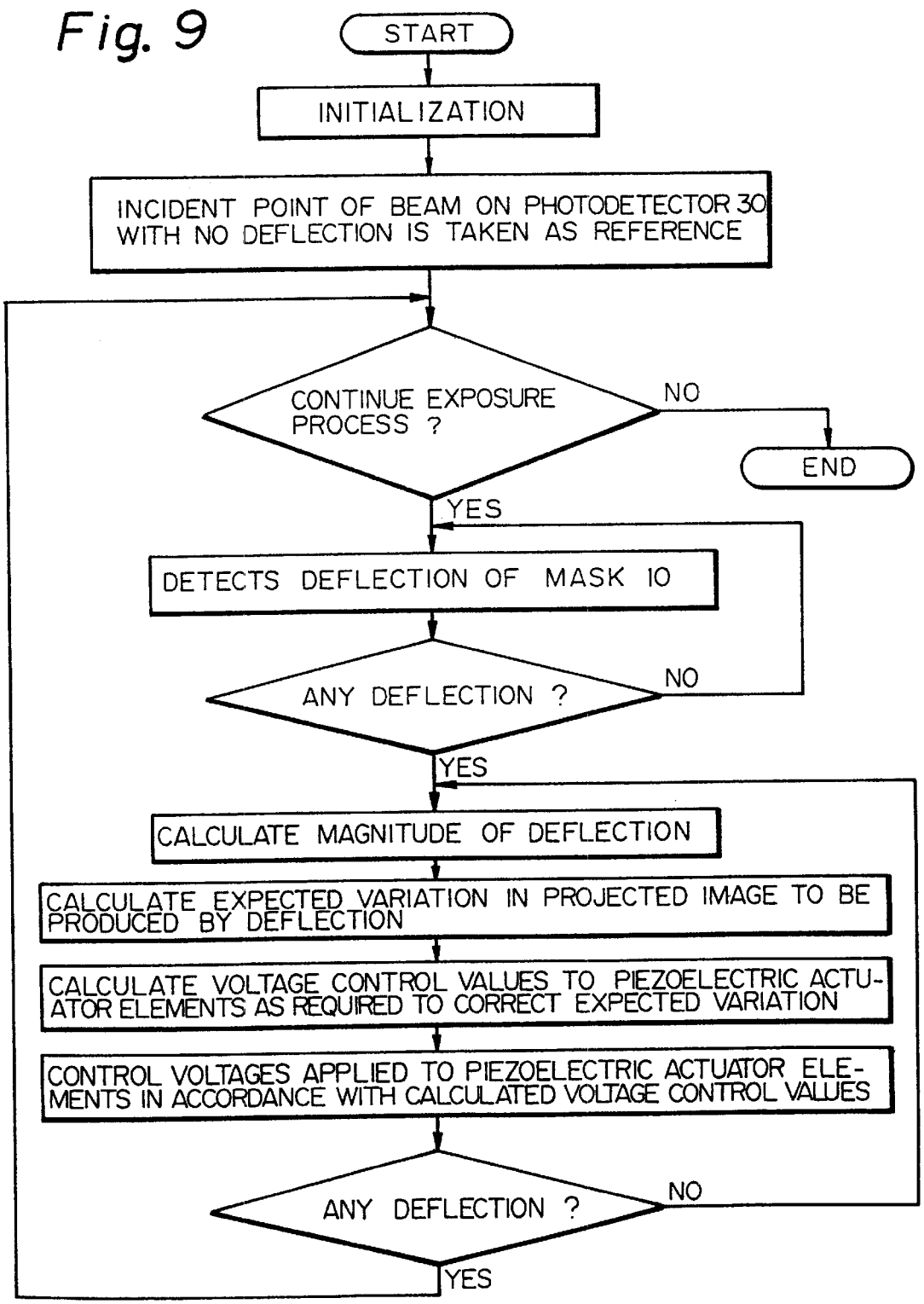
FIG. 9 is a flow chart illustrating the operation of the projection exposure apparatus according to the third embodiment shown in FIGS. 4 and 5.

Operation of the third embodiment having the above arrangement will be now described (see FIG. 9). As it is common in most of scanning projection exposure apparatus, the mask 102 and the glass plate 120 are moved in synchronism and relative to the projection optical system for scanning, while the image of the mask pattern is serially projected onto the glass plate. In this embodiment, the mask 102 and the glass plate 120 are moved in synchronism with each other, in the directions of arrows FE and FF, respectively, and at velocities meeting the required relationship for the desired projection magnification ratio, while the slit-shaped light beam 100 scans the mask 102 so that the image of the mask pattern is serially projected onto the glass plate 120.

During this scanning projection operation, if the mask 102 is deflected, the deflection is detected by the mask-deflection detection system 22 as with the above-described embodiments, and the magnitude of the deflection is calculated by the arithmetic operation unit 104. The arithmetic operation unit 104 further uses the calculation results to derive the expected adverse effects of the deflection of the mask 102 on the projected image, and calculates the voltage control values indicating the respective voltages to be applied to the piezoelectric actuator elements 112A–112C in order to correct the expected adverse effects on the projected image. The voltage control values are supplied to the voltage control unit 118, so that the voltages applied to the piezoelectric actuator elements 112A–112C in the projection optical system 106 are controlled. In this manner, the lens element control of the projection optical system 106 is performed such that the relationship between the lens elements 108 and 110 is adjusted so as to correct any adverse effects of the mask-deflection on the projected image.

Figure 6:
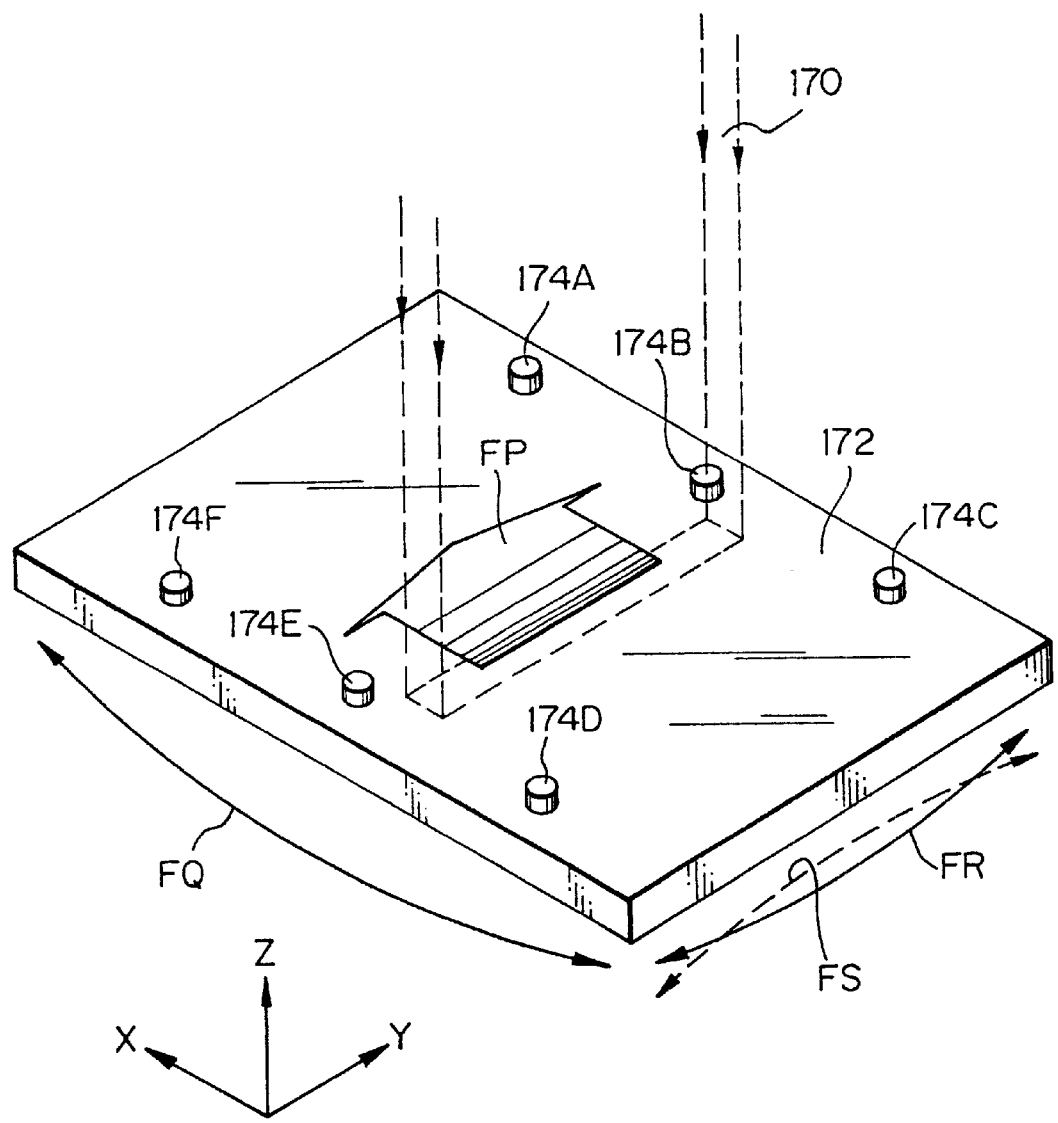
FIG. 6 is a perspective view of a critical portion of a projection exposure apparatus according to a fourth embodiment of the present invention for achieving the above-mentioned first object.

Referring now to FIG. 6, the fourth embodiment will be described in detail. This embodiment shows another exemplified application of the present invention to a scanning projection exposure apparatus. An illumination optical system (not shown) emits a slit-shaped light beam 170, which scans a mask 172 in the X-direction as indicated by arrow FP while the mask 172 is moved in the opposite direction. A glass plate (not shown) is moved in synchronism with the mask 172, so that the pattern of the mask 172 is serially projected onto the glass plate.

The mask 172 may be deflected in the Z-direction as indicated by arrows FQ and FR due to some causes such as the gravity. It may be ideal that the deflection of the mask 102 is corrected with respect to both of the X- and Y-directions corresponding to arrows FQ and FR. Nevertheless, the light beam 170 has an elongate cross section which produces an elongate light spot on the mask. 172 which is short in the scanning direction (or the X-direction) and wide In the lateral direction (or the Y-direction). In view of such particular shape of the light spot produced by the light beam 170, it is more practical for the pattern projection purposes that the deflection along the X-direction as indicated by arrow FQ is corrected by focusing and/or levelling operations, and only the deflection along the Y-direction as indicated by arrow FR is eliminated.

Thus, in this embodiment, a set of piezoelectric actuator elements 174A–174F are disposed such that the deflection of the mask 172 along the Y-direction as indicated by arrow. FR may be eliminated thereby, or the positions along a pair of edges of the mask 172 extending in the moving direction of the light beam 170. The deflection of the mask 172 is detected and corrected in the same manner as with the second embodiment described above. For example, when the light beam 170 falls on the mask 170 at the position near two of the piezoelectric actuator elements, 174C and 174D, the deflection may be corrected by activating them. In this manner, the mask 172 may be caused to produce a corrective, counteractive deflection as indicated by arrow FS, which may cancel out the original deflection as indicated by arrow FR.

Various modifications and alterations may be made to the embodiments described above, and are apparent to those skilled in the art having read the above disclosure. Such modifications and alterations include the followings.

(1) While the first embodiment utilizes a pneumatic pressure for the purpose of correcting the deflection of the mask, it is also possible to use a hydraulic pressure. However, to use a pneumatic pressure is preferable in view of the handling of a mask and the prevention of leakage of a liquid.

(2) While each of the embodiments described above detects the deflection of the mask at a single point on the mask, they may be modified such that the deflection is detected at a plurality of points on the mask and an optimal correction for the deflection may be calculated by.using an appropriate arithmetic operation such as averaging and/or least-squares method. In order to detect the deflection at a plurality of points on the mask, a plurality of mask-deflection detection systems, each corresponding to that shown above, may be used. Alternatively, a diffraction grating may be used to produce a plurality of light beams from a single light beam output from a single light source, which enables simplification of the arrangement.

(3) With each of the second, third and fourth embodiments described above, a magnitude of the deflection of the mask may be detected at each of a plurality of points on the mask and a voltage control value may be derived for each of the piezoelectric actuator elements individually. This enables an appropriate correction of an asymmetric deflection of a mask.

(4) While the embodiments described above use the piezoelectric actuator elements, any of various other known actuators may be used for this purpose, including electrostrictive and magnetostrictive actuator elements. Further, the number of actuators may be varied if desired.

(5) The features of different embodiments may be combined. For example, the technique for correcting the mask-deflection using the projection optical system as used in the third embodiment may be incorporated in the wafer exposure apparatus according to the first and second embodiments.

(6) With the third embodiment, two detection fields in which the detection points for detecting the mask deflection lie may be defined on opposite sides of the illumination field of the light beam 100 in the scanning direction, so that the magnitude of the deflection of the mask may be detected within such one of the detection fields that is temporary in advance of the illumination field moving relative to the mask in the scanning direction. This enables the real-time correction of the projected image of the mask pattern depending on the magnitude of the deflection of the mask within the illumination field of the light beam 100.

While the embodiments described above show exemplified application of the present invention to an exposure apparatus used for transferring the pattern of a mask onto a glass plate for a liquid crystal display, the present invention may be also applied to an exposure apparatus for transferring the pattern of a mask onto a silicon wafer as used in fabrication of semiconductor chips.

As described above, according to the embodiments of the present invention for achieving the above-mentioned first object, the deflection of a mask is detected and either the deflection of the mask is corrected of the projection image is corrected for the deflection of the mask, so that any lateral displacements of the features of the pattern and curvature of the image surface due to the deflection of the mask by the gravity, as well as any distortion and curvature of the image surface due to the thermal expansion may be reduced and thus the pattern of a mask may be advantageously performed and the projected image of the pattern of the mask shows good accuracy and stability.

Next, we will describe several embodiments of the present invention for achieving the above-mentioned second object. While the present invention may be applied to various projection exposure apparatus including steppers and scanning projection aligners, the embodiments described below show exemplified application of the present invention to a projection exposure apparatus called a step-and-scan projection aligner.

Figure 10:
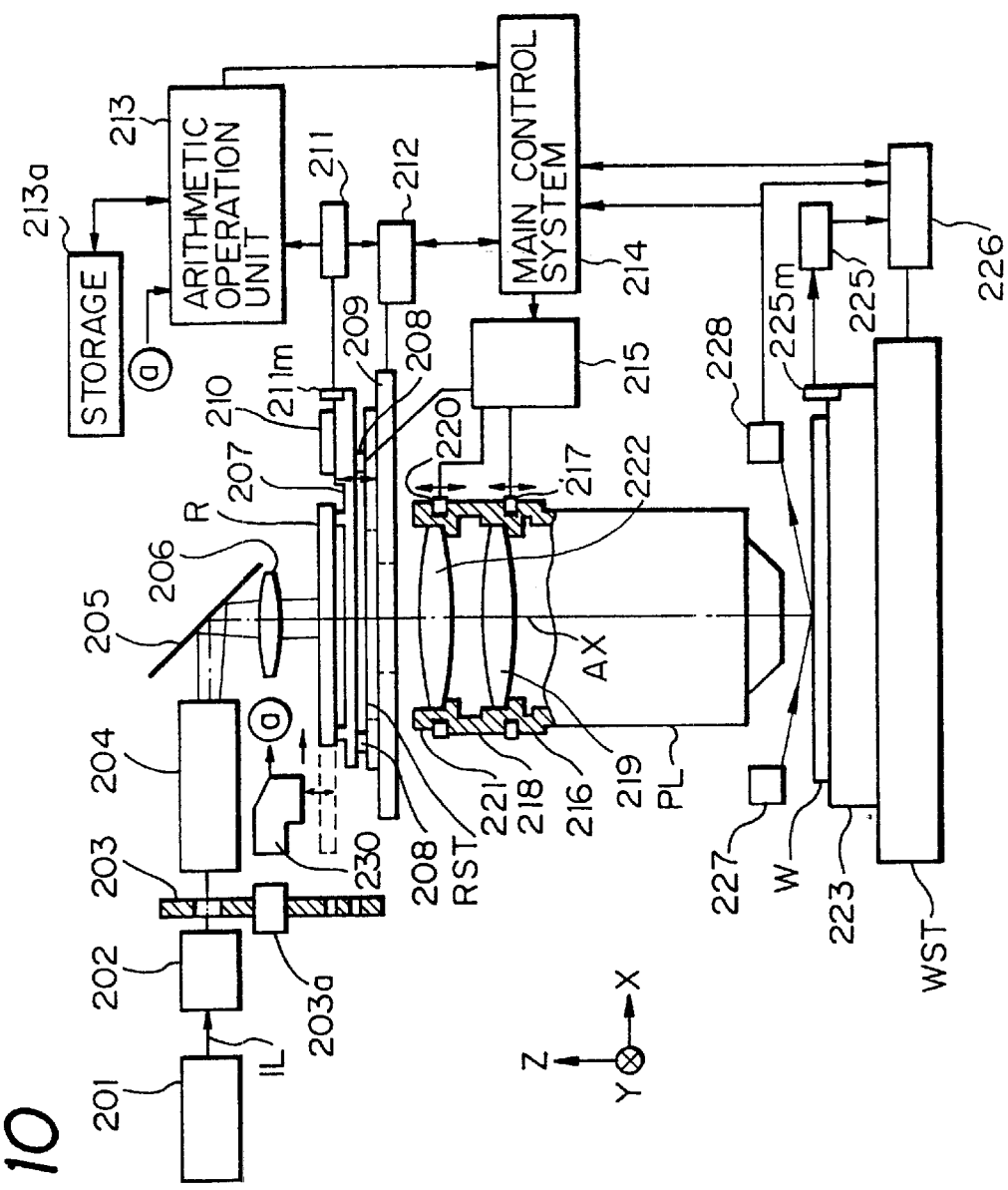
FIG. 10 is a schematic representation, partially broken away, of a projection exposure apparatus used with a further embodiment of the present invention for achieving the above-mentioned second object.

FIG. 10 shows a projection exposure apparatus according to a fifth embodiment of the present invention for achieving the above-mentioned second object. As shown In FIG. 10, an exposure light source 201 emits an illumination light beam IL for exposure. The light beam IL enters a beam-shaping optical system 202 comprising a relay optical system and a fly's eye lens for establishing a uniform illuminance distribution. The illumination light beam IL may comprise light of i-line in the line spectrum of a mercury lamp (having wavelength of 365 nm), light output from a KrF excimer laser (having wavelength of 248 nm), light output from an ArF excimer laser (having wavelength of 193 nm) or light of one of possible harmonics of a YAG laser output. The beam-shaping optical system 202 has a beam-exiting surface which is coincident with a plane of a pupil for the plane of a reticle (or mask) with respect to the optical system intervening therebetween. In front of the beam-exiting surface, there is provided a turret plate 203 having a plurality of different aperture stops formed therein for varying the illumination condition to the reticle. These aperture stops are formed in the peripheral portion of the turret plate 203 and include: fixed circular stops, a variable circular stop capable of varying the coherence factor (σ-value) of the illumination optical system, an annular aperture stop for annular illumination, and a divided (quartered) aperture stop for modified illumination. The turret plate 203 is driven for rotation by means of a drive motor 203a so that a desired aperture stop may be selected from among them.

The illumination beam IL, having passed through the selected one of the aperture stops in the turret plate 203, then passes through an optical system 204, an optical-pass-bending mirror 205 and then a condensor lens 206, and illuminates the pattern-bearing surface (bottom surface) of the reticle R within a slit-shaped illumination field defined thereon. The image of that part of the pattern of the reticle R which is confined within the illumination field is projected through a both-side-telecentric projection optical system PL onto a photoresist-coated wafer W within a slit-shaped exposure filed, with a chosen demagnification ratio β (β is, say, 1/4 or 1/5.) In the following description, any directions are specified with respect to a three-dimensional, orthogonal coordinate system defined by X-, Y- and Z-axes, in which the Z-axis is parallel to the optical axis AX of the projection optical system PL, the X-axis is parallel to the "scanning direction" in which the reticle R and the wafer W are moved for scanning in the scanning projection process (i.e., the direction parallel to the drawing sheet surface of FIG. 10) and the Y-axis is parallel to the "non-scanning direction" perpendicular to the scanning direction (i.e., the direction perpendicular to the drawing sheet surface of FIG. 10).

The reticle R is supported by and held on a reticle holder 207 at four points by vacuum suction, for example. The reticle holder 207 is supported by a reticle stage RST through three extendable/contractible actuator elements 208. The reticle stage RST is carried on a reticle base 209 and arranged to be driven by a linear motor (not shown) for continuous linear movement in the X-direction as well as to be driven for minute corrective movement in the X-direction, the Y-direction and the rotational direction. There are provided two movable mirrors 211m (only one of them is shown) fixedly mounted on the top surface of the reticle holder 207 and corresponding two laser interferometer units 211 (again, only one of them is shown) fixedly mounted on certain, stationary parts of the exposure apparatus outside the reticle holder 207. The movable mirrors 211m and the laser interferometer units 211 cooperate to measure the two-dimensional position of the reticle holder 207 (and thus of the reticle R). A main control system 214 serves to provide general control of the entire exposure apparatus. A reticle stage drive system 212 serves to control the operation of the reticle stage RST based on the measurements supplied form the laser interferometer units 211 and the control information from the main control system 214. An image formation characteristics control unit 215 serves, under the control of the main control unit 214, to control the actuation amounts of the three actuator elements 208 so as to provide fine adjustment of the height (or the position in the Z-direction) and tilt angles of the reticle R such that certain distortions (including any errors in the demagnification ratio) may be adjusted within limited adjustment ranges.

A reference plate member 210 made from a glass plate is mounted on the reticle stage RST at a position adjacent to that of four peripheral edges of the reticle R which faces to the +X-direction. The reference plate member 210 has a highly flat bottom surface (referred to as "reference surface" hereinafter.) The reference surface of the reference plate member 210 is nominally level with the pattern-bearing surface of the reticle R. The reference surface has reference marks formed thereon which are used as the references to determine the position of the reticle stage RST in the X- and Y-directions.

The projection optical system PL used with this embodiment is provided with an image formation characteristics correction mechanism. This mechanism comprises a first set of three extendable/contractible actuator elements 217 mounted on a lens barrel 216 of the projection optical system PL, a first movable lens-frame 218 holding a first lens element 219 and supported by the lens barrel 216 through the first set of actuator elements 217, a second set of extendable/contractible actuator elements 218 mounted on the first movable lens-frame 218, and a second movable lens-frame 221 holding a second lens element 222 and supported by the first movable lens-frame 218 through the second set of actuator elements 218. The main control system 214 operates the image formation characteristics control unit 215 to control the actuation amounts of the six actuator elements 217 and 220 so as to provide fine adjustment of the positions and/or tilt angles of the first and second lens elements 219 and 222 such that certain distortions (including any errors in demagnification ratio) produced by the projection optical system PL may be adjusted within limited adjustment ranges.

A wafer W is held by vacuum suction onto a wafer holder (not shown), which is fixedly mounted on a material support 223, which is in turn fixedly mounted on a wafer stage WST. The material support 223 serves to control the focus position of the wafer W (or the position of the surface of the wafer W in the Z-direction) and the tilt angles of the wafer W. The wafer stage WST serves to provide continuous linear movement of the material support 223 in the X-direction by means of a linear motor as well as provide step movement of the material support 223 in the X- and Y-directions. The wafer stage WST may comprise linear motors for these purposes.

There are provided two movable mirrors 225*m* (only one of them is shown) fixedly mounted on the top surface of the material support 223 and corresponding two laser interferometer units 223 (again, only one of them is shown) fixedly mounted on certain, stationary parts of the exposure apparatus outside the material support 223. The movable mirrors 225*m* and the laser interferometer units 225 cooperate to measure the two-dimensional position of the material support 223 (and thus of the wafer W). A wafer stage drive system 226 controls the operation of the wafer stage WST based on the measurements supplied form the laser interferometer units 225 and the control information from the main control system 214.

During a scanning projection exposure process, the reticle R is moved in-the +X-direction (or in the −X-direction) by the reticle stage RST at a velocity of VR. In synchronism therewith, the material support 223 (and thus the wafer W) is moved in the −X-direction (or in the +X-direction) by the wafer stage WST at a velocity of β·VR (where β is the chosen demagnification ratio). After the exposure of one shot area, the wafer W is caused to make a step movement to the starting point of the next shot area and the process is repeated, so that sequential exposures of the shot areas on the wafer W are performed with the step-and-scan technique.

For a scanning projection exposure process, it is necessary to bring the surface of the wafer W into a position at which it will be coincident with the image plane defined by the projection optical system PL. In order to achieve this by using an autofocusing technique, there are provided a light-beam-projecting optical system 227 and a light-beam-receiving optical system 228 both below and around the projection optical system PL. The light-beam-projecting optical system 227 obliquely projects a plurality of light beams onto the surface of the wafer W, such that respective slit-images are projected at respective measuring points on the surface of the wafer W. Some of the measuring points fall within the slit-shaped exposure field (which moves on the surface of the wafer W) and the other within the advance field which moves on the surface of the wafer W in advance of the moving exposure field. The light-beam-receiving optical system 228 is disposed in symmetry with the light-beam-projecting optical system 227 with respect to the optical axis AX of the projection optical system PL, and receives the reflected light beams from the surface of the wafer W. In the light-beam-receiving optical system 227, the received light beams again form respective slit-images, from which focus signals are generated which reflects lateral displacements of the slit-images from their reference positions. The focus signals are supplied to both the main control system 214 and the wafer stage drive system 226. The light-beam-projecting optical system 227 and the light-beam-receiving optical system 228 together form an oblique-incidence focus position detection system (referred to as "AF sensor 227, 228" hereinafter.) Any variation in the focus position of the wafer W causes corresponding variation in the lateral displacements of the slit-images, so that the focus position of the wafer W at each of the measuring points may be detected from the corresponding focus signal. The wafer stage drive system 226 controls the position in the Z-direction and tilt angles of the material support 223 such that the measured focus position of the wafer W may be coincident with the image plane whose position is determined in advance through an appropriate technique such as making and analyzing a test print.

A surface shape detection system 230 for sensing the surface shape of the pattern-bearing surface with respect to the flatness and tilt angles thereof is disposed above an area on the reticle R, which area is outside the illumination field on the reticle R to the scanning direction of the illumination field.

Figure 11:
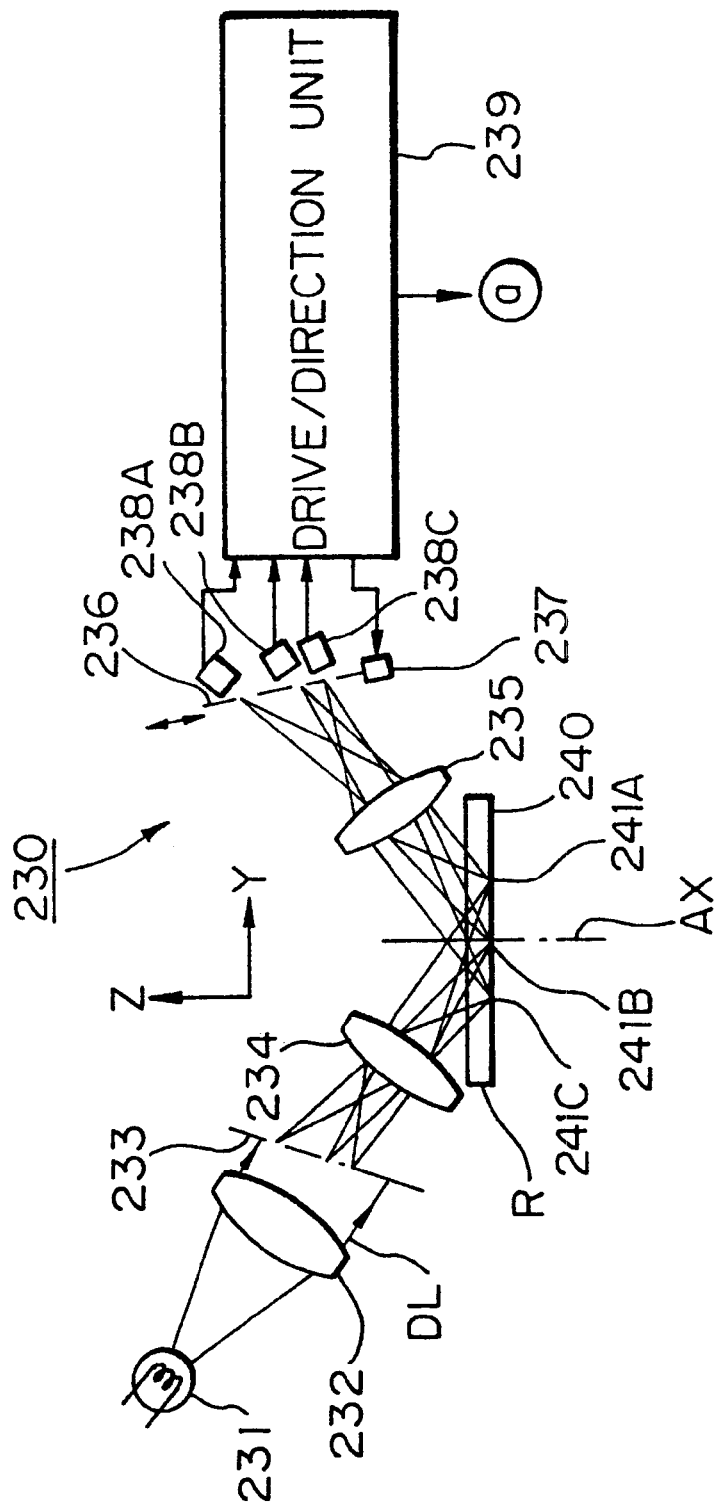
FIG. 11 is a schematic side elevation of a surface shape detection system of FIG. 10.

FIG. 11 is a side elevation of the surface shape detection system 230 of FIG. 10 as viewed in the +X-direction (or the scanning direction). As shown in FIG. 11, a halogen lamp 231 (which may be replaced with a light-emitting diode or a semiconductor laser) emits rays of detection light DL, which pass the collimation lens to illuminate a pattern plate or stencil 233 having-three slits formed therein. The respective images of the three slits are obliquely projected through an objective lens 234 onto the pattern-bearing surface of the reticle R at corresponding measuring points 241A, 241B and 241C lying in a straight line extending in the Y-direction (or the non-scanning direction) on the pattern-bearing surface. The three detection light beams DL as reflected from the measuring points 241A–241C are brought into focus through an objective lens 235 to again form respective slit-images on a vibrating slit plate 236. The vibrating slit plate 236 has three openings formed therein, and each of the slit-images is formed on or around corresponding one of the openings. The vibrating slit plate 236 is driven by a drive motor 237 under control of a drive/detection unit 239 so as to produce continuous linear vibration. That partial beam of each reflected detection light beam DL which passes through the associated opening in the vibration slit plate 236 impinges on the sensitive surface of the associated one of photodetectors 238A, 238B and 238C, which produce detection signals supplied to the drive/detection unit 239.

With this arrangement, any variation in the position in the Z-direction of the pattern-bearing surface of the reticle R at each of the measuring points 241A to 241C will cause a corresponding lateral displacement of the position of the associated slit-image in the vibrating direction on the vibrating slit plate 236. The drive/detection unit 239 utilize drive signals being supplied to the drive motor 237 so as to perform synchronous rectification of the detection signals from the photodetectors 238A to 238C in order to detect the positions in the Z-direction of the pattern-bearing surface at the measuring points 241A to 241C, and the detected positions are supplied to the arithmetic operation unit 213 of FIG. 10. The arithmetic operation unit 213 also receives the XY-coordinates of the position of the reticle stage RST (and thus of the reticle R) as measured by the laser interferometer units 211. The positions in the Z-direction of the pattern-bearing surface at the measuring points 241A to 241C indicate the surface shape of the pattern-bearing surface along a line extending in the non-scanning direction when the reticle R is at the current position in the X-direction indicated by the current X-coordinate.

In this embodiment, the focusing control is so performed as to bring the surface of the wafer W into a position at which it will be coincident with the image plane defined by the projection optical system PL. The position of the image plane (referred to as the "best-focus position") is determined in advance, for example, by making and analyzing a test print of the reference marks formed on the reference surface of the reference plate member 210, when the reticle stage RST is so driven as to move the reference member 210 to an appropriate position within the illumination field defined by the illumination beam IL. More specifically, as a preparatory procedure for the measurement of the surface shape of the pattern-bearing surface of the reticle R, the reference surface of the reference member 210 is moved to an appropriate position within the measuring field of the surface shape detection system 30, and the positions in the Z-direction of the reference surface at the measuring points 241A, 241B and 241C, designated by $ZA_o$, $ZB_o$ and $ZC_o$, are measured and stored in a storage 213a.

During the measurement of the surface shape of the pattern-bearing surface of the reticle R, the reticle R is driven by the reticle stage RST to repeat a step movement of a predetermined distance in the X-direction. Each time a step movement has been made, the position in the Z-direction of the pattern-bearing surface at the three measuring points 241A, 241B and 241C, designated by $ZA_x$, $ZB_x$ and $ZC_x$, are detected or measured by the surface shape detection system 230. Then, the arithmetic operation unit 213 makes subtraction of the positions in the Z-direction of the reference surface of the reference plate member 210, designated by $ZA_o$, $ZB_o$ and $ZC_o$, from the corresponding positions in the Z-direction of the pattern-bearing surface at the measuring points 241A to 141C, designated by $ZA_x$, $ZB_x$ and $ZC_x$, so as to derive corresponding displacements $DZA_x$, $DZB_x$ and $DZC_x$ and stores them in the storage 213a in association with the corresponding X-coordinate of the reticle R. In this manner, the data representing the two-dimensional distribution of the Z-direction displacement the pattern-bearing surface of the reticle R from the reference plane, and thus the surface-shape of the pattern-bearing surface, is stored in the storage 213a.

Thereafter, the arithmetic operation unit 213 uses the data representing the surface-shape of the pattern-bearing surface of the reticle R and stored in the storage 213a to calculate the expected lateral displacements in the Y-direction (or the non-scanning direction) of the features of the pattern on the pattern-bearing surface of the reticle R, uses these lateral displacements to derived the expected lateral displacements of the projected images of the features on the wafer W, and supplies the data representing the expected lateral displacements of the projected images of the features on the wafer W to the main control system 214. The main control system 214 has already acquired data representing the distortion produced by the combination of the projection optical system PL and a test reticle specifically designed for distortion measurement and having distortion evaluation patterns formed thereon, which may be for example grid patterns. This data may be obtained by making a test print using the test reticle, measuring the positions of the projected images of the distortion evaluation patterns by analyzing the test print, and comparing the measured positions with the corresponding desired positions. The data (distortion data) thus acquired is stored in an internal memory of the main control system 214.

When the above-mentioned data representing the expected lateral displacements of the projected images on the wafer is supplied to the main control system 214, it compensates the distortion data stored in the internal-memory with the supplied data so as to generate updated distortion data which represents the distortion contributed solely by the projection optical system PL, and overwrite the internal memory with the updated distortion data. Further, each time a new reticle for actual exposure process is placed and held on the reticle stage RST, the surface shape of that reticle is measured by the surface shape detection system 230, and then the expected lateral displacements of the projected images which are expected to be produced by the measured surface shape (i.e., the expected variation in the distortion) are calculated prior to the exposure process performed using that reticle. Then, during the scanning projection exposure process, the main control system 214 calculates the expected total distortion by summing the distortion contributed solely by the projection optical system PL and the expected lateral displacements of the projected images to be caused by the surface shape of that reticle, and controls the actuation amounts of actuator elements 208, 217 and 220 through the image formation characteristics control unit 215 so as to cancel out the expected total distortion. These actuation amounts of the actuator elements may vary during an exposure operation of one shot area depending on the current X-coordinate of the moving reticle. In this manner, the distortion contributed solely by the projection optical system PL may be evaluated with precision even when the test reticle used has a poor surface-flatness. Further, any variation in the distortion which may be caused by the surface shape of a reticle used for the exposure process can be corrected during the exposure process, so that the resultant projected image of the pattern transferred onto each shot area on a wafer can be free from any distortion. Accordingly, when overlay exposures are made, the overlay errors may be minimized.

Alternatively, in a case where the projection optical system PL used has been highly corrected for and thus free from any distortion, the image formation characteristics of the projection optical system PL may be controlled such that only the expected lateral displacements of the projected images to be caused by the surface shape of the reticle R may be eliminated. In this manner, any distortion of the transferred pattern may be minimized even when the pattern-bearing surface of the reticle R has a poor surface-flatness.

Next, we will specifically describe the relationship between the surface shape of the pattern-bearing surface of the reticle R and the expected lateral displacements of the projected images of the features of the pattern caused by the surface shape.

Figure 12:
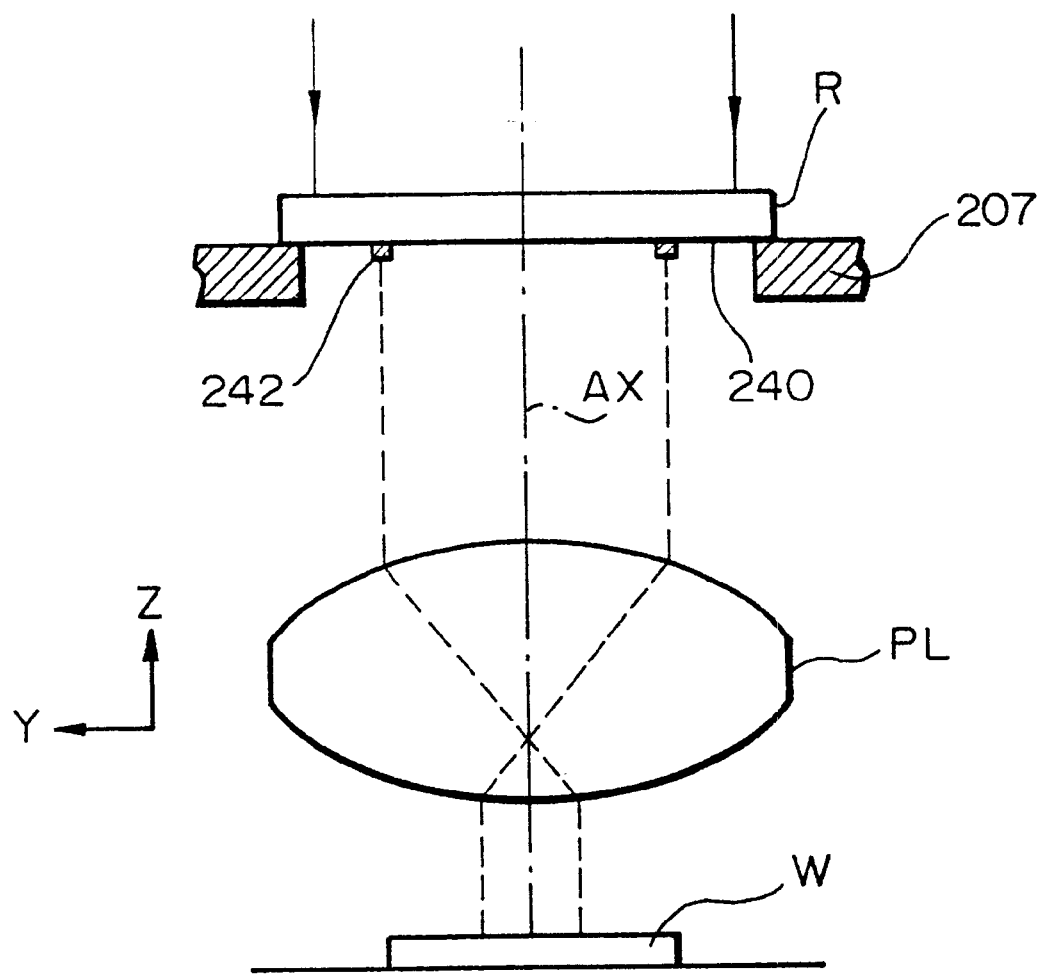
FIG. 12 is a schematic side elevation of a reticle R, a projection optical system PL and a wafer W of FIG. 10.

FIG. 12 shows a schematic representation of the reticle R, the projection optical system PL and the wafer W as viewed in the scanning direction (or the X-direction) in the projection exposure apparatus of FIG. 10. As shown in FIG. 12, the reticle R held on the reticle holder 207 has a pattern-bearing surface 240 on which a pattern 242 (such as a distortion evaluation pattern) formed thereon, and the image of the pattern 242 is projected through the projection optical system PL onto the wafer W. Assuming that the projection optical system PL is free from any distortion, the image of the pattern 242 should be projected onto the wafer W at the desired position (or designed position). In such a case, the contact surfaces of the reticle holder 207 in contact with the reticle R lie in a plane perpendicular to the optical axis AX of the projection optical system PL, and will not suffer from any deformation, and the pattern-bearing surface of the reticle R is maintained to be completely flat.

Figure 13A:
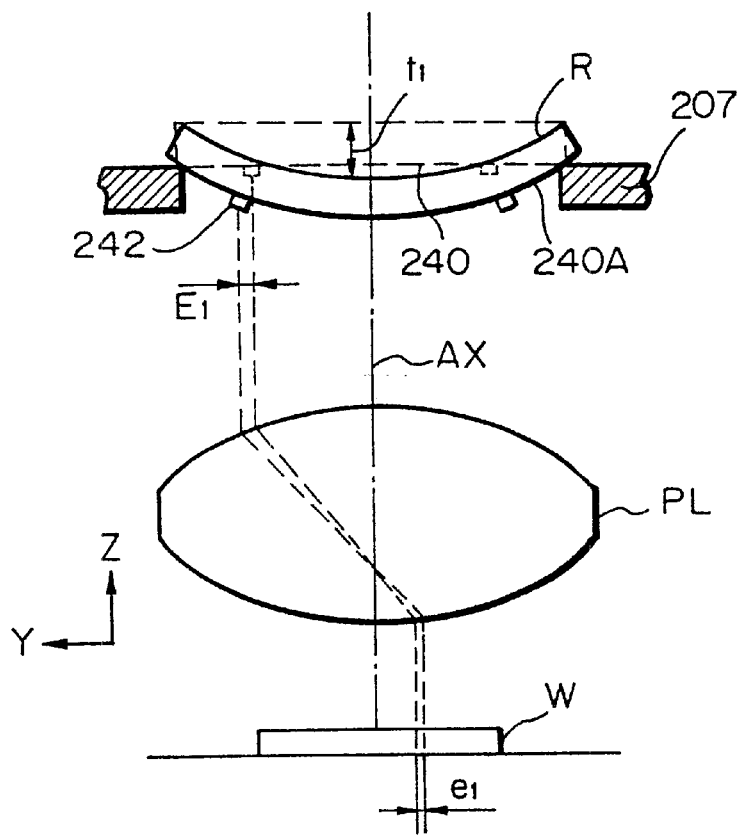
FIG. 13(A) shows a reticle R suffering a deflection contributed by the gravity and FIG. 13(B) is a chart illustrating how to calculate the lateral displacement of a feature of the pattern on the reticle of FIG. 13(A)

Nevertheless, it is possible that the reticle R may be deflected, as shown in FIG. 13(A), such that its central portion is displaced down toward the projection optical system PL by the gravity since the reticle R is held on the reticle holder 207 with the peripheral edges of the reticle R supported by and secured to the reticle holder 207 by vacuum suction. In FIG. 13(A), the pattern-bearing surface 240A of the reticle R as deflected by the gravity shows a displacement $t_1$ at its central portion, from the flat pattern-bearing surface 240 indicated by broken lines, down toward the projection optical system PL. Due to the displacement $t_1$ produced by the gravity, the position of a feature 242 of the pattern on the pattern bearing-surface 240A is laterally displaced farther off the optical axis AX (i.e., in the +Y-direction in this case) by a distance $E_1$ as compared with that for a completely flat pattern-bearing surface 240A.

Figure 13B:
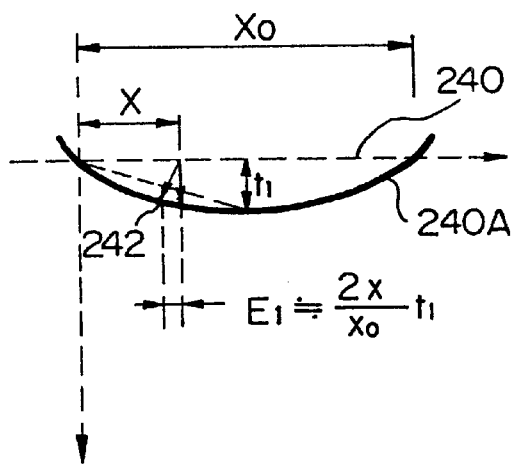

There are various methods of calculating such a lateral displacement, among which one method is shown by way of example in FIG. 13(B), which is a more simplified schematic representation of the patten-bearing surface 240A of the reticle R with the displacement $t_1$ shown in FIG. 13(A). As seen from the geometrical indication shown in this figure, the lateral displacement $E_1$ may be approximated as $$E_1 \approx (2x/x_0)t_1 \quad (1)$$

where:

$x_0$ stands for the span of the pattern-bearing surface 240A taken in the Y-direction between the inner supporting edges of the reticle holder; and x stands for the distance taken in the Y-direction between the feature 242 and the proximal supporting edge of the reticle holder.

The lateral displacement $E_1$ of the feature 242 of the pattern on the reticle R causes the corresponding lateral displacement $e_1$ of the projected image of the feature 242 on the wafer W, as shown in FIG. 13(A). This lateral displacement $e_2$ is expressed using the demagnification ratio b of the projection optical system PL as $$e_1 = \beta \cdot E_1 \quad (2)$$

When the distortion of the projection optical system PL is measured by calculation from the position of the projected image of the feature 242 on the wafer W, the lateral displacement $e_1$ of the projected image has to taken into consideration because the lateral displacement $e_1$ could otherwise produce the corresponding error in the calculated or measured distortion. That is, the measured distortion could otherwise contain the error due to the defection of the reticle R.

Figure 14A:
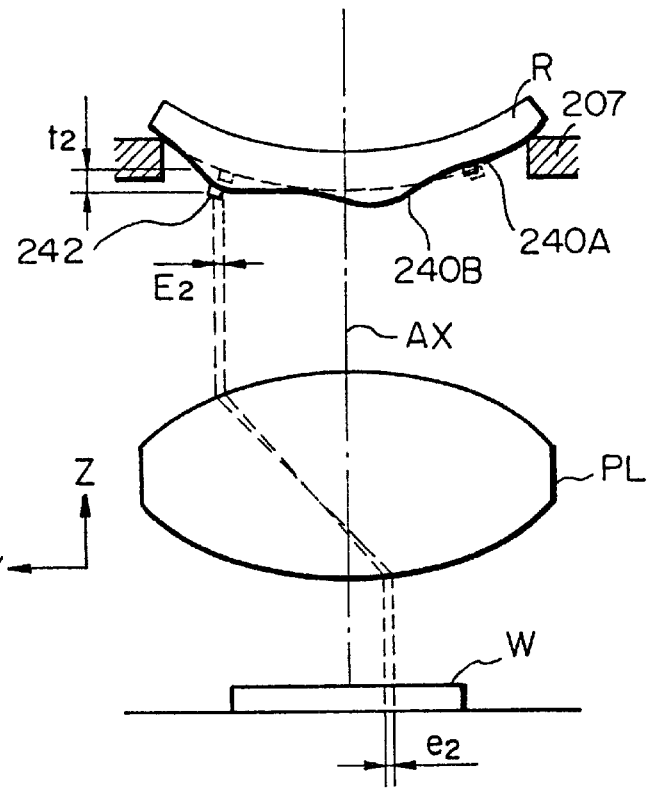
FIG. 14(A) shows a reticle having irregularities in its pattern-bearing surface.
Figure 14B:
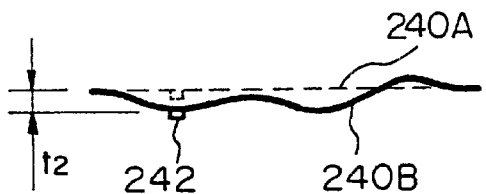
FIG. 14(B) shows the reticle R having no deflection and FIG. 14(C) is a chart illustrating how to calculate the lateral displacement of a feature of the pattern on,the reticle of FIG. 14(A)
Figure 14C:
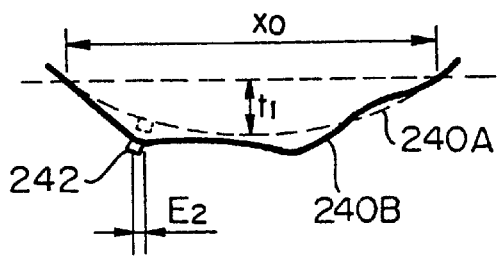

In addition, as shown in FIG. 14(A), the pattern-bearing surface 240B of an actual reticle R may possibly have some irregularities of a limited magnitude $t_2$, which makes the pattern-bearing surface 240B not in accord with the expected curve which could be achieved if a completely flat pattern-bearing surface is deflected by the gravity as shown by the broken line 240A. Such irregularities $t_2$ also produce corresponding lateral displacements of the features 242 of the pattern on the reticle. Specifically, if that part of the pattern-bearing surface 240 which is around the feature 242 expands down by $t_2$ in the direction of the optical axis when the pattern-bearing surface 240 assumes no deflection by the gravity, as shown in FIG. 14(B), then the downward deflection of the surface 240 by the gravity enhances the expansion of that part of the pattern-bearing surface 240, so that the feature 242 on the surface 240 is displaced leftward (as viewed in FIG. 14(C)) by $E_2$.

While there may be various methods of determining such a lateral displacement $E_2$, it may be determined from a simple geometrical approximation as $$E_2 \approx t_2 \cdot \sin(2t_1/x_0) \quad (3)$$
$$\approx 2t_1 \cdot t_2/x_0$$

The lateral displacement $E_2$ of the feature 242 of the pattern on the reticle R also causes the corresponding lateral displacement $e_2$ of the projected image of the feature 242 on the wafer W, as shown in FIG. 14(A). This lateral displacement $e_2$ is expressed using the demagnification ratio b of the projection optical system PL as $$e_2 = \beta \cdot E_2 \quad (4)$$

When the distortion of the projection optical system PL is measured by calculation from the position of the projected image of the feature 242 on the wafer W, the lateral displacement $e_2$ of the projected image has to taken into consideration because the lateral displacement $e_2$ could otherwise produce the corresponding error in the calculated or measured distortion. That is, the measured distortion could otherwise contain the error due to the irregularities in flatness of the reticle R.

Figure 15A:
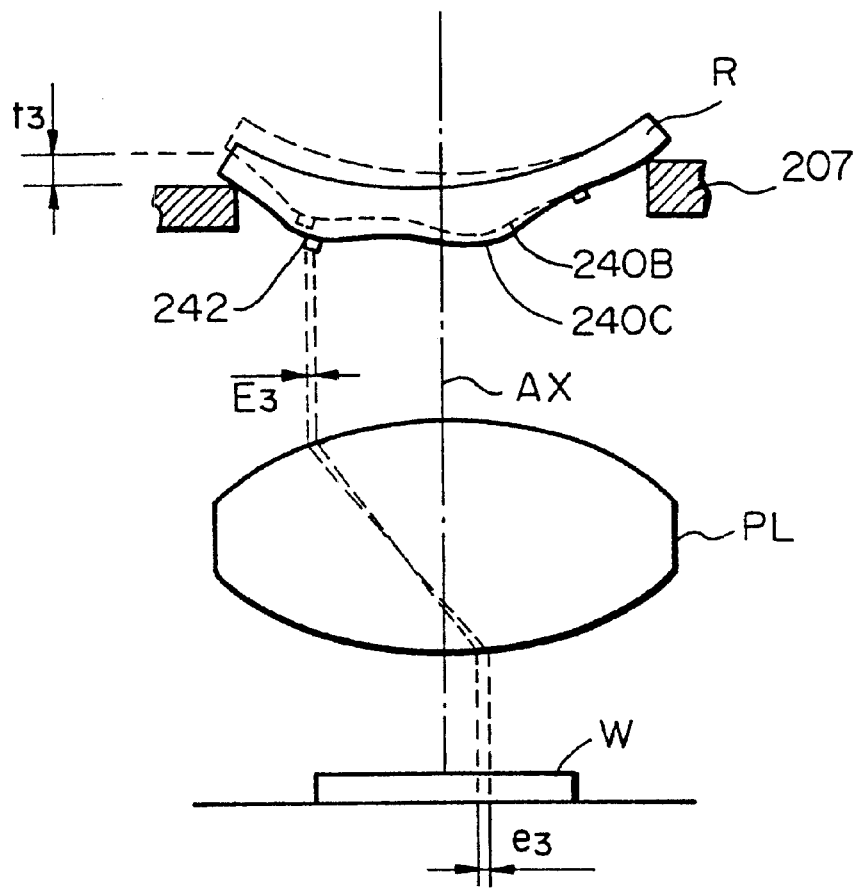
FIG. 15(A) shows a reticle tilted by the irregularities in the surface of the reticle holder and FIG. 15(B) is a chart illustrating how to calculate the lateral displacement of a feature of the pattern on the reticle of FIG. 15(A)

Moreover, as shown in FIG. 15(A), the contact surface of an actual reticle holder 207 to the reticle R may possibly have some irregularities resulting in a difference in level of a limited magnitude $t_2$, which makes the pattern-bearing surface 240B not perpendicular to the optical axis AS of the projection optical system PL. Such irregularities $t_3$ in the contact surface of the reticle holder 207 causes the pattern-bearing surface of the reticle R to displace from the desired position indicated by the broken lines 240B into the position indicated by the solid lines 240C, so that the pattern-bearing is caused to tilt to produce the lateral displacement of the pattern 242 of the pattern on the pattern-bering surface 240C from that expected when it shows no tilt. Specifically, when the left-hand edge (as viewed in FIG. 15(A)) of the contact surface of the reticle holder 207 is lower than the right-hand edge as shown in FIG. 15(A), the feature 242 of the pattern on the-pattern-bearing surface 240 of the reticle R is caused to laterally displaced toward the optical axis AX by $E_3$.

Figure 15B:
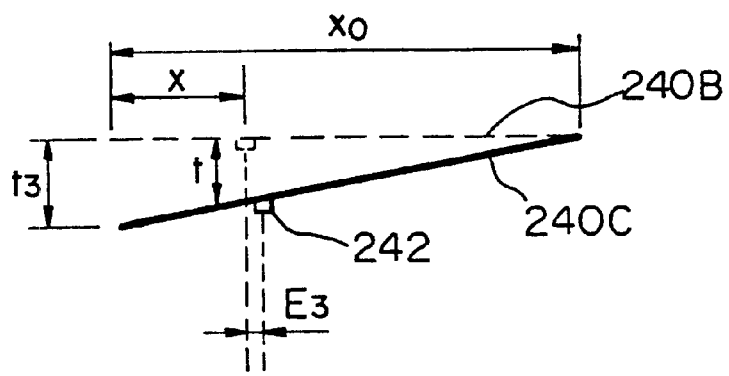

Again, there may be various methods of determining such a lateral displacement $E_3$. Here, assuming that the pattern-bearing surface 240B is completely flat, has a span of $x_0$ between the inner supporting edges of the reticle holder, and has its left-hand edge lower than its right-hand edge by $t_3$, as shown in FIG. 15(B). Using x for the distance of the feature 242 of the pattern on the pattern-bearing surface 240 from the left-hand edge thereof and t for the downward displacement of the feature 242 on the pattern-bearing surface 240C from an imaginary pattern-bearing surface 240B, the lateral displacement $E_3$ is expressed as $$E_3 \approx t(t_3/x_0) \quad (5)$$
$$\approx (x_0 - x)(t_3/x_0)^2$$

The lateral displacement $E_3$ of the feature 242 of the pattern on the reticle R also causes the corresponding lateral displacement $e_3$ of the projected image of the feature 242 on the wafer W, as shown in FIG. 15(A). This lateral displacement $e_3$ is expressed using the demagnification ratio b of the projection optical system PL as $$e_3 = \beta \cdot E_3 \quad (6)$$

When the distortion of the projection optical system PL is measured by calculation from the position of the projected image of the feature 242 on the wafer W, the lateral displacement $e_3$ of the projected image has to taken into consideration because the lateral displacement $e_3$ could otherwise produce the corresponding error in the calculated or measured distortion. That is, the measured distortion could otherwise contain the error due to the tilt of the reticle R.

In addition to the irregularities $t_3$ in the contact surface of the reticle holder 207 in contact to the pattern-bearing surface of the reticle R, the irregularities in the pattern-bearing surface of the reticle R in contact to the contact surface of the reticle holder 207 is also one of significant factors in the occurrence of the tilt of the pattern-bearing surface of the reticle R. This is important because the a reticle often has much poorer flatness in its peripheral area (at which it is in contact with the reticle holder) than in its central, illumination area. Thus, the exact difference in level between the edges of the reticle R equals the sum of the irregularities $t_3$ in the contact surface of the reticle holder 207 and the irregularities of the pattern-bearing surface of the reticle R in contact with the contact surface of the reticle holder 207.

In the above description, 1) the deflection of the reticle R by the gravity, 2) the irregularity in the pattern-bearing surface of the reticle R, and 3) the irregularities in the contact surface of the reticle holder 207 in contact with the pattern-bearing surface of the reticle R are described together with the resultant deformation of the pattern-bearing surface of the reticle R and lateral displacements of the features of the pattern on the pattern-bearing surface. In some cases, one of these three major factors in distortion may have much greater contribution than the other two. In other cases, two may have greater contributions than the third. In further cases, each of the three may have relatively small contributions but their contributions are cumulative so that the resultant lateral displacements of the features of the pattern is relatively great. Under the circumstances, it is possibly desirable to select one or two may be selected among the three factors and be taken into consideration for making adjustment to the projection optical system PL for correction of the distortion which could otherwise occur.

For example, assuming that all the three factors have to be taken into consideration, the lateral displacement e of the projected image of the feature 242 (see FIGS. 13 to 15) on the wafer W is expressed using the lateral displacements $E_1$, $E_2$ and $E_3$ shown in equations (1), (3) and (5) above as $$e=\beta(E_1+E_2+E_3) \quad (7)$$

As described, the surface shape detection system 230 used in this embodiment detects the positions in the Z-direction of the pattern-bearing surface of the reticle R at the three measuring points 241A–241C arranged in a line extending in the non-scanning direction on the pattern-bearing surface, as shown in FIG. 11. In this arrangement, the set of displacements at three measuring point of the pattern-bearing surface of the reticle R are sufficient to detect the surface-shape of the reticle R with precision if the reticle R is subject only to the deflection by the gravity (as shown in FIG. 13(A)) and/or tilt caused by the irregularities in the contact surface of the reticle holder 207 in contact with the reticle R (as shown in FIG. 15(A)). Thus, the set of displacements may be used to derive the lateral displacements $E_1$ and $E_3$ of the feature of the pattern on the pattern-bearing surface (by using equations (1) and (5) above), and thus the errors in distortion produced by the projection optical system PL with precision.

In contrast, if the reticle R suffers from complicated irregularities in its pattern-bering surface as shown in FIG. 14(A), the displacements (or the positions in the Z-direction) measured at the three measuring points may be insufficient. In such a case, it is desirable to modify the surface shape detection system 230 such that it may detect the positions in the Z-direction of the pattern-bearing surface of the reticle R at four or more (and thus more densely distributed) measuring points arranged in a line extending in the non-scanning direction on the pattern-bearing surface, if the irregularities in the pattern-bearing surface should be detected with precision. Then, the detected irregularities in the pattern-bearing surface may be used to derive the lateral displacement $E_3$ of the feature of the pattern on the pattern-bearing surface (by using equation (3) above) as well as thus the error in the distortion which is expected to be produced by the lateral displacement $E_3$.

Then, the pattern-bearing surface of the reticle R is divided by a two-dimensional grid into a matrix of sub-areas. We use designation D(i, j) for that value of the distortion produced by the projection optical system PL which is determined by the position of the projected image of the evaluation pattern lying within a particular sub-area that occupies i-th position in the X-direction (i=1, 2, . . . ) and j-th position in the Y-direction (j=1, 2, . . . ) in the matrix. The main control system 214 of FIG. 10 uses the lateral displacement e of the projected image finally derived by equation (7) to adjust the distortion according to the following equation $$D'(i, j)=D(i, j)-e \quad (8)$$

Then, the adjusted distortion D'(i, j) is stored in the internal memory of the main control system 214.

In FIGS. 13 to 15, one-dimensional lateral displacement of the feature of the pattern on the pattern-bearing surface of the reticle R is shown. However, in this embodiment, the reticle R is held on the reticle holder 207 at four points by vacuum suction. Thus, the deflection of the reticle R by the gravity will actually cause the pattern-bearing surface to deform into a nearly spherical surface shape, so that the feature of the pattern on the pattern-bearing surface produces a two-dimensional lateral displacement in the X- and Y-directions. Therefore, in order to derive the lateral displacements of the projected images due to the deformation of the pattern-bearing surface of the reticle R more accurately, it is desirable that two-dimensional lateral displacements of the features of the pattern on the pattern-bearing surface are derived from the surface-shape of the pattern-bearing surface and the values of the distortion may be adjusted with respect to both the X- and Y-directions.

As described above, this embodiment uses the surface shape detection-system 230 for measuring the surface shape of the pattern-bearing surface of the reticle R, in which the detection system 230 is disposed above and around the illumination field on the reticle R and directed to project the detection beams onto the top surface of the reticle R in the scanning direction. Instead of such detection system 230, this embodiment may also use a surface shape detection system for the same purpose which is, however, disposed below the bottom surface of the reticle R and directed to project the detection beams onto the bottom surface of the reticle R.

Further, while this embodiment uses the surface shape detection system 230 for measuring the surface shape of the pattern-bearing surface of the reticle R, the surface shape of the pattern-bearing surface may be estimated (by calculation) from the irregularities and/or tilt angles of the contact surface of the reticle holder 207 in contact to the reticle, or from the irregularities in the area of the reticle R which is in contact to the contact surface of the reticle holder 207.

Figure 16:
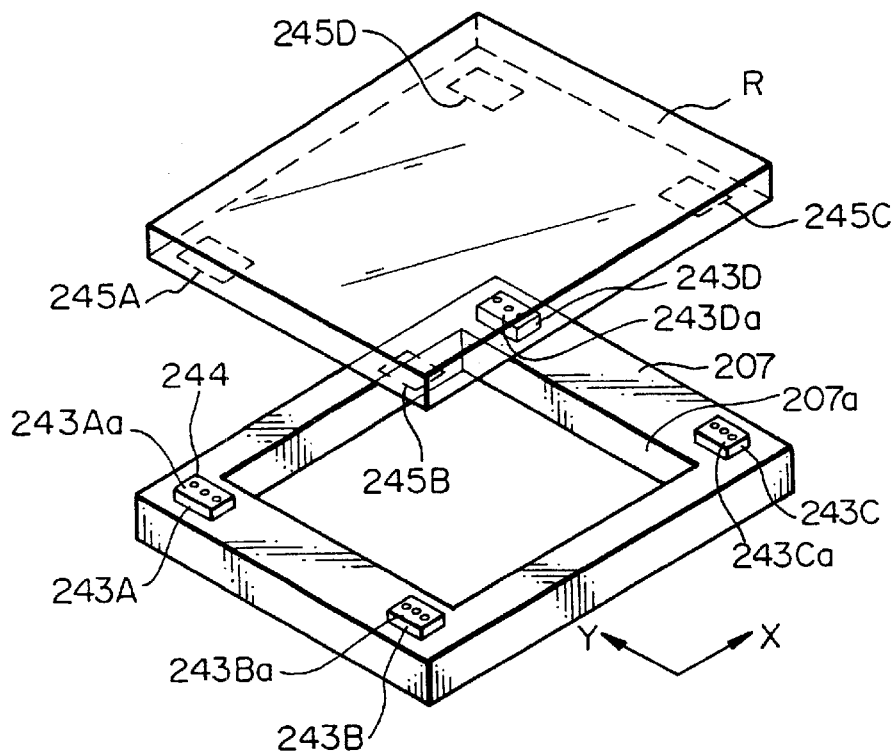
FIG. 16 is a perspective view of the reticle holder and the reticle showing their contact surfaces.

FIG. 16 shows the relationship between the reticle holder 207 of FIG. 10 and the reticle R to be held thereon. As shown. the reticle holder 207 is formed as a rectangular frame made of an appropriate metal material defining a rectangular opening 207a to allow the exposure light beam to pass through it. The reticle holder 207 has four upright protrusions 243A to 234D, one formed at each corner of the rectangular frame. The reticle holder 207 further has a portion for supporting the reference member 210 which is, however, omitted from FIG. 16 for simplicity. The upright protrusions 243A to 243D have their end (top) surfaces finished to be highly flat and smooth, so as to define contact surfaces 243Aa to 243Da, respectively. The contact surfaces 243Aa to 243Da are surfaces to be in contact to the reticle R and have suction holes 244, respectively, for holding the reticle R by vacuum suction. The areas on the pattern-bearing surface of the reticle R ta which the reticle R is in contact to the contact surfaces 243Aa to 243Da, respectively are called contact areas 245A to 245D. The contact surfaces 243Aa to 243Da are measured in advance for their average tilt angles and surface shapes including any step portions. If it is expected that the contact areas 245A to 245D of the pattern-bearing surface of the reticle R have relatively poor flatness, the contact areas 245A to 245D are measured in advance for their average tilt angles and surface shapes including any irregularities. These measurements may be performed, for example, by using a point-contact-type level gauge (such as a dial gauge).

The measurement data representing the measurements relating to the surface shape of the contact surfaces and contact areas is stored in the storage 213 of FIG. 10. The arithmetic operation unit 213 reads out the measurement data and used the data to calculate (or estimate) the surface shape of the pattern-bearing surface of the reticle R which is expected to appear when the reticle R is held on the protrusions 243A to 243D of the reticle holder 207 by vacuum suction. An example of such estimation is described below, in which the pattern-bearing surface of the reticle R is completely flat and the contact surfaces 243Aa to 243Da of the protrusions 243A to 243D of the reticle holder 207 are inclined inward.

Figure 17A:
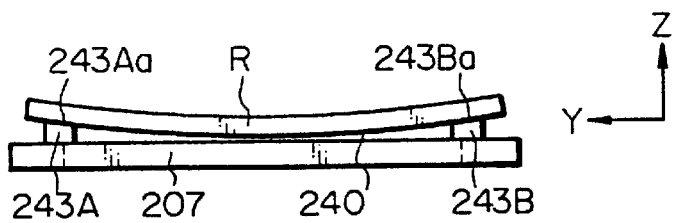
FIGS. 17(A), 17(B) and 17(C) are side elevations illustrating how a reticle is deflected by the irregularities in the surfaces of a reticle holder and the reticle.

FIG. 17(A) is a side elevation of the arrangement of FIG. 16 as viewed in the X-direction (or the scanning direction). In FIG. 17(A), two of the four protrusions, 243A and 243B, are shown symmetrically and having their contact surfaces 243Aa and 243Ba inclined inward. When the reticle R, which is completely flat at rest, is held onto the contact surfaces 243Aa and 243Ba by vacuum suction, its pattern-bearing surface 240 is deflected downward, and this deflection is contributed by the gravity and the inward inclination of the contact surfaces 243Aa and 243Ba. The magnitude of this deflection may be roughly obtained by summing 1) the tilt angle of the contact surfaces 243Aa and 243Ba multiplied by the distance from either contact surface to the center of the reticle R and 2) the expected deflection which is contributed by only the gravity, as represented by stored data corresponding to that reticle R.

Figure 17B:
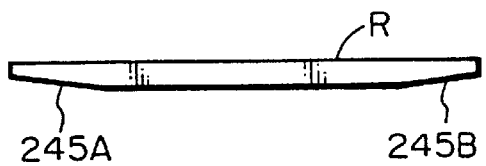
Figure 17C:
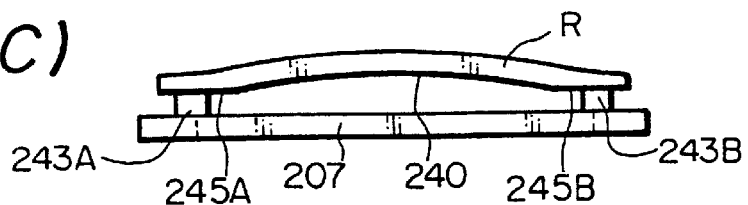

Another example of the estimation of the surface shape of the pattern-bearing surface is illustrated below with reference to FIGS. 17(B) and 17(C), in which the contact surfaces 243Aa to 243Da of the protrusions 243A to 243D on the reticle holder 207 are completely flat and level, while the contact areas 245A to 245D of the reticle R have their surface inclined outward. In FIG. 17(B), the surfaces of the contact areas 245A and 245B are shown at left and right ends of the pattern-bearing surface and inclined outward. When the reticle R is held at the surfaces of the contact areas 245A and 245B onto the contact surfaces 243Aa and 243Ba of the protrusions 243A and 243B on the reticle holder 207 by vacuum suction, the pattern-bearing surface 240 of the reticle R is deflected upward. The magnitude of this deflection may be roughly obtained by subtracting 1) the expected deflection which is contributed by only the gravity, as represented by stored data corresponding to that reticle R form 2) the tilt angle of the surfaces of the contact areas 45A and 245B multiplied by the distance from either contact area to the center of the reticle R.

With the magnitude of the deflection (and thus the surface shape) of the pattern-bearing surface of the reticle R having been roughly obtained in this manner, the lateral displacements of the features of the pattern on the pattern-bearing can be obtained in the way as described above with reference to FIGS. 13 to 15, and the result is used to adjust the distortion produced by the projection optical system PL.

It should be understood that embodiments of the present invention for achieving the above-mentioned second object are not limited to those disclosed above but may be embodied in various other forms and arrangements without departing the spirit of the present invention.

In a projection exposure method according to the present invention for achieving the above-mentioned second object, the surface shape of the pattern-bearing surface of a mask is measured and stored, and then the expected lateral displacements of the features of the projected pattern image which are expected to be produced by the surface shape are calculated. Then, the measurements of the distortion of the projection optical system are adjusted with the expected lateral displacements so as to derive with precision the distortion to be produced solely by the projection optical system. In the actual exposure process, an exposure is made while the positions of the features of the projected pattern image are partially corrected such that the distortion may be corrected. By virtue of this, the distortion of the projected image of the pattern may be corrected with great accuracy. As the result, excellent image formation characteristics may be advantageously enjoyed even if the mask has a poor flatness.

In another projection exposure method according to the present invention for achieving the above-mentioned second object, any irregularities in the contact surface of a mask and/or in the contact surface of a support member for supporting the mask are measured and stored, and then the expected surface shape of a pattern-bearing surface of the mask which is expected to occur when the mask is secured onto the support member by vacuum suction is derived from the measured irregularities. Then, the expected lateral displacements of the features of the projected pattern image which are expected to be produced by the surface shape are calculated, and the measurements of the distortion of the projection optical system are adjusted with the expected lateral displacements. Then, an exposure is made while the positions of the features of the projected pattern image are partially corrected such that the distortion may be corrected. By virtue of this, the distortion of the projected pattern image may be corrected with great accuracy. As the result, excellent image formation characteristics may be advantageously enjoyed even if the mask has a poor flatness.

With a projection exposure apparatus according to the present invention for achieving the above-mentioned second object, the projection exposure methods described above may be conveniently performed.

Next, we will describe an embodiment of the present invention for achieving the above-mentioned third object with reference to accompanying drawings. This embodiment shows exemplified application of the present invention to a projection exposure apparatus called a step-and-scan projection aligner.

Figure 18:
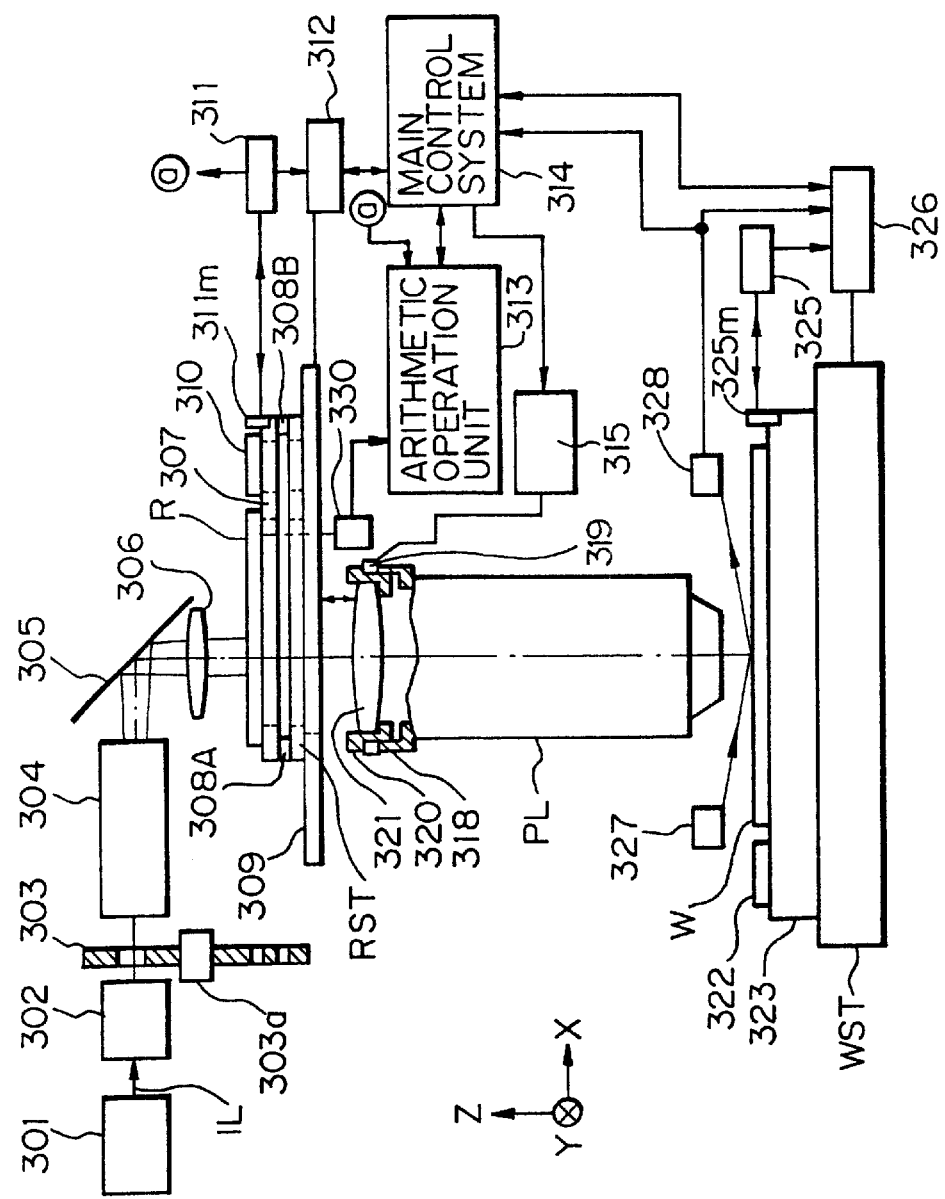
FIG. 18 is a schematic representation, partially broken away, of a projection exposure apparatus used with a further embodiment of the present invention for achieving the above-mentioned third object.

FIG. 18 shows a projection exposure apparatus according to this embodiment. As shown, an exposure light source 301 emits an illumination light beam IL for exposure. The light beam IL enters a beam-shaping optical system 302 comprising a relay optical system and a fly's eye lens for establishing a uniform illuminance distribution. The illumination light beam IL may comprise light of i-line in the line spectrum of a mercury lamp (having wavelength of 365 nm), light output from a KrF excimer laser (having wavelength of 248 nm), light output from an ArF excimer laser (having wavelength of 193 nm) or light of one of possible harmonics of a YAG laser output. The beam-shaping optical system 302 has a beam-exiting surface which is coincident with a plane of a pupil for the plane of a reticle (or mask) with respect to the optical system intervening therebetween. In front of the beam-exiting surface, there is provided a turret plate 303 having a plurality of different aperture stops formed therein for varying the illumination condition to the reticle. These aperture stops are formed in the peripheral portion of the turret plate 303 and include: fixed circular stops, a variable circular stop capable of varying the coherence factor (σ-value) of the illumination optical system, an annular aperture stop for annular illumination, and a divided (quartered) aperture stop for modified illumination. The turret plate 303 is driven for rotation by means of a drive motor 303a so that a desired aperture stop may be selected from among them.

The illumination beam IL, having passed through the selected one of the aperture stops in the turret plate 303, then passes through an optical system 304 including a filed stop (or reticle blind), an optical-pass-bending mirror 305 and then a condensor lens 306, and illuminates the pattern-bearing surface (bottom surface) of the reticle R within a slit-shaped illumination field defined thereon. The image of that part of the pattern of the reticle R which is confined within the illumination field is projected through a both-side-telecentric projection optical system PL onto a photoresist-coated wafer W within a slit-shaped exposure filed, with a chosen demagnification ratio β (β is, say, 1/4 or 1/5.) In the following description, any directions are specified with respect to a three-dimensional, orthogonal coordinate system defined by X-, Y- and Z-axes, in which the Z-axis is parallel to the optical axis AX of the projection optical system PL, the X-axis is parallel to the "scanning direction" in which the reticle R and the wafer W are moved for scanning in the scanning projection process (i.e., the direction parallel to the drawing sheet surface of FIG. 18) and the Y-axis is parallel to the "non-scanning direction" perpendicular to the scanning direction (i.e., the direction perpendicular to the drawing sheet surface of FIG. 18).

The reticle R is supported by and held on a reticle holder 307 at four points by vacuum suction, for example. The reticle holder 307 has a pair of parallel ribs 308A and 308B attached on the bottom surface thereof providing the reticle holder 307 with a sufficient rigidity for high speed movement. The ribs 308A and 308B are fixedly mounted on a reticle stage RST. The reticle stage RST is carried on a reticle base 309 and arranged to be driven by a linear motor (not shown) for continuous linear movement in the X-direction as well as to be driven for minute corrective movement in the X-direction, the Y-direction and the rotational direction. There are provided two movable mirrors 311m (only one of them is shown) fixedly mounted on the top surface of the reticle holder 307 and corresponding two laser interferometer units 311 (again, only one of them is shown) fixedly mounted on certain, stationary parts of the exposure apparatus outside the reticle holder 307. The movable mirrors 211m and the laser interferometer units 311 cooperate to measure the two-dimensional position of the reticle holder 307 (and thus of the reticle R). A main control system 314 serves to provide general control of the entire exposure apparatus. A reticle stage drive system 312 serves to control the operation of the reticle stage RST based on the measurements supplied form the laser interferometer units 311 and the control information from the main control system 314.

A reference plate member 310 made from a glass plate is mounted on the reticle stage RST at a position adjacent to that of four peripheral edges of the reticle R which faces to the +X-direction. The reference plate member 310 has a highly flat bottom surface (referred to as "reference surface" hereinafter.) The reference surface of the reference plate member 310 is nominally level with the pattern-bearing surface of the reticle R and has a size substantially the same as the slit-shaped illumination field defined on the reticle R. The reference surface has evaluation marks formed thereon which are used to measure the image formation characteristics of the projection optical system PL, such as the distortion and the position of the image plane produced and defined by the projection optical system PL.

FIG. 20(A) is a plan view of the reference plate member 310. As shown, the reference surface (bottom surface) of the reference plate member 310 has "+"-shaped evaluation marks $FRM_{1,1}, \ldots, FRM_{1,5}, FRM_{2,1}, \ldots, FRM_{2,5}$ formed thereon and arranged in two rows extending in the X-direction. Each evaluation mark may be any of various two-dimensional marks; for example, it may comprises a pair of line-and-space patterns with their sets of lines extending in the directions orthogonal to each other. Further, the arrangement of the evaluation marks may be any of various arrangements in which the evaluation marks are distributed over the entire reference surface. In this embodiment, the reference plate member 30 is used such that the image formation characteristics may be evaluated in a efficient manner without the need for replacement of the reticle R used for actual exposure process with a test reticle. In particular, in this embodiment, the reference surface of the reference plate member 310 is used for calibrating a detection system for measuring the surface shape of the pattern-bearing surface of the reticle R as described below.

Referring again to FIG. 18, a wafer W is held by vacuum suction onto a wafer holder (not shown), which is fixedly mounted on a material support 323, which is in turn fixedly mounted on a wafer stage WST. The material support 323 serves to control the focus position of the wafer W (or the position of the surface of the wafer W in the Z-direction) and the tilt angles of the wafer W. The wafer stage WST serves to provide continuous linear movement of the material support 323 in the X-direction by means of a linear motor as well as provide step movement of the material support 323 in the X- and Y-directions. The wafer stage WST may comprise linear motors for these purposes. There are provided two movable mirrors 325m (only one of them is shown) fixedly mounted on the top surface of the material support 323 and corresponding two laser interferometer units 323 (again, only one of them is shown) fixedly mounted on certain, stationary parts of the exposure apparatus outside the material support 323. The movable mirrors 325m and the laser interferometer units 325 cooperate to measure the two-dimensional position of the material support 323 (and thus of the wafer W). A wafer stage drive system 326 controls the operation of the wafer stage WST based on the measurements supplied form the laser interferometer units 325 and the control information from the main control system 314.

During a scanning projection exposure process, the reticle R is moved in the +X-direction (or in the −X-direction) by the reticle stage RST at a velocity of VR. In synchronism therewith, the material support 323 (and thus the wafer W) is moved in the −X-direction (or in the +X-direction) by the wafer stage WST at a velocity of β·VR (where β is the chosen demagnification ratio). After the exposure of one shot area, the wafer W is caused to make a step movement to the starting point of the next shot area and the process is repeated, so that sequential exposures of the shot areas on the wafer W are performed with the step-and-scan technique.

For a scanning projection exposure process, it is necessary to bring the surface of the wafer W into a position at which it will be coincident with the image plane defined by the projection optical system PL. In order to achieve this by using an autofocusing technique, there are provided a light-beam-projecting optical system 327 and a light-beam-receiving optical system 328 both below and around the projection optical system PL. The light-beam-projecting optical system 327 obliquely projects a plurality of light beams onto the surface of the wafer W, such that respective slit-images are projected at respective measuring points on the surface of the wafer W. Some of the measuring points fall within the slit-shaped exposure field (which moves on the surface of the wafer W) and the other within the advance field which moves on the surface of the wafer W in advance of the moving exposure field. The light-beam-receiving optical system 228 is disposed in symmetry with the light-beam-projecting optical system 327 with respect to the optical axis AX of the projection optical system PL, and receives the reflected light beams from the surface of the wafer W. In the light-beam-receiving optical system 327, the received light beams again form respective slit-images, from which focus signals are generated which reflects lateral displacements of the slit-images from their reference positions. The focus signals are supplied to both the main control system 314 and the wafer stage drive system 326. The light-beam-projecting optical system 327 and the light-beam-receiving optical system 328 together form an oblique-incidence focus position detection system (referred to as "AF sensor 327, 328" hereinafter.) Any variation in the focus position of the wafer W causes corresponding variation in the lateral displacements of the slit-images, so that the focus position of the wafer W at each of the measuring points may be detected from the corresponding focus signal. The wafer stage drive system 326 servo-controls the position in the Z-direction and tilt angles of the material support 323 such that the measured focus position of the wafer W may be coincident with the image plane whose position is determined in advance through an appropriate technique such as making and analyzing a test print.

The projection optical system PL used with this embodiment is provided with an image formation characteristics correction mechanism. This mechanism comprises a set of three extendable/contractible actuator elements 319 mounted on a lens barrel 318 of the projection optical system PL and a movable lens-frame 320 holding a lens element 321 and supported by the lens barrel 318 through the set of actuator elements 319. The main control system 314 operates an image formation characteristics control unit 315 to control the actuation amounts of the three actuator elements 319 so as to provide fine adjustment of the position and/or tilt angles of the lens element 321 such that certain distortions (including any errors in demagnification ratio) produced by the projection optical system PL may be adjusted within limited adjustment ranges. While the above arrangement drives only a single lens element, it may be preferable to modify it such that two or more lens elements of the projection optical system PL can be driven in a similar manner so as to enable adjustment or correction for further image formation characteristics (such as, curvature of field, comma, etc.)

It is known that the image formation characteristics of a projection optical system PL (such as, the distortion, the position of the image plane, and others) generally vary with time in a relatively long, continuous operation of the projection exposure apparatus due to the variation in the atmospheric pressure, the variation in the ambient temperature, the heat energy buildup in the projection optical system PL received from the exposure light beam, and other factors. In order to prevent any adverse effects of such variation of the image formation characteristics, adjustment of the image formation characteristics of the projection optical system PL is performed. For the adjustment, there are provided an atmospheric pressure sensor (not shown) for continuously sensing the atmospheric pressure and a light intensity sensor (not shown) for continuously sensing the light intensity of a partial light beam extracted from the illumination light beam IL. These sensors continuously provide detection signals, which are supplied to the main control system 314. The main control system 314 uses the detection signals to drive expected variations in the image formation characteristics, and operates the image formation characteristics control unit 315 and/or a drive mechanism for driving the material support 323 in the Z-direction (or the defocus distance correcting mechanism) so as to adjust the image formation characteristics of the projection optical system PL such that the expected variations in the image formation characteristics may be cancelled out. In this embodiment, the image formation characteristics control unit 315 and the material support 323 are also used to correct the image formation characteristics for the errors due to the deformation of the reticle R.

A reference mark plate 322, which is made from a glass plate having its top surface coated with an opaque film layer, is mounted on the material support 323 at a position adjacent to the wafer W placed on the material support 323. The top surface of the reference mark plate 322 is nominally level with the surface of the wafer W and has slits $322x$ and $322y$ extending in the Y-direction and the X-direction, respectively, formed in the opaque film layer and allowing light rays to pass therethrough. The slits $322x$ and $322y$ are used for measuring the image formation characteristics including the distortion and the position of the image plane.

FIG. 20(C) shows a detection system disposed below the reference mark plate 322 and within the material support 323. As shown, a part of the rays of the illumination light beam IL for exposure pass through the slit $322x$ to inter the internal space of the material support 323 to pass through the collimation lens 329A into a sensitive surface of a photodetector 329B. Another collimation lens and another photodetector are provided in the same arrangement for the slit $322y$ on FIG. 20(B), though they are not shown. The two photodetectors provide respective detection signals, which are supplied to a signal processing unit in the main control system 314 of FIG. 18. The X-coordinate of the projected image of the evaluation mark $FRM_{1,1}$ (distortion) is detected by driving the wafer stage WST such that the slit $322x$ of the reference mark plate 322 is moved to pass the projected image of the evaluation mark $FRM_{1,1}$, while the detection signal from the corresponding photodetector 329B is sampled at appropriate points in the X-coordinates. Then, the sampled values of the detection signal are binarized with respect to an appropriate threshold, and the X-coordinate corresponding to the midpoint of slicing point of the binarized values is detected and taken as the X-coordinate of the evaluation mark $FRM_{1,1}$. In the same manner, the Y-coordinate of the evaluation mark $FRM_{1,1}$ can be detected using the slit $322y$.

Then, the position the image plane (or the "best-focus position") of the projected image of the evaluation mark $FRM_{1,1}$ is detected by operating a Z-direction drive mechanism disposed within the material support 323 to vary the focus position of the reference mark plate 322 in a stepwise manner with fixed steps, and each time it is varied by one step, the projected image of the evaluation mark $FRM_{1,1}$ is scanned by the slit 322x and the contrast in the sampled values of the detection signal obtained thereby is examined. The focus position of the reference mark plate 322 which provides the highest contrast of the sampled values is detected and taken as the best-focus position of the projected image. When the projected images of the evaluation marks are formed at different levels, the curved image surface, rather than an image plane, may be determined from their best-focus positions.

The detection system (or "sensor") disclosed above uses the slits for detecting the projected images of the evaluation marks. In place of this sensor, various other types of sensors may be used, including those using a knife edge for detecting the projected images and those using an image sensor, such as a CCD, for sensing the projected image through a relay optical system.

Next, we will describe a mechanism for measuring the deformation of the reticle R. In the projection exposure apparatus of FIG. 18, the reticle holder 307 has a pair of reinforcement ribs 308A and 308B for enhancing the rigidity of the reticle holder 307 while the projection optical system PL is provided at its upper end with the drive mechanism for a lens element, so that the space between the bottom surface of the reticle base 309 (or of the reticle stage RST) and the upper end of the projection optical system PL is very tight. In view of this, in this embodiment, surface shape detection system 330 for detecting the surface shape of the pattern-bearing surface of the reticle R (such as, any irregularities in and tilt of the pattern-bearing surface) is disposed below the reticle stage RST and at a position off the above-mentioned space between the bottom surface of the reticle stage RST and the upper end of the projection optical system PL toward the scanning direction.

In the projection exposure apparatus of this embodiment, each time a new reticle is loaded and held onto the reticle holder 307, the pattern-bearing surface of the reticle is measured and stored. Accordingly, it is unnecessary to measure the surface shape of the pattern-bearing surface of the reticle during the scanning projection exposure process as performed using the illumination light beam IL for exposure. Rather, during the scanning projection exposure process, the stored data representing the surface shape of the pattern-bearing surface in relation with the associated X-coordinates of the reticle stage RST, is read out and used to correct any variation in the image formation characteristics. Because the surface shape of the reticle R may be measured an appropriate position away from the optical axis AX of the projection optical system PL, the surface shape detection system 330 need not be disposed in the above-mentioned tight space between the bottom surface of the reticle stage RST and the upper end of the projection optical system PL.

Figure 19:
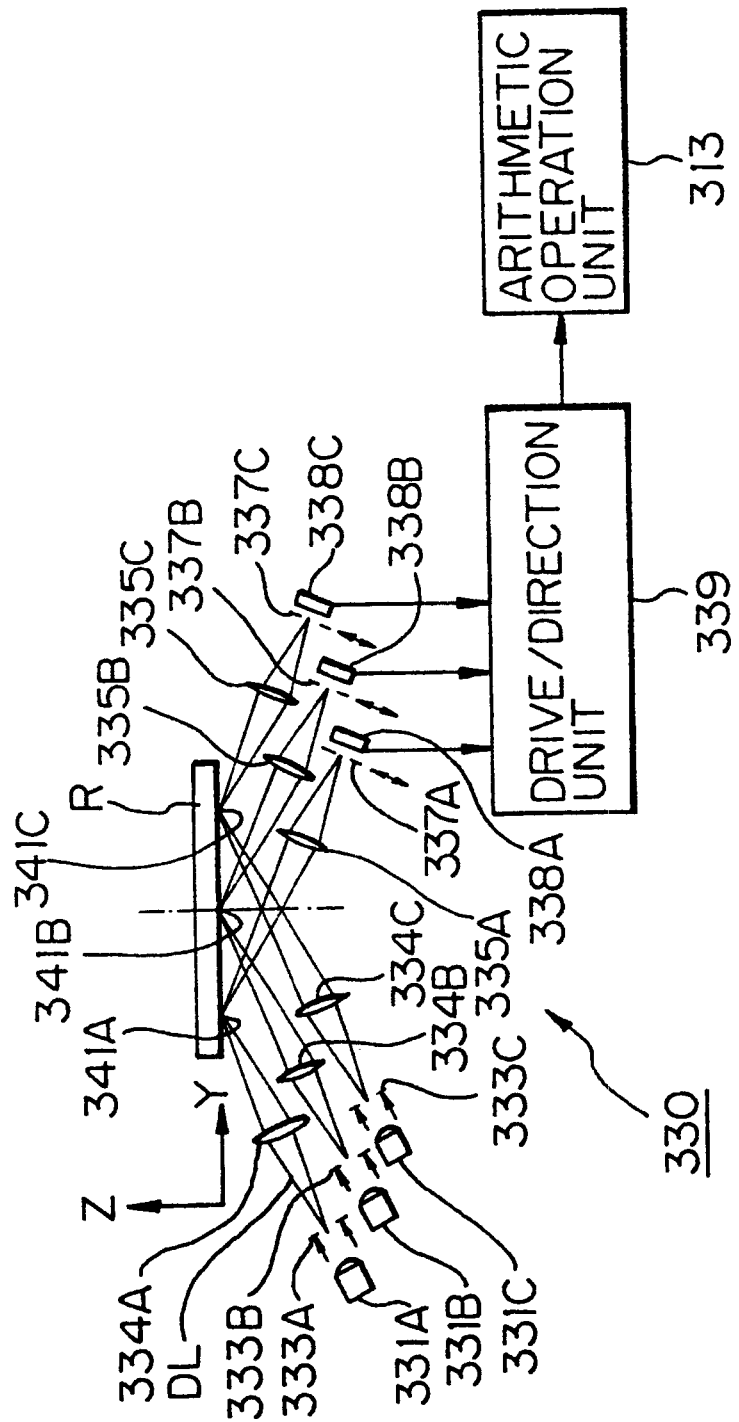
FIG. 19 is a schematic side elevation of a surface shape detection system of FIG. 18.

FIG. 19 is a side elevation of the surface shape detection system 330 of FIG. 18 as viewed in the −X-direction (or the scanning direction). As shown in FIG. 19, three light sources 331A, 331B and 331C, each comprising an appropriate device such as a light-emitting diode or a halogen lamp, emit rays of detection light DL, which illuminate associated slit plates 333A, 333B and 333C, respectively, each having a slit formed therein. Those rays of detection light DL which pass through the slits of the slit plates 333A, 333B and 333C form-corresponding three detection light beams (also designated by DL), which pass through objective lenses 334A, 334B and 334C, respectively, to project respective images of the slits onto the pattern-bearing surface of the reticle R at corresponding measuring points 341A, 341B and 341C lying in a straight line extending in the Y-direction on the pattern-bearing surface. The measuring points 341A–341C fall within an area outside the transfer field (or the projection field on the reticle R) defined by the projection optical system PL and to the scanning direction of the transfer field. The three detection light beams DL as reflected from the measuring points 241A, 241B and 241C are brought into focus through objective lenses 235A, 235B and 235C, respectively, to again form respective slit-images on vibrating slit plates 337A, 337B and 337C, respectively. The vibrating slit plates 337A–337C have each an opening formed therein, and the slit-images are each formed on or around the opening in the associated vibrating slit plate. The vibrating slit plates 337A–337C are driven by a vibrator (not shown) under control of a drive/detection unit 339 so as to produce continuous linear vibrations. That partial beam of each reflected detection light beam DL which passes through the opening in the associated one of the vibration slit plates 337A–337C impinges on the sensitive surface of the associated one of photodetectors 338A, 338B and 338C, which produce detection signals supplied to the drive/detection unit 339. Accordingly, the surface shape detection system 330 comprises three oblique-incidence position detection systems disposed in parallel.

With this arrangement, any variation in the position in the Z-direction of the pattern-bearing surface of the reticle R at each of the measuring points 341A to 341C will cause a corresponding lateral displacement of the position of the associated slit-image in the vibrating direction on the associated on of the vibrating slit plates ee7A to 337C. The drive/detection unit 339 utilize drive signals being supplied to the vibrator so as to perform synchronous rectification of the detection signals from the photodetectors 338A to 338C in order to detect the positions in the Z-direction of the pattern-bearing surface at the measuring points 341A to 341C with a resolution of the order of, say, 100 nm, and the detected positions are supplied to the arithmetic operation unit 313 of FIG. 18. The arithmetic operation unit 313 also receives the XY-coordinates of the position of the reticle stage RST (and thus of the reticle R) as measured by the laser interferometer units 311. The positions in the Z-direction of the pattern-bearing surface at the measuring points 341A to 341C indicate the surface shape of the pattern-bearing surface along a line extending in the non-scanning direction when the reticle R is at the current position in the X-direction indicated by the current X-coordinate. As shown in FIG. 18, the reticle stage RST is moved in the X-direction above the surface shape detection system 330, the entire pattern-bearing surface of the reticle R may be detected by the surface shape detection system 330.

In this embodiment, the positions in the Z-direction of the pattern-bearing surface of the reticle R are detected at the three measuring points. In a case where the data representing such positions with higher resolution is desirable, the surface shape detection system 330 may be modified such that it comprises four or more oblique-incidence position detection systems which are the same as that disclosed above.

Next, we will describe a method of calibration of the measurements from the surface shape detection system 330 in this embodiment. The surface shape detection system 330 measures the relative position of the reticle R to the projection optical system PL to evaluate the effects of the surface shape on the image formation characteristics. Thus, the image formation characteristics can not be maintained stable unless the stability of the measurements from the surface shape detection system 330 is ensured. Nevertheless, the surface shape detection system 330 is a delicate sensor which is required to provide an extremely high resolution of the order of, say, 100 nm as described above. To maintain the stability of the detection system at such high level for a long time is very difficult and may lead to increased manufacturing costs. This problem is advantageously solved in this embodiment by making a calibration of the surface shape detection system 330 by using the reference surface of the reference plate member 310 mounted on the reticle holder 307 as described above. Because the detection of the image plane (or image surface) can be made by using the projected images of the evaluation marks formed on the reference surface, the calibration is performed such that 1) the surface of the wafer W is brought into a position at which it will be coincident with the detected image plane and 2) the measurements produced by the surface shape detection system 330 at that time will be coincident with the predetermined reference values (such as, zeros). In this manner, the position of the pattern-bearing surface of the reticle R and that of the surface of the wafer W can satisfy the focus condition.

More specifically, referring again to FIG. 18, the reticle stage RST is driven to move the reference member 310 into an appropriate position within the illumination field defined by the illumination (or exposure) light beam IL to illuminate the reference member 310 with the illumination light beam IL. At this point of time, a reticle R, which is used for the actual exposure process, may or may not be hold on the reticle holder 307. By this illumination, the images of the evaluation marks $FRM_{1,1}$–$FRM_{2,5}$ of the reference plate member 310 shown in FIG. 20(A) are projected through the projection optical system PL onto the wafer stage WST. Under this condition, the projected images of a predetermined number (three or more) of the evaluation marks (selected from among all the evaluation marks) are reiteratively scanned by the slit 322x (see FIG. 20(C)) while the focus position of the reference mark plate 322 is varied in a stepwise manner, and examine the contrast in the resultant detection signals so as to determined the best-focus positions of the images of the selected evaluation marks, as described above. Then, the best-focus positions of the selected evaluation marks are processed using least-squares method, for example, so as to determined the optimal image plane (i.e., the target plane which the surface of the wafer W should be coincident with.)

Each time the focus position of the reference mark plate 322 is varied, the main control system 314 operates the oblique-incidence AF sensor 327, 328 to detect the focus signals at the measuring points which are adjacent to the projected images of the selected evaluation marks so as to obtain the focus signals corresponding to the best-focus positions of the projected images. The main control system 314 the focus signals from the AF sensor 327, 238 at the measuring points on the optimal image plane as the offsets, and supplies the offsets to the wafer stage drive system 326. Alternatively, instead of supplying the offsets to the wafer stage drive system 326, the angles of incidence of the detection beams from the light-beam-projecting optical system 327 and/or the positions of the slit-images formed in the light-beam receiving optical system 328 may be so adjusted as to cancel out the offsets.

Thereafter, with the surface of the wafer W located in a position within the exposure field, the wafer stage drive system 326 controls the focus position and tilt angles of the material support 323 such that the values of the current focus signals being supplied from the AF sensor 327, 238 minus the corresponding offsets may be zeros. In this manner, the surface of the wafer W may be brought, with precision, into a position at which it will be coincident with the optimal image plane (or the desired plane) which is well approximate to the curved image surface of the reference surface of the reference member 310 defined by the. projection optical system PL.

Figure 22:
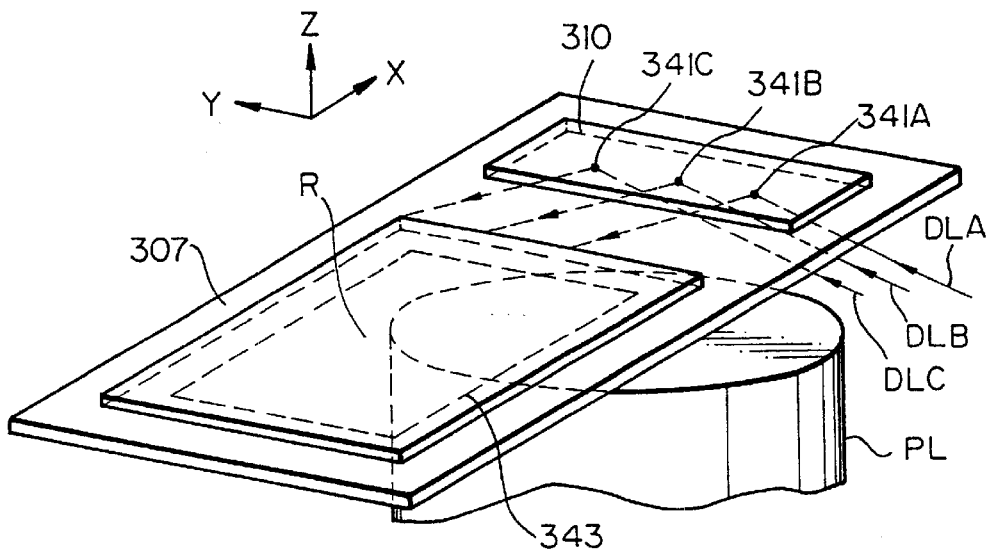
FIG. 22 is a simplified perspective view showing an exemplified position of a reticle on a reticle,stage when the position of the reference surface of the reference member is measured.

Just after (or alternatively, just before) the determination of the optimal image plane as performed using the reference member 310 in this manner, the reference surface of the reference plate member 310 is moved into an appropriate position within the detection area of the surface shape detection system 330 for measurement of the position of the surface, as shown in FIG. 22.

Figure 23:
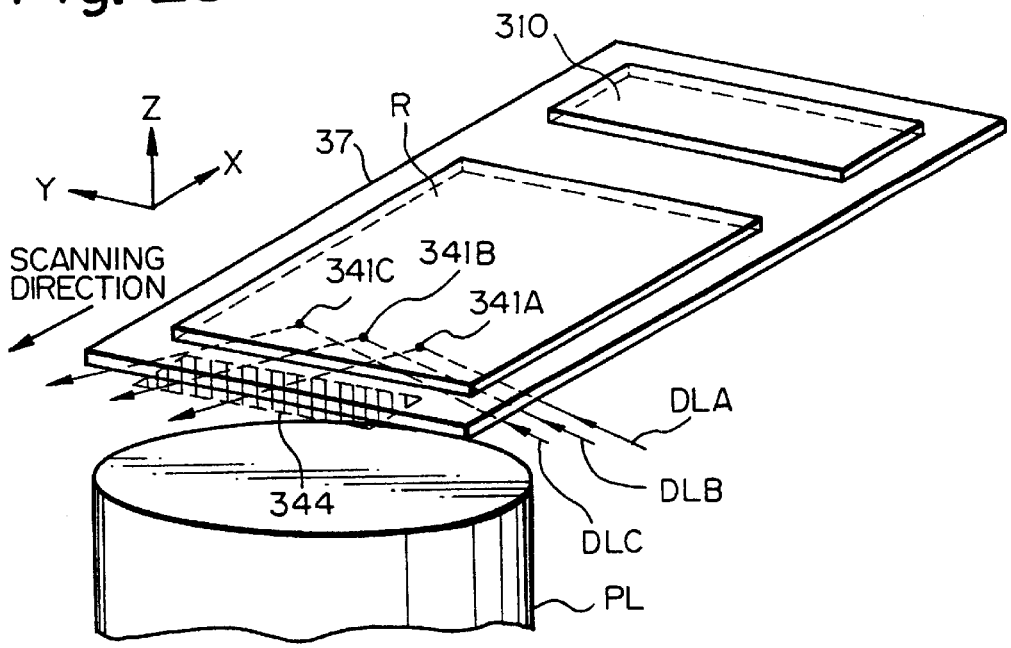
FIG. 23 is a simplified perspective view showing an exemplified position of a reticle on a reticle stage when the surface shape of the pattern-bearing surface of the reticle is measured.

In FIG. 22, the reference member 310 has been moved in the +X-direction relative to the projection optical system PL, and the three detection light beams DLA, DLB and DLC are projected from the light sources 331A 331B and 331C, respectively, of the surface shape detection system 330 of FIG. 19 onto the reference surface (bottom surface) of the reference member 310 at the three measuring points 341A, 341B and 341C, respectively, which measuring points lie on a center line of the reference surface extending in the Y-direction at the center with respect to the X-direction. In this manner, the arithmetic operation unit 313 of FIG. 18 detects the positions in the Z-direction of the reference surface at the measuring points 341A, 341B and 341C, designated by $ZA_0$, $ZB_0$ and $ZC_0$. The, as shown in FIG. 23, a part of the pattern-bearing-surface of the reticle R for the actual exposure process is moved into a position within the detection area of the surface shape detection system 330, and the position of that portion of the pattern-bearing surface is measured. An example is described here, assuming that when the measurement of the position of the pattern-bearing surface of the reticle R is performed, the pattern-bearing surface shows a deformation which is uniform in the scanning direction and the reticle R is located at a starting position for the scanning projection exposure to the first of the shot areas defined on a wafer.

In FIG. 23, the reticle has been moved in the +X-direction with respect to the projection optical system PL, so that the reticle R is located to the +X-direction of the illumination field 344 defined by the illumination (or exposure) light beam, when the X-coordinate of the reticle stage RST is $x_1$. The shape of the illumination field 344 is defined by the shape of the field stop in the illumination optical system 304 of FIG. 18. In the condition of FIG. 23, the illumination field 344 is not yet illuminated by the illumination light beam. At the beginning of the scanning projection exposure operation, the reticle R starts moving in the −X-direction and is accelerated into a desired scanning velocity as well as brought into synchronism with the movement of the wafer W, before the leading edge of the pattern-bearing area of the reticle R enters the illumination field 344 and the illumination (or the scanning exposure) is started. After the pattern-bearing area of the reticle R has passed the illumination field 344, the reticle R is decelerated to stop. When the exposure to the next shot area is performed, the reticle R is moved in the opposite direction, i.e., in the +X-direction, for scanning. Thereafter, the reticle R will be moved in alternate directions for the exposure of the subsequent shot areas on the wafer W.

In this embodiment, when the reticle R stands still at a starting position for scanning (at which the X-coordinate of the reticle stage RST is $x_1$) as shown in FIG. 23, the detection light beams DLA to DLC from the three light sources 331A to 331C of the surface shape detection system of FIG. 19 are projected onto the pattern-bearing surface of the reticle R at the three measuring points 341A to 341C with in an area along the one peripheral edge of the pattern-bearing surface, and the resultant detection signals are processed by the arithmetic operation unit 313 of FIG. 18 to determine the positions in the Z-direction of the pattern-bearing surface at the measuring points 341A to 341C, designated by $ZA(x_1)$, $ZB(x_1)$ and $ZC(x_1)$. Then, the arithmetic operation unit 313 subtracts the positions in the Z-direction of the reference surface of the reference member 310 from the corresponding positions in the Z-direction of the pattern-bearing surface of the reticle R, respectively, to derive the differentials $\Delta ZA(x_1)$, $\Delta ZB(x_1)$ and $\Delta ZC(x_1)$ and supplies the differentials as the data representing the positions in the Z-direction of the pattern-bearing surface to the main control system. The main control system 314 uses the supplied data representing the positions in the Z-direction, $\Delta ZA(x_1)$, $\Delta ZB(x_1)$ and $\Delta ZC(x_1)$ to derive by calculation the displacement of the expected image plane, which is expected to be defined by the projection optical system PL, from the desired plane of the wafer W previously determined as described.

FIG. 21 is a schematic side elevation of the reticle R on the reticle holder 307, the projection optical system PL and the wafer W, as viewed in the +X-direction (or the scanning direction), illustrating an exemplified, possible deformation of the pattern-bearing surface of the reticle R. The reticle R indicated by the solid lines is completely flat with its pattern-bearing surface 340 coincident with the reference surface of the reference member (not shown), and the surface of the wafer W is coincident with the image plane of the pattern-bearing surface 340 defined by the projection optical system PL. The reticle R indicated by the imaginary lines is deformed by the gravity with its pattern-bearing surface 340A deflected thereby. The magnitudes of the deflection of the pattern-bearing surface 340A from the reference surface at the measuring points are represented by the data representing the positions in the Z-direction, $\Delta ZA(x_1)$, $\Delta ZB(x_1)$ and $\Delta ZC(x_1)$. The main control system 314 calculates the expected displacements of the image surface 342A defined by the projection optical system PL which are expected to occur due to the deflection of the pattern-bearing surface 340A, from the demagnification ratio β of the projection optical system PL and the data representing the positions in the Z-direction. From the result of the calculation, the field curvature of the image surface 342A and the variation ΔZ in the average focus position of the image surface 342A are derived. Then, the main control system 314 operates the image formation characteristics control unit 315 of FIG. 18 to correct the projection optical system PL for the field curvature, by controlling the actuation amounts of the actuator elements 319. This correction may cause an associated variation in the average focus position. Thus, the main control system calculates the resultant variation ΔZ' in the average focus position, and vary the desired value of the focus position of the surface of the wafer W (which is supplied to the wafer stage control system 326) by −ΔZ'. In this manner, corrections are made for the field curvature and the defocus both produced by the deflection of the pattern-bearing surface of the reticle R, so that the surface of the wafer W may be brought into a position at which it will be coincident with the actual image surface of the patten-bearing surface of the reticle R with precision.

If it is expected that the deformation of the pattern-bearing surface of the reticle R would also affect the distortion produced by the projection optical system PL, the image formation characteristics control unit 315 is operated to make correction for the distortion as well. If the magnitude of the deformation of the pattern-bearing surface of the reticle R considerably varies depending on the position in the scanning direction, it is preferable to measure the positions in the Z-direction $ZA(x_i)$, $ZB(x_i)$ and $ZC(x_i)$ at the three measuring points on the pattern-bearing surface of the reticle R through the surface shape detection system 330 and derive the corresponding differentials from the reference surface, each time the X-coordinate of the reticle stage RST has increased by a predetermined distance to be $X_i$ (i=2, 3, . . . ) Then, the average surface of the pattern-bearing surface may be determined and the image plane of the average surface be used as the desired image plane with which the surface of the wafer W should be coincident, or alternatively, the adjustment for the field curvature as adjusted by the image formation characteristics control unit 315 and the adjustment for the desired value of the focus position as adjusted by the material support 323 may vary depending on the X-coordinate of the reticle stage RST.

As described, in this embodiment, the image plane of the reference surface of the reference member 310 is determined through the projection optical system PL just before the displacements of the pattern-bearing surface of the reticle R from the reference surface are measured. As the result, even when the measurements supplied from the surface shape detection system 330 would vary with time, the position of the pattern-bearing surface of the reticle R may be measured without being affected by the variation of the measurement and thus with precision and stability. This enables the use of relatively low-cost sensors as the surface shape detection system 330.

The measurement of the pattern-bearing surface of the reticle R by the surface shape detection system 330 may be performed at the end of the scanning projection exposure process while the reticle R is being decelerated, or after the scanning projection exposure process and the reticle R again stands still.

Figure 24:
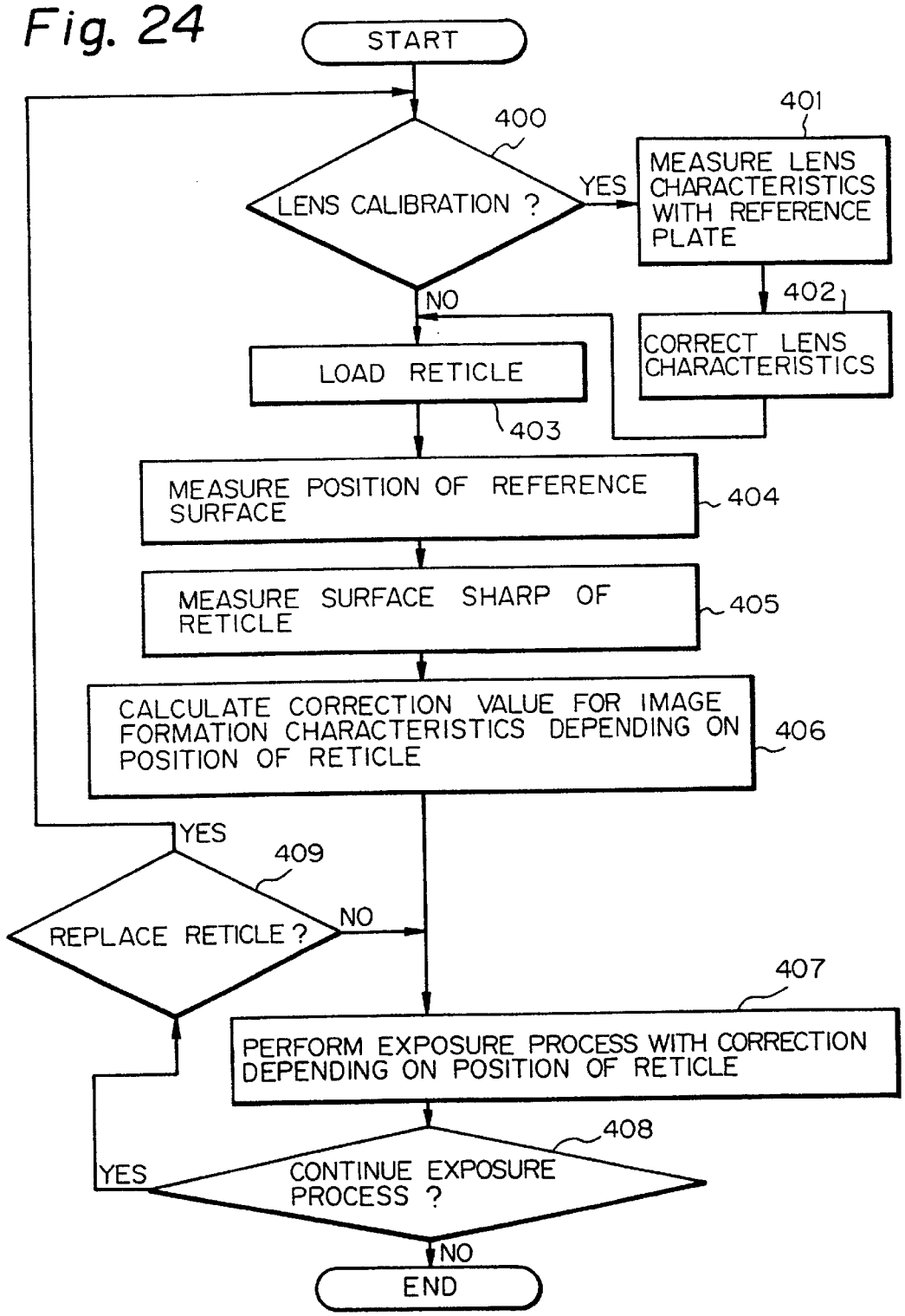
FIG. 24 is a flow chart illustrating an exemplified sequence of operations for performing exposure process while correcting the image formation characteristics according to a further embodiment of the present invention for achieving the above-mentioned third object.

Referring next to the flow chart of FIG. 24, we will describe an exemplified sequence of operations performed with the projection exposure apparatus of this embodiment for measuring the deformation of the pattern-bearing surface of a reticle and making an exposure while correcting the image formation characteristics. To begin with, at step 400 in FIG. 24, a human operator determines whether the calibration of the image formation characteristics of the projection optical system PL, or so-called lens calibration, is to be performed. The lens calibration is performed if desired in view of the stability of the image formation characteristics of the projection optical system PL. If the lens calibration is to be performed, the process proceeds to step 401, where the image formation characteristics (relating to the distortion and the image plane) are measured using the evaluation marks of the reference member 310 under the control of the main control system 314 in the manner as described above with reference to FIG. 20. Then, the process proceeds to step 402, where the main control system 314 corrects the image formation characteristics such that the characteristics may be optimal with respect to the reference surface of the reference member 310.

From step 402 after the lens calibration has been completed, or from step 400 directly if the lens calibration is not to be performed, the process proceeds to step 403, where a reticle which for use in the actual exposure process for transferring a circuit pattern (designated by "reticle R") is placed on the reticle holder 307 of FIG. 18 and held onto it by vacuum suction. Then, the process proceeds to step 404, where the reticle holder 307 is driven such that the center line of the reference member 310 extending in the Y-direction at its center in the X-direction may be coincident with the line of the measuring points 341A to 341C defined by the surface shape detection system 330, and then the position in the Z-direction (or in the direction of the optical axis AS) of the reference surface of the reference member 310 is measured by the surface shape detection system 330, and the measurements are supplied to the arithmetic operation unit 313 and stored therein as the reference values of the surface shape detection system 330. Since the size of the reference member 310 in the scanning direction is as small as that of the illumination field, the variations in measurements depending on the position in the scanning direction of the measuring points are considered negligible. However, if the measurement of the positions In the Z-direction of the reference surface is repeated with the reference member 310 located in different positions in the scanning direction and the average of the measured positions at each measuring point is stored as the reference value of the surface shape detection system 330, we can obtain the position of the reference surface with more precision.

Then, the process proceeds to step 405, where the surface shape of the pattern-bearing surface of the reticle R for actual exposure is measured. It is assumed here that the entire pattern-bearing surface of the reticle R is subject to t he surface shape measurement in order to obtain precise measurements As shown in FIG. 18, the reticle stage RST is driven based on the measurements supplied from the laser interferometer unit 311 so as to move the reticle R in the X-direction, while the measurement process is reiteratively performed in which the position in the Z-direction of the pattern-bearing surface of the reticle R is measured by the surface shape detection system 330 at the three measuring points lying in a line extending in the non-scanning direction (or the Y-direction.) Then, the arithmetic operation unit 313 of FIG. 18 derive the differential between the measured value for each measuring point and the reference value for the same measuring point as stored in step 404, and supplies the differentials for the three measuring points to the main control system 314 as the data representing the position in the Z-direction of the pattern-surface of the reticle R. In this manner, the three-dimensional surface shape of the patter n-bearing surface is measured.

Then, the process proceeds to step 406, where the main control system 314 calculates the expected variation in the image formation characteristics which is expected to occur due to the deformation of the pattern-bearing surface of the reticle R as measured in comparison with the reference surface in the manner as described above with reference to FIG. 21 and also calculates the correction values necessary to correct for the deformation of the reticle R. Since a slit-shaped exposure field is used in the scanning projection exposure, a finer correction can be made by varying the correction values depending on the position In the scanning direction (or the X-coordinate) of the reticle stage RST. For example, if the reticle R suffers from some torsional deformation, the tilt angle of the wafer W may be varied depending on the torsional angle of the reticle R. That is, it is preferable to vary the correction values depending on the X-coordinate of the reticle stage RST. Note that the X-coordinate of the reticle stage RST used here is derived taking into consideration the differential between the measuring position (or the position in the X-direction of the measuring points of the surface shape detection system 330) and the exposure position (or the position in the X-direction of the optical axis AX of the projection optical system PL).

Then, the process proceeds to step 407, where the exposure process for printing a circuit pattern of a semiconductor chip is commenced. For example, the wafers in a lot are sequentially loaded onto the material support 323 and the scanning projection exposure is performed to each of the shot areas defined on every wafer. Just before the commencement of the exposure process, the main control system 314 derive the total correction values by summing 1) the correction values derived at step 406 and 2) additional correction values for canceling out the expected variation in the image formation characteristics which is expected to occur due to variation in the atmospheric pressure and absorption of some of the illumination light energy by the projection optical system PL. Then, based on the total correction values, the main control system 314 drive the image formation characteristics unit 315 and the material support 323 to correct the image formation characteristics depending on the X-coordinates of the reticle stage RST during the scanning projection exposure to a particular shot area.

If, after all the wafers in that lot have been processed, the exposure process is to be continued for the wafers in the next lot, then the process proceeds from step 408 to step 409, where it is determined whether the reticle is to be replaced with a new one. If the exposure process is to be continued with the same reticle, the process returns to step 307 and repeat the exposure process because it is unnecessary to measure the surface shape of the reticle at this point of time. However, if the reticle is to be replaced at step 409, the process returns to step 400. If not a long time has passed since the previous calibration of the image formation characteristics of the projection optical system PL (or lens calibration), no factors in the image formation characteristics of the exposure apparatus but the surface shape of the reticle R may have possibly varied, so that the process can proceed from step 400 directly to step 403 where the wafers are continuously loaded. As long as the time having passed since the previous measurement of the position of the reference surface is much shorter than the time which has to pass before the measurements thereof from the surface shape detection system 330 can provide any appreciable variation with time, the measurement of the position of the reference surface by the surface shape detection system 330 at step 404 may be bypassed.

As apparent from the above, in this embodiment, the surface shape of the pattern-bearing surface of the reticle R is measured by the surface shape detection system 330 using the reference surface of the reference member 310 as the reference for the measurement, and the measurement result is used to correct the image formation characteristics of the exposure apparatus. Therefore, even when the measurements produced by the surface shape detection system 330 suffer fluctuations with time, the surface shape of the pattern-bearing surface can be measured with precision, with the result that the exposure process may be performed with the image formation characteristics maintained at a desired condition with precision.

If a reticle which has been used once or more is to be again used, and the data representing the measured surface shape of that reticle is maintained, as well as the required precision of the exposure process Is not severe, then the measurement of the surface shape of the reticle at step 405 may be bypassed to improve the throughput of the exposure process. Nevertheless, it is generally preferable not bypass the step 405 because even when the same reticle is to be used again, the position of that reticle on the reticle holder 307 may be possibly displaced from the position it occupied when previously used, because there may be a possible error in the positioning operation of the reticle loader and/or a possible foreign particle between the reticle and the reticle holder 307. Further, it is preferable to alert a human operator and stop the exposure process when a great residual error is expected even after the correction of the image formation characteristics or the correction values are insufficient, which may occur due to the presence of foreign particles or a great error in size or shape of the reticle.

In this embodiment, the surface shape of the reticle R is measured only once after the placement onto the reticle holder 307. This is based on the assumption that the reticle R would suffer no variation in its surface shape once it is placed onto the reticle holder 307. However, if the reticle R is expected to suffer some variation in its surface shape with time and/or absorb some of the illumination light energy to thermally expand so that remeasurement would be necessitated, it is preferable to direct the process again to step 404 and/or step 405 to perform again measurement of the surface shape. In addition, while in the above description only the variation in the shape of the reticle R is considered, the orientation of the reticle R may also suffer variation since the orientation of the reticle stage RST may possibly vary depending on the position of the reticle stage RST. This is a problem relating not to individual reticles but to the projection exposure apparatus itself. Thus, in order to solve this, variations in the orientations of reticles are measured for the exposure apparatus in advance, and the correction values for the variations are added to the correction values for the surface shape of the reticle by incorporating them into the correction values of the image formation characteristics corresponding to the coordinates of the reticle stage. Further, if the orientation of the reticle stage RST may suffer variation depending on the velocity and/or acceleration of the reticle stage RST when moved for scanning, it is preferable to make a correction for such variation in the same manner as above.

While in this embodiment the surface shape detection system 330 is disposed below and around the reticle stage RST, it may be alternatively disposed above and around the reticle stage RST. However, the disposition of the surface shape detection system 330 below and around the reticle stage RST may be generally preferable because the reticle R has its pattern-bearing surface defined on its bottom surface so that the surface shape detection system 330 below the reticle stage RST would be less affected by the reflected light from the top surface of the reticle R leading to detection of the surface shape of the pattern-bearing surface with precision.

Further, while in this embodiment the image formation characteristics is corrected by means of the drive of the lens element in the projection optical system PL and the attitude control of the material support 323 on the wafer stage WST, the image formation characteristics may be alternatively performed in other way. For example, the reticle stage RST may be provided with an attitude control mechanism, and the attitude control of the reticle may be performed by feedback control using the attitude control mechanism and the surface shape detection system 330 for providing feedback of the position of the pattern-bearing surface of the reticle. In such a case, It is preferable that the measuring points defined by the surface shape detection system 330 comprise three or more points which do not lie in a line, in order to enable determination of a plane.

It should be understood that embodiments of the present invention for achieving the above-mentioned third object are not limited to those disclosed above but may be embodied in various other forms and arrangements without departing the spirit of the present invention.

In a scanning projection exposure method according to the present invention for achieving the above-mentioned third object, the surface shape of the pattern-bearing surface of a mask is measured prior to making a scanning projection exposure, and the image formation characteristics are corrected based on the measurement result during the scanning projection exposure, so that the sensor for measuring the surface shape of the pattern-bearing surface of the mask may be advantageously disposed with ease even when there is little space between the projection optical system and a mask stage since it may be disposed at a position away from the projection optical system to the scanning direction. As the result, by measuring the deformation of the mask, the expected variation in the image formation characteristics which is expected to be produced by the deformation may be derived and an appropriate correction may be made.

In the case where the surface shape measurement of the pattern-bearing surface of a mask is performed while the mask stands still at a starting point for scanning or while the mask is being accelerated for scanning, the sensor for the surface shape measurement may be disposed at a position sufficiently away from the projection optical system to the scanning direction and it is unnecessary to extend the stroke of the movement of the mask for the surface shape measurement.

With a scanning projection exposure apparatus according to the present invention for achieving the above-mentioned third object, the scanning projection exposure methods described above for the third object may be conveniently performed. In the case where a reference surface is formed on a mask stage for moving the mask such that the reference surface may be substantially level with the pattern-bearing surface of the mask, and a calibration of the shape measurement system is performed using the reference surface, it is sufficient for the shape measurement system to have such stability that the measurements it provides are stable only for a very short time from when the reference surface has been measured to when the surface of the mask has been measured. Thus, even if the measurements produced from the shape measurement system tend to suffer fluctuations within a relatively short time (i.e., the shape measurement system has a poor stability), the surface shape of the mask may be measured with precision so as to make an appropriate correction for the variation. By virtue of this, the shape measurement system may have a relatively simple arrangement.

Next, we will describe several exposure apparatus according to embodiments of the present invention for achieving the above-mentioned fourth object.

Figure 25:
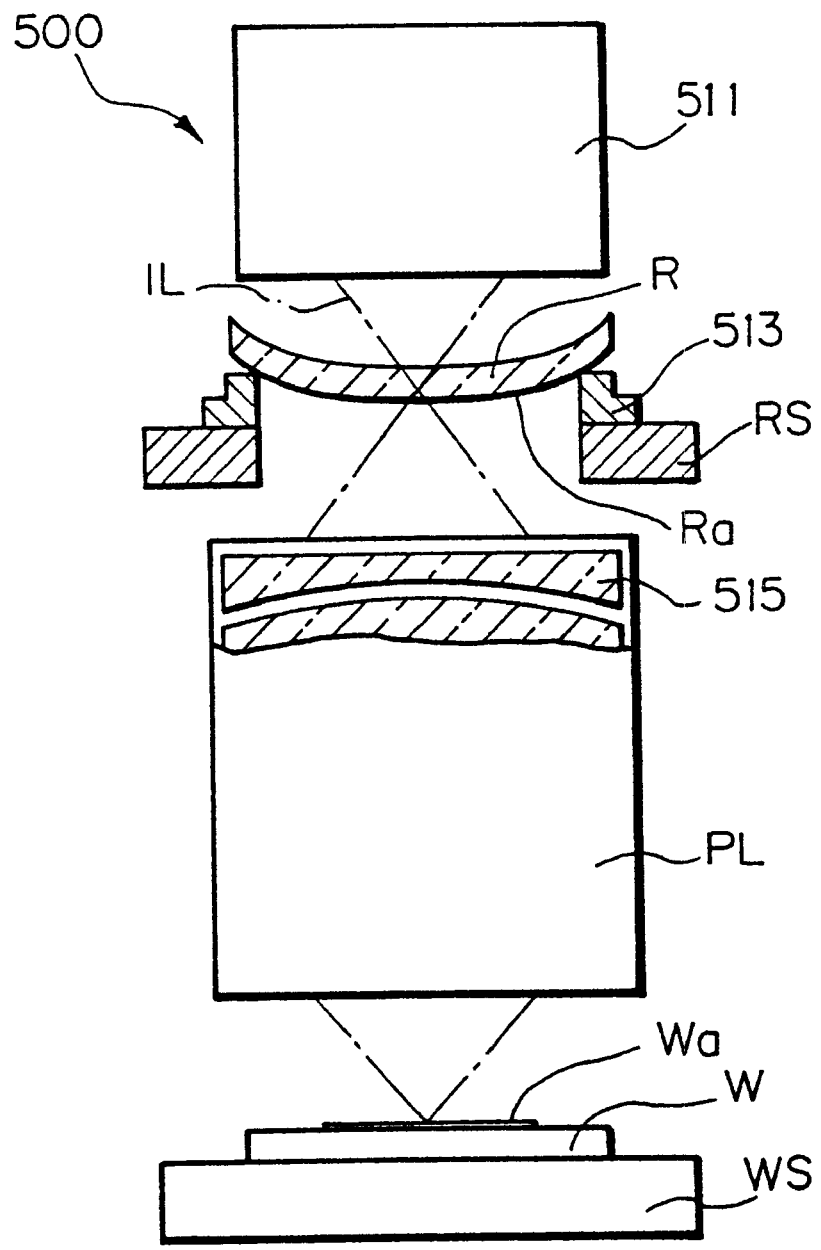
FIG. 25 is a schematic side elevation, partially broken away, of a projection exposure apparatus according to a further embodiment of the present invention for achieving the above-mentioned fourth object.

FIG. 25 is a schematic side elevation, partially broken away, of a projection exposure apparatus according to an embodiment of the present invention for achieving the above-mentioned fourth object.

The projection exposure apparatus 500 comprises an illumination optical system 511 for projecting an illumination light beam IL down onto a reticle R, which is held and secured at its peripheral edges onto a reticle holder 513. The reticle holder 513 is mounted on a reticle stage RS. The reticle R has a circuit pattern for semiconductor chips on its bottom surface Ra, and the illumination light beam IL passes through the reticle R.

The exposure apparatus 500 is a scanning projection exposure apparatus in which the reticle stage RS and a wafer stage WS are disposed on opposite sides of a projection optical system PL and moved in synchronism with each other for scanning projection exposure.

The exposure light beam (illumination light beam) passed through the reticle R then passes through the projection optical system PL disposed under the reticle stage RS so as to form an image on a resist-coated surface Wa (the top surface) of the wafer W, which is located under the projection optical system PL. The circuit pattern of the reticle R is demagnified by the projection optical system PL with a demagnification ratio of 1/5 and transferred onto the wafer W. The wafer W is held and secured onto the wafer stage WS by means of vacuum chucks (not shown). The wafer stage WS is arranged to be driven for movement along the X-, Y- and Z-axes as well as for rotation in the q-direction so as to locate the wafer W in a desired position and orientation. The Z-axis is parallel to the optical axis of the projection optical system PL. The X- and Y-axes are orthogonal to each other and perpendicular to the optical axis. The q-direction is the rotational direction about Z-axis.

The uppermost of the lens elements of the projection optical system PL is a correction lens element 515 having a flat upper surface and a cylindrical concave lower surface as shown in cross-section in FIG. 25, which cross-section is perpendicular to the longitudinal axis (extending perpendicular to the drawing sheet surface of FIG. 25) of the reticle holder 513. Accordingly, the sectional side view of the correction lens element 515 along the longitudinal axis of the reticle holder 513 would show a shape of a rectangle (or straight band). The shape of the correction lens element 515 is so designed as to correct the errors in image formation characteristics due to the deflection of the reticle R, so that the image of the pattern projected on the wafer W may be corrected by the correction lens element 515 with precision.

Figure 26:
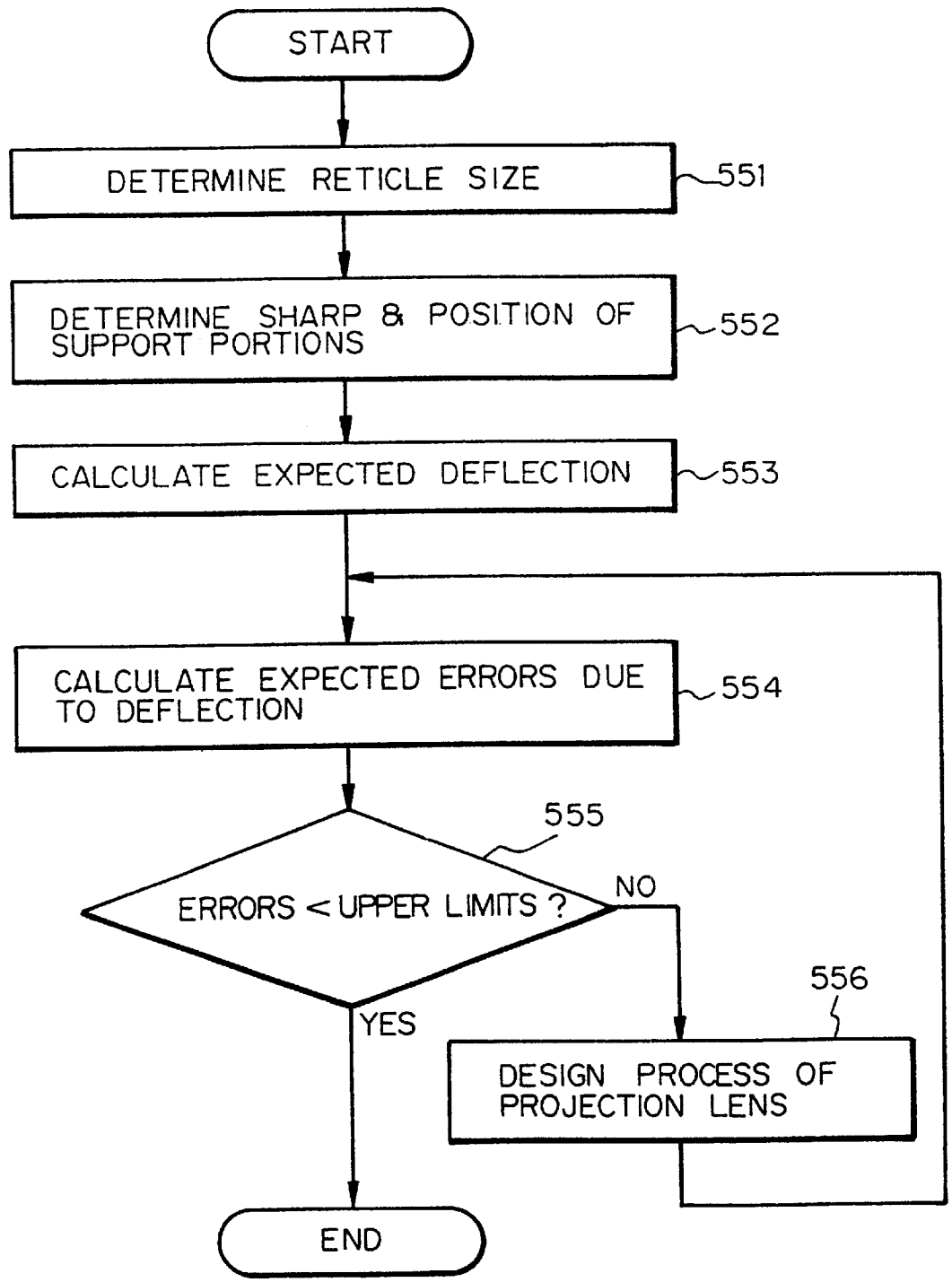
FIG. 26 is a flow chart illustrating an exemplified design process of a projection optical system of FIG. 25.

FIG. 26 is a flow chart showing the design process for designing the projection optical system of FIG. 25.

Figure 31:
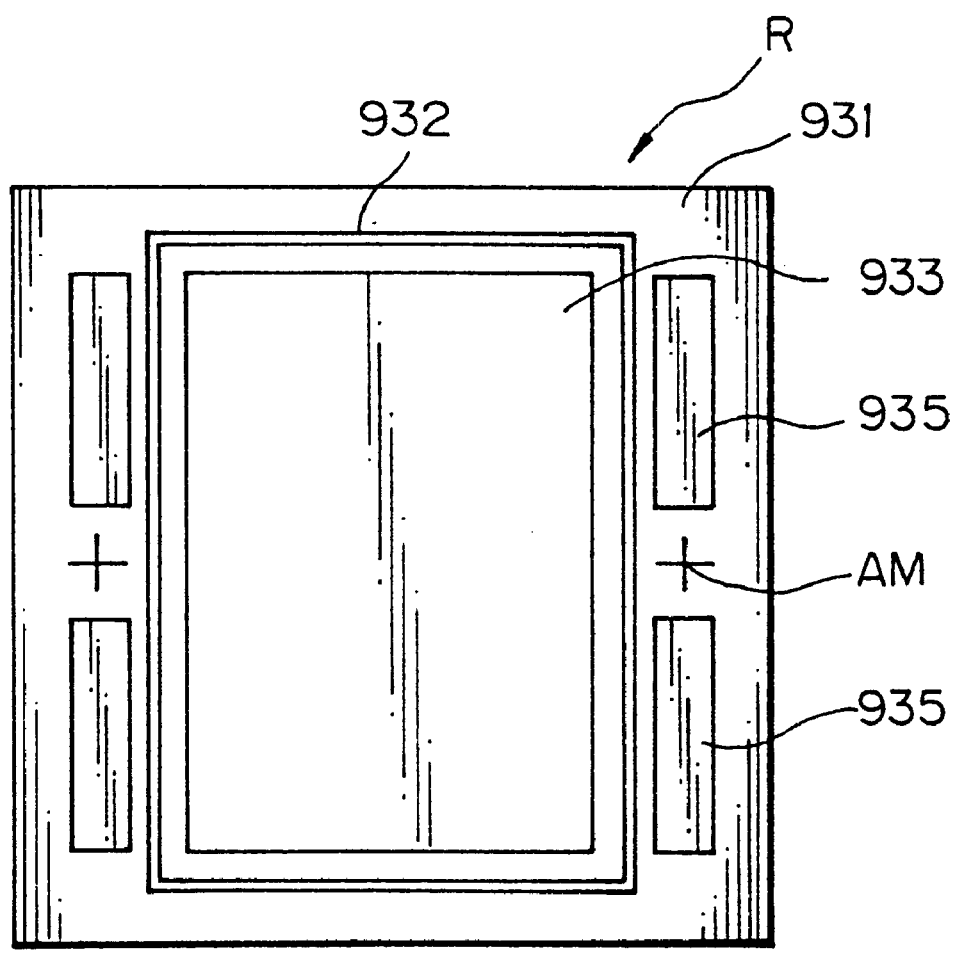
FIG. 31 is a plan view of a reticle which may be used with the present invention.
Figure 32:
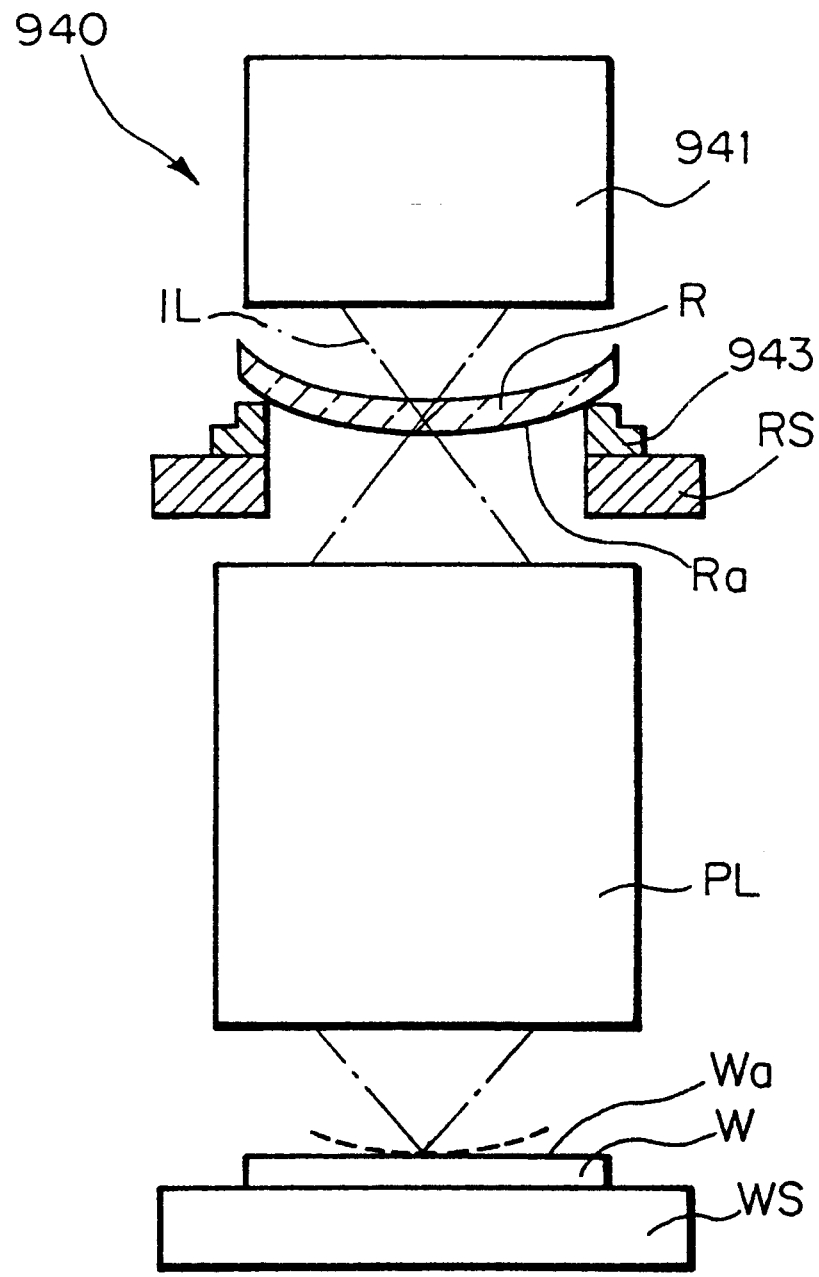
FIG. 32 is a schematic side elevation of a projection exposure apparatus illustrating the error of the projected image on a wafer due to the deflection of a reticle which may be used with the present invention.

To begin with, the size of the reticle (including the width and the thickness) is determined (step 551). Then, the shape of support portions of the reticle R at which it is supported by the reticle holder 513 is determined (step 552). As shown in FIG. 31, the support portions of the reticle R are designed taking into consideration the layout of various parts and features of the reticle R including an exposure pattern area 933 actually used for the exposure and various alignment marks disposed outside a pellicle frame attachment area 932 and used for positioning of the reticle. Further, the pellicle frame attachment area 932 is determined taking into consideration the position and size of the exposure field, the numerical aperture of the projection lens, the expected size range of foreign particles which may possibly adhere onto the pellicle, the operational space required for a foreign particle inspection device, the accuracy in size of the pellicle frame, the accuracy in position of the pellicle frame on the reticle R and others.

After determination of the position of the reticle R on the reticle holder and how to support the reticle when loaded on the reticle holder (such as, whether the reticle is simply placed on or secured by a vacuum chuck onto the reticle holder), the magnitude of the expected deflection of the reticle R which is expected to occur when it is supported on the reticle holder can be calculated (step 553). The calculation of the magnitude of the expected deflection may be performed using an appropriate finite element method, which may be provided by commercially available computer software products. Then, from the expected deflection, the expected errors in the focus and distortion which are expected to occur in the projected image on the wafer W when a projection exposure is made (step 445). Then, the errors are compared with acceptable upper limits (step 555). If either of them is beyond the corresponding upper limit (NO at step 555), the errors in the focus and distortion derived by calculation are feedback to the design process of the projection lens, and a sequence of design steps in the design process will be repeated (step 556). Generally, in a design process of a projection lens, a sequence of design steps is repeated so as to reduce the aberrations of the projection lens to zeros. However, in fact, the projected images suffer errors which are produced as fixed offsets by the deflection of the reticle used. In this embodiment, the reverse aberrations which finally cancel out the errors due to the deflection of the reticle, are intentionally provided to the projection lens in the design process. Each time the design process has been repeated, the expected errors are again calculated (step 554), and if the errors are smaller than the corresponding acceptable upper limits (YES at step 555), the entire process is completed.

Figure 27:
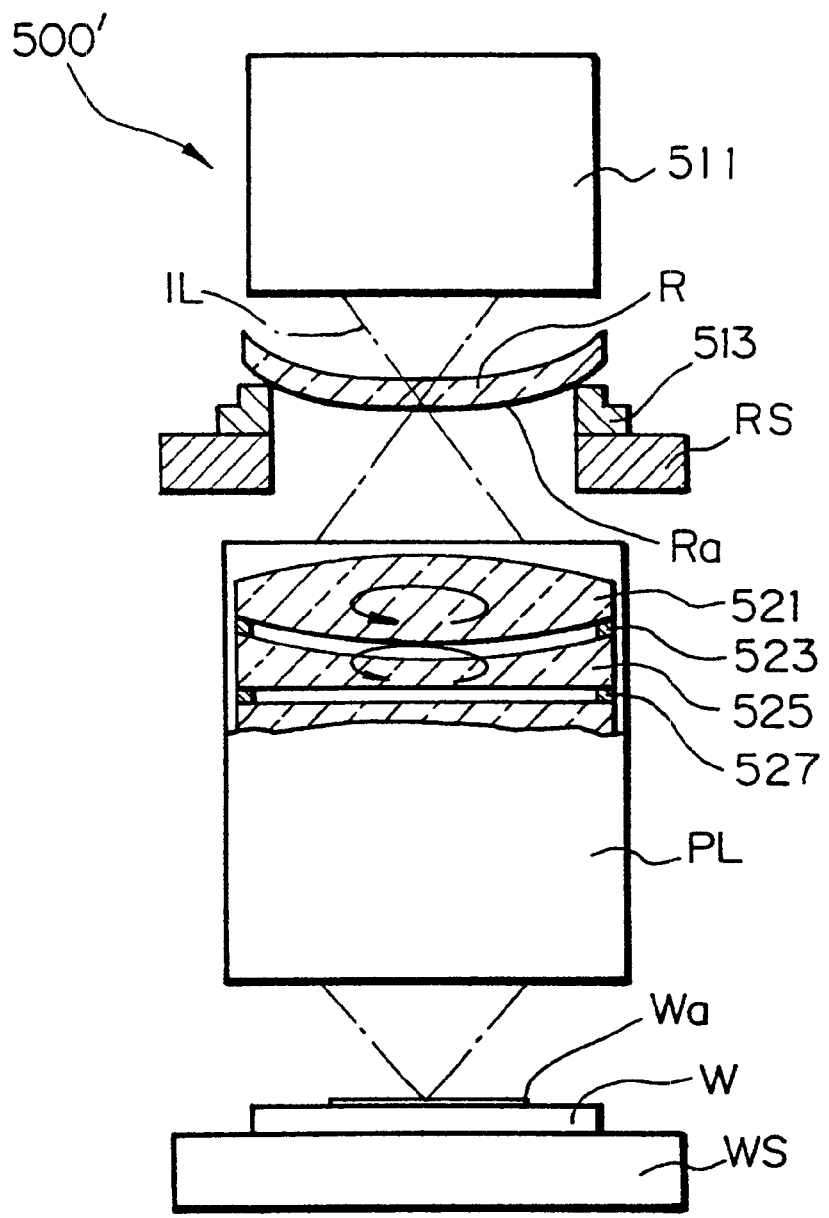
FIG. 27 is a schematic side elevation, partially broken away, of a projection exposure apparatus according to a further embodiment of the present invention for achieving the above-mentioned fourth object.

FIG. 27 is a schematic side elevation, partially broken away, of a projection exposure apparatus according to a further embodiment of the present invention for achieving the above-mentioned fourth object.

The projection exposure apparatus 500' has a unique feature that it has a projection optical system PL comprising combined correction lens elements 521 and 525 having no rotational symmetry about the common optical axis and associated with respective manipulation mechanisms 523 and 527. The correction lens elements 521 and 525 are independently rotatable about the common optical axis by means of the associated manipulation mechanisms 523 and 527, respectively. In the adjustment process, the manipulation mechanisms 523 and 527 may be operated to rotate the non-rotationally-symmetric, correction lens elements 521 and 525 about the common optical axis, so as to adjust the rotational positions of the lens elements 521 and 525. An example of each manipulation mechanism 523, 527 may comprise a rotary member having a plurality of holes extending in the direction of the optical axis and capable of insertion therein with an adjustment bar. When a human operator rotates the adjustment bars of the manipulation mechanisms 523 and 527 about the common optical axis so as to change the relative, optical positions of the correction lens elements 521 and 525, the resultant vector may be directed to any desired direction.

Figure 28:
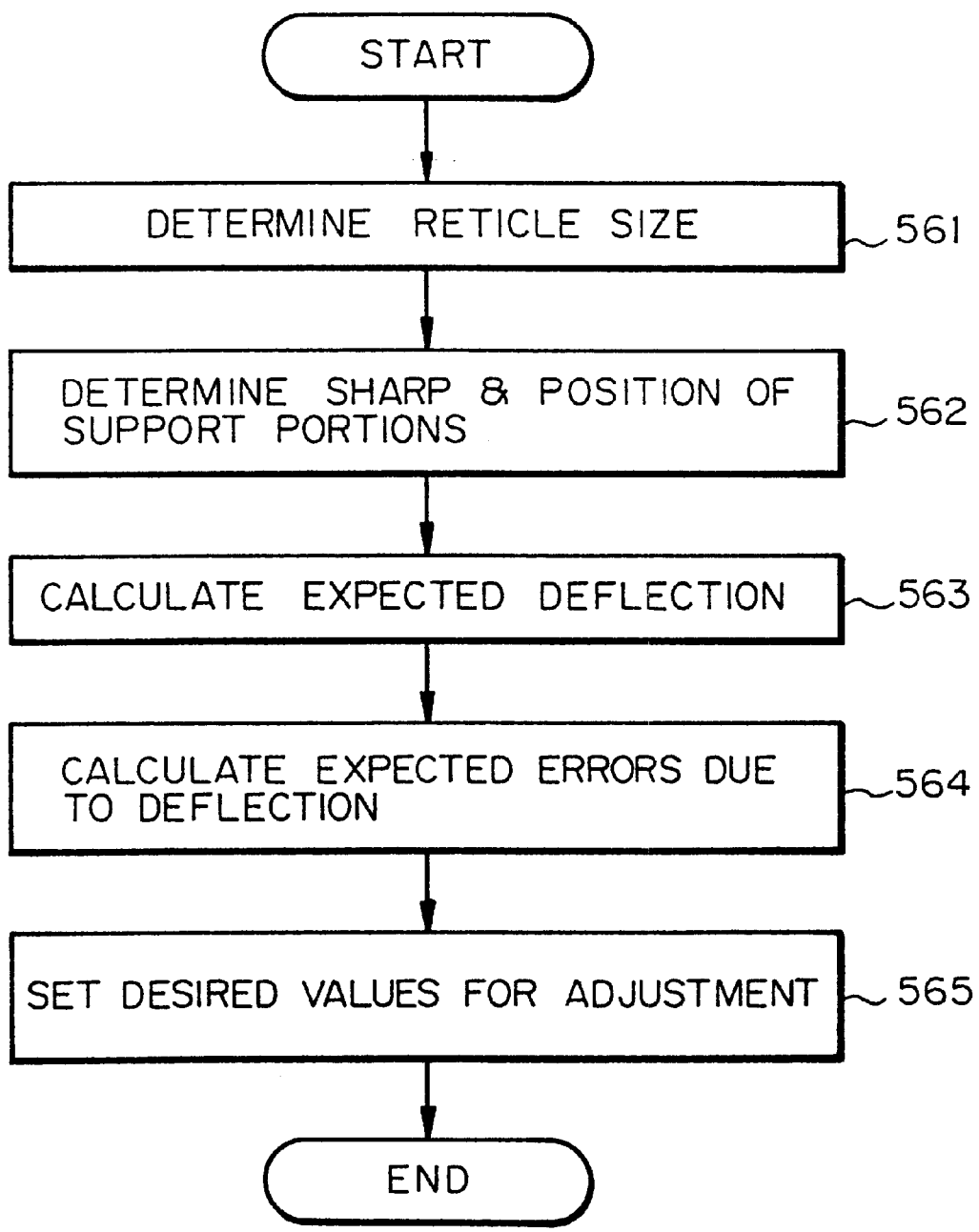
FIG. 28 is a flow chart illustrating an exemplified adjustment process for a projection optical system of FIG. 27.

FIG. 28 is a flow chart illustrating an exemplified adjustment process for the projection optical system of FIG. 27.

This exemplified adjustment process includes the determination of a reticle size (step 541), the determination of the shape and positions of the support portions of the reticle R (step 562), the calculation of the expected deflection of the reticle R (step 566) and the calculation of the expected errors produced by the expected deflection (step 564), which corresponds to the steps 561, 562, 563 and 564, respectively, shown in the design process of FIG. 26. However, the expected errors thus calculated are taken into consideration in the adjustment process for the projection lens as fixed offsets. In other words, the design of the projection lens itself is so conducted as to minimize the lens aberrations, while the desired values for adjustment process are set such that they may cancel out the expected errors to be produced by the deflection of the reticle used. The adjustment may be performed by rotating non-rotational-symmetric, correction lens elements as described with reference to FIG. 27, or alternatively by increasing the distance between the lens elements by a fixed offset from the design value.

Figure 29:
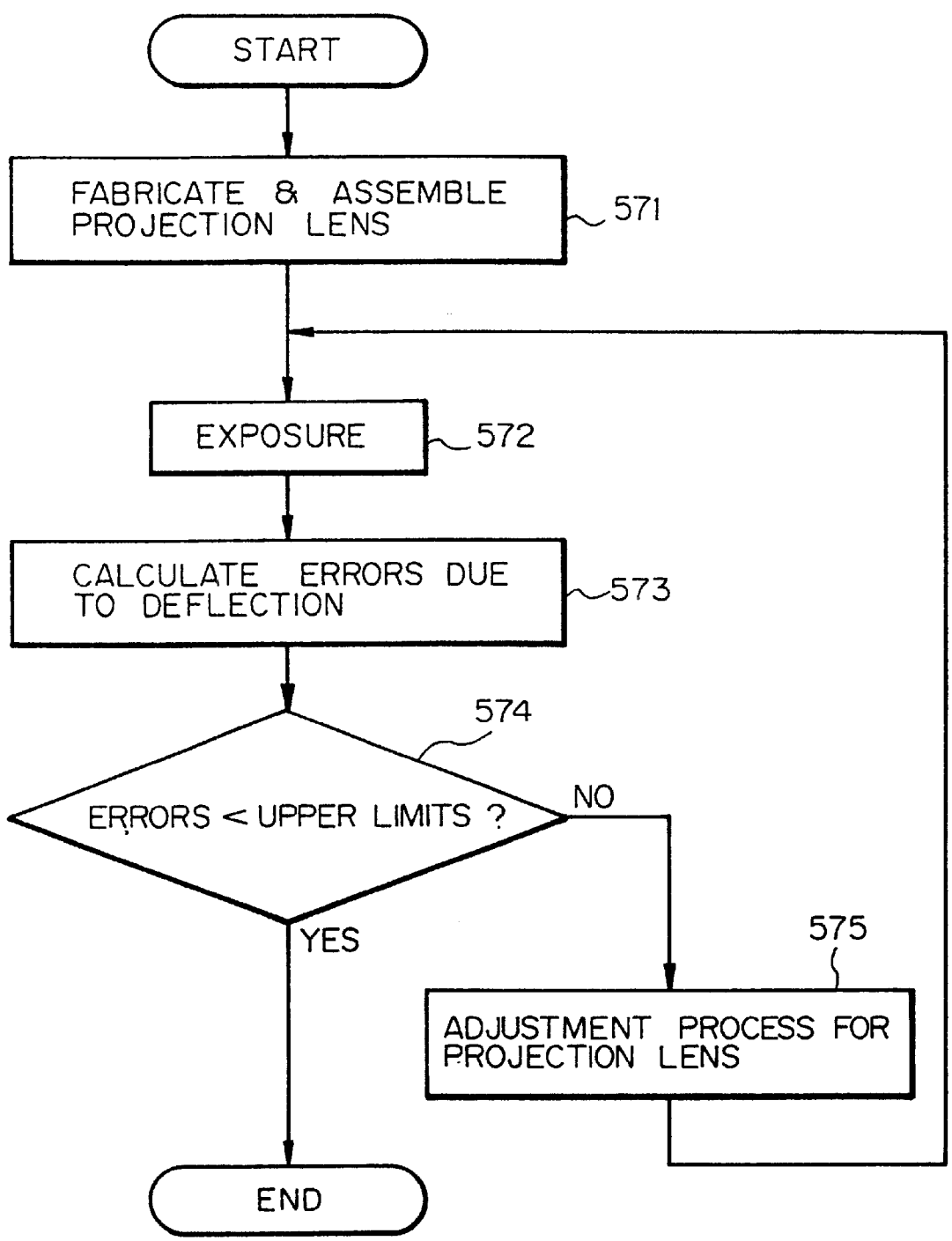
FIG. 29 is a flow chart illustrating another exemplified adjustment process for a projection optical system of FIG. 27.
Figure 30A:
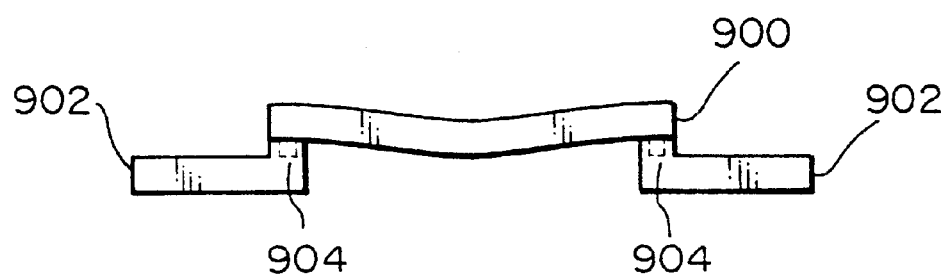
FIGS. 30(A) and 30(B) are side elevations illustrating the deflection of mask (reticle) which may be used with the present invention.
Figure 30B:
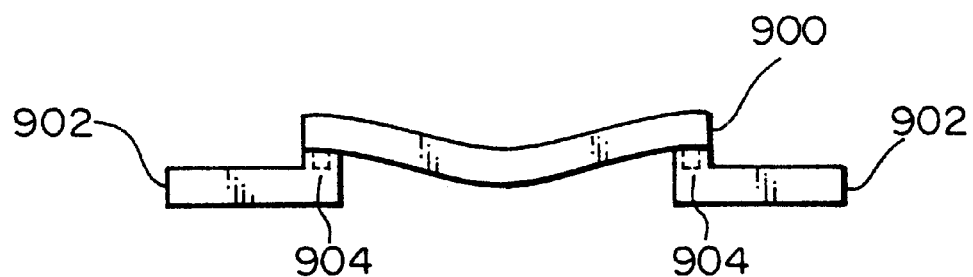

FIG. 29 is a flow chart illustrating another exemplified adjustment process for the projection optical system of FIG. 27.

In this exemplified adjustment process, the projection lens undergoes the adjustment using design values only in the fabrication process of the projection lens (step 571). Thereafter, the error components due to the deflection of the reticle are determined by, for example, making a projection exposure (step 572), and the error components are fedback to the desired values which the aberrations are to be caused to approach. The errors components due to the deformation of the reticle may be separated from the remaining components by, for example, acquiring the data representing the wavefront of the projection lens with no reticle used, so as to determine the aberrations of the projection lens itself, and then measuring the errors in the projected pattern image which are produced when an characteristics evaluation reticle is used, through a coordinate measurement device or the like. For evaluation of the projected image of the reticle pattern, the errors contributed by the projection optical system as well as the errors contributed by the original shape of the reticle are all removed so as to derive only the error components due to the deflection of the reticle. Then, adjustment is performed with respect to those components to cancel out them, such that the resultant errors are reduced zeros. This is advantageous because if adjustment were performed using only the result of the actual printing process in the normal fabrication of products, errors may be increased due to the difference in the deflection between the test reticle used for the adjustment process and the reticle used for actual printing process in the fabrication of products. After the adjustment of the projection lens (step 574), an exposure is made again (step 542). Thereafter, if the errors are smaller than the corresponding acceptable upper limits (YES at step 574), then the entire adjustment process is completed.

As apparent from the above, according to the embodiments of the present invention for achieving the above-mentioned fourth object, any errors due to the deflection of the reticle may be feedback to the design process of the projection lens, so that an exposure of a device pattern may be performed with great accuracy.

Alternatively, in the case where the design of the projection lens is not modified, the correction values for the errors may be provided as the desired values for the adjustment, so that an exposure of a device pattern may be performed with great accuracy as well.

Having described the present invention with reference to preferred embodiments thereof, it is to be understood that the present invention is not limited to the disclosed embodiments, but may be embodied in various other forms without departing from the spirit and the scope of the present invention as defined by the appended claims.

What is claimed is:

1. A projection exposure method for exposing a substrate through a projection optical system with a pattern formed on a mask, the mask being supported by a predetermined support member, comprising:
    a first step of calculating an amount of lateral variation of a pattern image in a direction perpendicular to an optical axis of the projection optical system, the variation being caused by error factors including irregularities in a contact surface of the mask in contact with the support member and/or irregularities in a contact surface of the support member in contact with the mask;
    a second step of determining a distortion produced solely by the projection optical system;
    a third step of obtaining a total expected distortion that corresponds to a summation of the distortion produced solely by the projection optical system and the calculated variation of the positions at which the image of the pattern of the mask is formed; and
    a fourth step of exposing the substrate while partially correcting the position at which the image of the pattern of the mask is formed through the projection optical system based on the total expected distortion.

2. A projection exposure method for exposing a substrate through a projection optical system with a pattern formed on a pattern-bearing surface of a mask, comprising:
    a first step of calculating an amount of lateral variation of a pattern image, the variation being caused by irregularities in the pattern-bearing surface of the mask;
    a second step of determining a distortion produced solely by the projection optical system;
    a third step of obtaining a total expected distortion by a summation of the distortion produced by the projection optical system and the calculated variation of the pattern image; and
    a fourth step of correcting the total expected distortion.

3. A projection exposure method according to claim 2, wherein the first step comprises:
    calculating an amount of lateral variation of the pattern image, caused by a self-weight of the mask.

4. A projection exposure method according to claim 2, wherein the first step comprises:
    calculating an amount of lateral variation of the pattern image, caused by a thermal deformation of the mask.

5. A projection exposure method according to claim 2, wherein the first step comprises:
    calculating an amount of lateral variation of the pattern image, caused by error factors including irregularities in a contact surface of the mask in contact with a support member arid/or irregularities in a contact surface of the support member in contact with the mask.

6. A projection exposure method according to claim 5, wherein the first step comprises:
    measuring the irregularities and then storing them;
    obtaining a surface shape of the pattern bearing surface of the mask when the mask is supported on the supporting member by vacuum suction, based on the stored irregularities by the first step; and
    obtaining a displacement amount of the projected image of the pattern formed on the pattern-bearing surface of the mask, based on the surface shape obtained in the second step.

7. A projection exposure method according to claim 6, wherein the exposure method comprises a scanning exposure method for exposing the substrate with the pattern formed on the pattern-bearing surface of the mask by moving the mask and the substrate in synchronization with each other; and
    the step of obtaining a surface shape of the pattern-bearing surface of the mask includes the step of obtaining variations of the irregularities in a scanning direction of the mask when the mask is supported by the supporting member based on the irregularities stored in the first step.

8. A projection exposure method according to claim 2, wherein the second step comprises the steps of:
    using a distortion evaluation mask having evaluation patterns formed thereon in order to measure the positions of projected images of the evaluation patterns, and to determine the distortion actually produced by the projection optical system;
    measuring a surface shape of the distortion evaluation mask, and deriving a distribution of expected displacements of projected images of the evaluation patterns from their desired projection positions; and
    compensating the measurements of the distortion with the expected displacements so as to derive a distortion produced solely by the projection optical system which is free from any effects of the surface shape of the mask.

9. A projection exposure method according to claim 2, wherein the fourth step is carried out by adjusting a relative distance between the mask and the substrate in an optical axis direction of the projection optical system.

10. A projection-optical method according to claim 9, wherein the adjustment of the distance is carried out by adjusting the support member in the optical axis direction.

11. A projection exposure method according to claim 2, wherein the fourth step is carried out by adjusting a relative distance between lenses disposed in the projection optical system.

12. A projection exposure method according to claim 2, wherein the fourth step comprises the step of scanning exposing the substrate with the pattern formed on the mask by moving the mask and the substrate in synchronization with teach other while partially correcting the position at which the image of the pattern of the mask is formed through the projection optical system, based on the total expected distortion.

13. A method of manufacturing a device including exposing a substrate with a pattern formed on a mask using the projection exposure method defined in claim 12.

14. A projection exposure method for exposing a substrate through a projection optical system with a pattern image formed on a pattern-bearing surface of a mask, comprising:

a first step of determining a distortion produced solely by the projection optical system;

a second step of obtaining a total expected distortion by a summation of the distortion produced solely by the projection optical system and an amount of lateral variation of the pattern image, caused by a self-weight of the mask; and a third step of exposing the substrate with the pattern image while partially correcting the position at which the pattern image of the mask is formed through the projection optical system based on the total expected distortion.

* * * * *

UNITED STATES PATENT AND TRADEMARK OFFICE
CERTIFICATE OF CORRECTION

PATENT NO.    : 6,549,271 B1
DATED         : April 15, 2003
INVENTOR(S)   : Yasuda et al.

It is certified that error appears in the above-identified patent and that said Letters Patent is hereby corrected as shown below:

<u>Title page,</u>
Item [63], Related U.S. Application Data,
Please change "Nov. 29, 2000" to be -- Nov. 28, 2000 --

Signed and Sealed this

Thirtieth Day of September, 2003

JAMES E. ROGAN
*Director of the United States Patent and Trademark Office*